United States Patent
Ito et al.

(10) Patent No.: US 7,413,765 B2
(45) Date of Patent: Aug. 19, 2008

(54) FILM FORMING METHOD FOR MANUFACTURING PLANAR PERIODIC STRUCTURE HAVING PREDETERMINED PERIODICITY

(75) Inventors: Tatsuya Ito, Matsumoto (JP); Takeshi Oyama, Matsumoto (JP)

(73) Assignee: Seiko Epson Corporation (JP)

( * ) Notice: Subject to any disclaimer, the term of this patent is extended or adjusted under 35 U.S.C. 154(b) by 954 days.

(21) Appl. No.: 10/794,772

(22) Filed: Mar. 5, 2004

(65) Prior Publication Data

US 2004/0228964 A1    Nov. 18, 2004

(30) Foreign Application Priority Data

Mar. 6, 2003    (JP) ............... 2003-060253

(51) Int. Cl.
    *B05D 5/06* (2006.01)
(52) U.S. Cl. ........................ 427/162; 427/164; 427/266; 427/287; 427/466; 427/64
(58) Field of Classification Search ................. 427/162, 427/164, 266, 287, 466, 64; 385/505
    See application file for complete search history.

(56) References Cited

U.S. PATENT DOCUMENTS 6,660,332 B2    12/2003    Kawase et al.
6,715,852 B2 *   4/2004    Yonekubo .................. 347/10
2002/0105688 A1   8/2002    Katagami et al.
2004/0051817 A1 * 3/2004    Takahashi et al. ............. 349/1
2004/0081768 A1 * 4/2004    Furusawa et al. ........... 427/421

FOREIGN PATENT DOCUMENTS

| JP | 2002-148422 | 5/2002 |
| JP | 2002-221616 | 8/2002 |
| JP | 2002-273868 | 9/2002 |

OTHER PUBLICATIONS

JPO; Machine Translation of JP-2002-148422; 2008.*

* cited by examiner

*Primary Examiner*—Alain L. Bashore
(74) *Attorney, Agent, or Firm*—Harness, Dickey & Pierce, P.L.C.

(57) ABSTRACT

A film-forming method is provided for forming a planar periodic structure having a predetermined periodicity by depositing liquid material on an object. A liquid drop supplying means is used which supplies a liquid drop at a predetermined driving period to deposit the liquid material on the object; the presence or absence of the supply of the liquid drop is controlled at each driving period in accordance with the periodicity of the planar periodic structure to be formed; and the liquid drop is supplied by controlling the liquid drop supplying means while the liquid drop supplying means is scanned at a predetermined scanning speed in a predetermined scanning direction relative to the object. A natural number times a value obtained by multiplying the driving period and the scanning speed is set to be the structural period of the planar periodic structure in the scanning direction.

22 Claims, 30 Drawing Sheets j (DOTS/PASS) × K (PASS) = L (TOTAL DOTS)

Rx=4 μm DEVIATION PATTERN OF SUPPLYING POSITION OF LIQUID DROP

Rx=4 μm POSITIONAL VARIATION PATTERN OF SCANNING DIRECTION

Rx=4 μm POSITIONAL VARIATION PATTERN OF FEEDING DIRECTION

Rx =8 μm DEVIATION PATTERN OF SUPPLYING POSITION OF LIQUID DROP

Rx =8 μm POSITIONAL VARIATION PATTERN OF SCANNING DIRECTION

Rx =8 μm POSITIONAL VARIATION PATTERN OF FEEDING DIRECTION

STRIPE

MOSAIC

FILM FORMING METHOD FOR MANUFACTURING PLANAR PERIODIC STRUCTURE HAVING PREDETERMINED PERIODICITY

RELATED APPLICATIONS

This application claims priority to Japanese Patent Application No. 2003-060253 filed Mar. 6, 2003 which is hereby expressly incorporated by reference herein in its entirety.

BACKGROUND OF THE INVENTION

1. Technical Field of the Invention

The present invention relates to a film-forming method, a film-forming apparatus, an apparatus and a method for manufacturing a color filter substrate, an apparatus and a method for manufacturing a substrate for an electroluminescent device, a method for manufacturing a display device, a display device, and an electronic apparatus. More specifically, the present invention relates to a manufacturing technique for forming a film by supplying liquid material in a liquid drop state.

2. Description of the Related Art

In general, there are known a variety of display devices using as a display means an electro-optical apparatus such as a liquid crystal display device or an electroluminescent device (hereinafter, referred to as EL device), or an electronic apparatus, such as a cellular phone and a portable information terminal, in which such display device is built. As the color display has been in general use, such a display device commonly utilizes color filters formed in a predetermined arrangement patterns such as a stripe pattern, delta pattern, or mosaic pattern that consists of filter elements on red (R), green (G) and blue (B) dots on the surface of a substrate made of glass, plastic or the like.

Besides, in the EL device allowing color display, the red (R), green (G), and blue (B) dots of an EL light-emitting layer are arranged on the surface of a substrate made of glass, plastic or the like in a predetermined arrangement pattern such as stripe pattern, delta pattern or mosaic pattern, and such EL light-emitting layer is disposed between a pair of electrodes to thereby form a display dot. Then, a voltage applied to these electrodes is controlled for each display dot, so that each display dot emits light in a predetermined color and grayscale.

When manufacturing a variety of display devices as described above, photolithography is generally used for patterning respective colors of filter filaments of the color filter or respective colors of light-emitting layers of the EL device. However, the patterning process using photolithography requires several complicated, time-consuming processes such as coating, exposure and development of materials, and a large quantity of respective color materials or resists are consumed which leads to a problem of high costs.

In order to solve the aforementioned problem, a method for forming filter filaments or light-emitting layers arranged in a dot shape by adding solvent to filter element materials or EL light emitting materials to make a liquid material and discharging the liquid material as a liquid drop to be deposited to the surface of a substrate using an ink jet method, has been suggested. Here, according to the ink jet method, a case for forming filter elements 303 arranged in a dot shape, as shown in FIG. 29(b), inside a plurality of unit regions 302 set at the surface of a mother substrate 301, i.e., a large area of a substrate made of glass or plastic, as shown in FIG. 29(a), will be described.

In that case, for example, a liquid supplying head 306 having a nozzle row 305 of a plurality of nozzles 304, as shown in FIG. 29(c), is scanned along a straight line several times (twice in FIG. 29(b)) relative to a single unit region 302, as indicated by arrows A1 and A2 in FIG. 29(b). During each scanning period of time, ink or filter material is selectively discharged from a plurality of nozzles 304, thereby forming a filter element 303 at a desired position.

As described above, the filter elements 303 are arranged in a stripe pattern, delta pattern or mosaic pattern of respective colors, red (R), green (G), and blue (B). Therefore, in general, colors of red (R), green (G), and blue (B) are respectively prepared and respective liquid drop supplying heads 306 are utilized in sequence, thereby forming a color filter having a predetermined color arrangement on a mother substrate 301.

On the other hand, with regard to the liquid drop supplying heads 306, since there is a difference in the amount of ink depending upon a plurality of nozzles 304 consisting of a nozzle row 305, there may be a stripe pattern irregularity due to the difference of ink at respective filter elements 303 when the filter elements 303 are formed by the liquid drop supplying head 306 as shown in FIG. 29(b). As a result, there is a problem that the light transmissivity to a plane of a color filter is not uniform. Accordingly, there has been a method (for example, refer to Japanese Unexamined Patent Application Publication No. 2002-221616) in which respective filter elements are formed by discharging a plurality of liquid drops and the liquid drops are scanned in sequence as the position of the liquid drop supplying head 306 is moved little by little in the direction of sending liquid drops (the left and right directions in FIG. 29).

However, if a scanning process is performed in the aforementioned way, the number of scanning processes is rapidly increasing which makes the manufacturing time longer, thereby resulting in a problem of lowering production efficiency. Thus, in order to solve the aforementioned problem, an apparatus is suggested with a plurality of heads capable of adjusting of their positions mounted to a common carriage to widen its one-time scanning scope for an efficient manufacturing process (for example, refer to Japanese Unexamined Patent Application Publication No. 2002-273868).

However, the inventor found that it is impossible to eliminate a stripe pattern color irregularity in spite of the minimization of a difference in the amount of ink among respective filter elements in the aforementioned method if the color filter is manufactured in the conventional apparatus. As a result of continuous experiments, it has been found that the stripe pattern color irregularity is caused not by a difference in the amount of ink, but by a charge status of ink in respective filter elements. In other words, the deviated state of ink charged in the respective filter elements results in a difference in the amount of transmissive light depending upon places, which makes a stripe pattern of color irregularity noticeable.

FIG. 34 illustrates optical characteristics of a color filter manufactured in the conventional method. At this time, in FIG. 34(A), the vertical axis indicates Y value of transmissive light of the color filter (CIE1931XYZ color coordinate system, or brightness Y in the YUV color base), and the horizontal axis indicates periodic deviation characteristics of brightness Y seen in the scanning direction when the pixel array of the scanning direction (vertical direction as illustrated therein) illustrated in FIG. 29(b). Besides, as described above, FIG. 34(B) indicates periodic deviation characteristics as seen from the sending direction (horizontal direction as illustrated therein) illustrated in FIG. 29(b). Such deviation characteristics of brightness Y are not caused by a difference in the amount of ink due to the discharge characteristics of the head, but occurs even when a color filter is formed using a single nozzle.

Therefore, in the present invention, in order to solve the aforementioned problems, there is provided a technique to minimize the problem of irregularity in film formation which has not been solved by equalizing the amount of the liquid material to be supplied when a film-forming method is performed by depositing the liquid material on an object with a liquid drop supply means such as a liquid drop supply head.

SUMMARY

After several strenuous investigations, the inventor has reached a conclusion that the stripe pattern irregularity in film formation is caused by an unequal supply of the liquid material inside the regions where the liquid material is filled due to differences in the supply position (depositing position) of a liquid drop in spite of an equal amount of the liquid material to be included in the liquid drop.

For example, when a plurality of liquid drops Q are supplied into a specific region P to deposit a liquid material U, two different cases are compared. As shown in FIG. 30, A-1 illustrates one case that almost all of the first liquid drop Q1 is supplied to almost the center of region P to thereby deposit a liquid material U1 at almost the center of region P, and B-1 illustrates the other case that the first liquid drop Q1' is supplied to the periphery of region P to thereby deposit the liquid material U1' at the periphery of region P.

In the first case (A-1) the first liquid material U1 is deposited at the center of region P, so that following liquid drop Q2 is integrated with the liquid material U1 already deposited at the center of the region P even if the following liquid drop Q2 is supplied to a position diverted from the center of region P. Therefore, a liquid material U2 relating to liquid drops Q1, Q2 is also arranged almost at the center of region P as illustrated in A-2. At this time, as shown in A-3 and A-4, even if liquid drops Q3, Q4 are supplied in sequence, liquid materials U3, U4 can be easily and uniformly deposited. If the liquid material is equally deposited within region P, a liquid material U4 is dried at last to result in an almost equally formed film as indicated with a long dot line in A-4.

On the other hand, in case of B-1, since the initial liquid material U1 is deposited at the periphery of region P, the following Q2' is integrated with the liquid material U1 that has already deposited at the periphery of region P. Therefore, as shown in B-2, the liquid material U2' relating to two liquid drops Q1', Q2' is also deposited at the periphery of region P. At this time, as illustrated in B-3 and B-4, liquid materials U3', U4' relating to the sequential supply of liquid drops Q3', Q4' tilt to the periphery of region P. In an extreme case, the liquid material is partially flooded over region P, and the liquid material may be deposited at other regions adjacent to region P to become liquid materials U3", U4". If the liquid material U4' that has been deposited at the neighboring regions is dried, an inclined film is formed as shown with a long dot line in B-4.

As described above, since the state of the finally formed film is different depending on the position of an initially supplied liquid drop, there may be a difference in the stripe pattern irregularity in film formation. The stripe pattern of the irregularity in film formation is not limited to the case that a plurality of liquid drops are supplied to region P. As shown in FIG. 30, the difference is also apparent when a single liquid drop is supplied to region P. If the same amount of the liquid material is supplied as a single liquid drop, a difference is made in the finally formed films shown in A-4 and B-4 of FIG. 30 depending upon the supplying position of the liquid drop. In any case, the state of the finally formed film is greatly changed by a supplying position of a liquid drop, the stripe pattern irregularity in film formation (color or brightness irregularity in case of a display device) will appear even when the amount of the liquid material included in the liquid drop is equalized. Further, as shown in B-3 and B-4 of FIG. 30, the liquid materials U3" and U4" flooded out of region P result in a cause of mixed colors and an increase of irregularity in case of a color filter or an EL device for example.

As shown in FIG. 31, the region P is partitioned with a partition wall or a bank B (hereinafter, referred to as 'partition wall') and a liquid drop is supplied into the region P surrounded with the partition wall B. For example, the partition wall B is constructed of a synthetic resin that has been patterned on a substrate by a photolithographic method or the like.

At this time, the external appearance of the liquid material U is changed by presence of the partition wall B depending upon the supplying position of the liquid drop Q. For example, as shown in FIG. 31($a$) or ($b$), if liquid drops Qa, Qb are supplied to the center of the region P, a position relatively close to the center thereof or a position a little far from the partition wall B, the appearance of liquid materials Ua, Ub provided inside the region P is not affected by the presence of the partition wall B. However, as shown in FIG. 31($c$), if the liquid drop Qc is supplied to a position close to the partition wall B, a periphery of region P, a liquid material Uc contacts partition wall B at the time of depositing and enlarging and moves along the partition wall B like being sucked in. As a result, the liquid material Uc is shaped according to the wall surface of the partition wall B as shown. At this time, it becomes difficult to stop unequal deposition of the liquid material in the region P even though the liquid drop is additionally supplied.

Next, the inventor has checked the conventional liquid drop supplying state. The liquid drop supplying means such as a liquid supplying head or the like is generally driven at a predetermined driving period Td (the driving frequency of a driving signal Fd=1/Td). When scanning speed Vx is applied with the small driving period Td, resolution of supplying position of the liquid drop Rx=Td×Vx is small and it is possible to more correctly set up the supplying position of the liquid drop. For example, FIG. 32 illustrates a case that the liquid drop is supplied at a predetermined driving period Td while the liquid drop supplying means scans an object periodically arranged with a plurality of regions P at a constant level of scanning speed Vx. FIGS. 32($a$) to ($c$) illustrate respective cases that the liquid drop is supplied to three different resolutions of R1<R2<R3 for comparison. When the driving period Td is large, the supplying position of the liquid drop in region P can be controlled not in precision, but as shown in (c), turns out to be more irregular at a plurality of regions P arranged in the scanning direction. In contrast, if the driving period Td is small, as shown in (a), the supplying position of the liquid drop is precisely set inside region P, and it is possible to reduce the irregularity of the supplying position of the liquid drop among regions P. Therefore, as described above, the liquid drop can be supplied to a proper position inside the region, thereby making it possible to restrict the stripe pattern irregularity in film formation.

However, in actuality, if the driving period Td of the liquid drop supplying means is small, the supply of the liquid material is not sufficient for the liquid drop supplying means. In other words, the amount of the liquid material included in the one liquid drop gets smaller not to stabilize the liquid material to be introduced to the liquid drop supplying means, so that it is easy to cause a defect in the liquid drop discharging shape of a so-called flight curve or satellite. Therefore, there is a limitation to an increase in the driving frequency of the liquid drop supplying means.

Accordingly, if the driving period Td is small, a deviation in the supplying positions of the liquid drop among regions P decreases to restrict irregularity in film formation, but there are problems that productivity decreases and that film-forming defects increase. In other words, if the scanning is carried out in the direction of x as shown in FIG. 33, and if resolution Rx is large, the difference of the supplying position of the liquid drop among respective regions P arranged in the scanning direction X is large with generation of the irregularity in film formation. At this time, the structural period of region P as seen from the scanning direction X is regarded as Dx, and driving period Td multiplied with scanning speed Vx is regarded as resolution Rx. On the contrary, if resolution Rx is small, the difference in the supplying position of the liquid drop among regions P as seen from the scanning direction X is small, but the manufacturing efficiency decreases and resultant defects easily occur because the supplying amount of the liquid material as the liquid drop decreases.

Thus, as a result of having investigated repeatedly and zealously based on the situation, the present inventors have reached the invention shown below. In other words, the present invention provides a film-forming method for forming a planar periodic structure having a predetermined periodicity by depositing the liquid material on an object. In the film-forming method, a liquid drop supplying means is used which is constructed to be capable of supplying a liquid drop at a predetermined driving period to deposit the liquid material on the object; the presence or absence of the supply of the liquid drop by the liquid drop supplying means is controlled at each driving period of the driving period in accordance with the periodicity of the planar periodic structure to be formed on the object; and the liquid drop is supplied by the control of the liquid drop supplying means while the liquid drop supplying means is scanned at a predetermined scanning speed in a predetermined scanning direction relative to the object. A natural number times a value obtained by multiplying the driving period and the scanning speed is set to be the structural period of the planar periodic structure, to be formed on the object, in the scanning direction.

According to the above invention, a film-forming process is performed in a state that a value obtained by multiplying the driving period Td of the liquid drop supplying means and the scanning speed Vx of the liquid drop supplying means, that is, a natural number times of resolution Rx of the liquid drop supply is set to be the structural period Dx in the scanning direction of the planar periodic structure to be formed on the object. Thus, it is possible to supply the liquid drop to a predetermined phase point in the structural period Dx. As a result, it is possible to reduce the occurrence of irregularity in film formation caused by irregularity in the supplying position of the liquid drop in the structural period Dx. Besides, since the liquid drop can be supplied to a predetermined phase point in the structural period Dx as described above, it is possible to avoid a situation shown in FIG. 31(*c*) in which the liquid drop is supplied to the vicinity of the partition wall and the deviation of the liquid material is caused, thereby resulting in an advantage of reducing the film-forming defects. Moreover, according to the aforementioned method, it is not necessary to make the driving period Td of the liquid drop supplying means vainly small. Thus, it is possible to restrict a reduction in the amount of the liquid material included in one liquid drop. As a result, it is possible to improve the productivity and to reduce the film-forming defects due to the insufficient supply of the liquid drop such as a flight curve or a satellite.

In the present invention, preferably, a step of scanning the liquid drop supplying means relative to the object in the scanning direction is performed several times and the operation of feeding the liquid drop supplying means to the object in a direction intersecting the scanning direction is performed during intervals between the scanning operations. According to this invention, the scanning step is repeated several times and the feeding operation is performed during intervals between the scanning operations, thereby making it possible to carry out the film-formation in a wide range of a plane.

In the present invention, preferably, the liquid drop supplying means is provided with a nozzle row including a plurality of nozzles to supply the liquid drop, and the liquid drop supplying means is scanned relative to the object in the scanning direction in the position in which an arrangement period of the nozzles at the nozzle row as seen from a direction perpendicular to the scanning direction is set to correspond to a structural period as seen from a direction perpendicular to the scanning direction of the planar periodic structure to be formed. According to this invention, the nozzle row including a plurality of nozzles is provided to the liquid drop supplying means, thereby making it possible to simultaneously supply liquid drops to a plurality of rows in the planar periodic structure by a single scanning step to improve productivity. Here, when the liquid drop supplying means provided with a nozzle row has a predetermined nozzle gap, in order to match the nozzle gap with the structural period of the planar periodic structure as seen from a direction intersecting the scanning direction, it is preferable to adjust an angle of inclination θ between the arrangement direction of a nozzle row and the direction perpendicular to the scanning direction.

In the present invention, preferably, a difference between a phase difference between a periodicity of the planar periodic structure in the scanning direction at a predetermined position as seen from a direction perpendicular to the scanning direction and another periodicity of the planar periodic structure in the scanning direction at another position other than the predetermined position as seen from a direction perpendicular to the scanning direction, and a positional deviation as seen from the scanning direction between a predetermined nozzle corresponding to the predetermined position and another nozzle corresponding to the another position are set to 0 or a natural number times a value obtained by multiplying the driving period and the scanning speed. In general, if the angle of inclination θ between the arrangement direction of nozzle rows and a direction perpendicular to the scanning direction is not 0, the nozzle positions as seen from the scanning direction between the plurality of nozzles are different from each other and the positional deviation of the nozzle positions as seen from the scanning direction results in a deviation in the supplying positions of the liquid drop at two different positions as seen from the direction perpendicular to the scanning direction. Irrespective of a value of angle of inclination θ, there may be a phase difference in the periodicity of a planar periodic structure to be formed in the scanning direction at two different positions as seen from the direction perpendicular to the scanning direction. Therefore, a deviation in the positions of supplying the liquid drop to a planar periodic structure to be formed occurs as much as the difference between the phase difference of the periodicity of a planar periodic structure to be formed in the scanning direction at two different positions as seen from a direction perpendicular to the scanning direction and a deviation of the nozzle positions of the liquid drop supplying means.

Therefore, the aforementioned difference is set to 0 or a natural number times a value obtained by multiplying the driving period and the scanning speed, thereby making it possible to relieve a deviation in the positions of supplying the liquid drop at two different points as seen from the direction perpendicular to the scanning direction.

In the present invention, preferably, a time difference is provided between a liquid drop supplying time of a predetermined nozzle disposed at a predetermined position as seen from the direction perpendicular to the scanning direction and a liquid drop supplying time of another nozzle disposed at another position as seen from the direction perpendicular to the scanning direction. A difference between a phase difference between a periodicity of the planar periodic structure in the scanning direction at the predetermined position and another periodicity of the planar periodic structure in the scanning direction at another position, and a value obtained by multiplying the time difference and the scanning speed is set to 0 or a natural number times a value obtained by multiplying the driving period and the scanning speed. In general, if an angle of inclination θ between the arrangement direction of nozzle rows and a direction perpendicular to the scanning direction is not 0, the nozzle positions as seen from the scanning direction between the plurality of nozzles are different from each other. Thus, the positional deviation of the nozzle positions as seen from the scanning direction results in a deviation in the supplying positions of the liquid drop at two different positions as seen from the direction perpendicular to the scanning direction. Similarly to the above, even in a planar periodic structure to be formed, there may be a phase difference in the periodicity of the scanning direction at two different positions as seen from the direction perpendicular to the scanning direction. For this reason, a deviation in the positions of supplying the liquid drop to a planar periodic structure to be formed occurs as much as a difference between the phase difference and the deviation of the nozzle positions of the liquid supplying means. At this time, a time difference is provided between liquid drop supplying timings of nozzles corresponding to two different positions as seen from the direction perpendicular to the scanning direction to be adjusted, and the phase difference and values obtained by multiplying the time difference and the scanning speed is set to 0 or a natural number times a value obtained by multiplying the driving period and the scanning speed to thereby relieve the deviation in the supplying positions of the liquid drop at two different positions as seen from the direction perpendicular to the scanning direction.

Next, the present invention provides a film-forming apparatus for forming a planar periodic structure having a predetermined periodicity by depositing the liquid material on an object. The film-forming apparatus comprises: a liquid drop supplying means constructed to be capable of supplying a liquid drop at a predetermined driving period to deposit the liquid drop on the object; control means capable of controlling the presence or absence of the liquid drop by the liquid drop supplying means at each driving period; scanning means to scan the liquid drop supplying means relative to the object in a predetermined scanning direction; and driving period setting means to be capable of adjusting and setting the driving period.

According to the above invention, the film-forming apparatus is constructed to be capable of properly setting a driving period of the liquid drop supplying means with the driving period setting means. Thus, it is possible to improve resolution of the liquid supplying position by making the driving period small, without a reduction in driving speed by the driving means. Therefore, it is possible to improve the precision of the liquid supplying positions by an increase in the resolution of the liquid drop supplying positions without a reduction in productivity efficiency. Besides, the natural number times of the resolution is set to be a structural period of a planar periodic structure to be formed in the scanning direction. Thus, it is possible to always supply the liquid drop consistently to a predetermined phase position of a structural period to be formed. As a result, it is possible to reduce a deviation in supplying positions of the liquid drop and irregularity in film formation.

In the present invention, preferably, the scanning means performs a step of scanning the liquid drop supplying means relative to the object in the scanning direction several times and the operation of feeding the liquid drop supplying means to the object in a direction intersecting the scanning direction is performed during intervals between the scanning operations.

In the present invention, preferably, the liquid drop supplying means is constructed to have a nozzle row having a plurality of nozzles to supply the liquid drop and to be capable of adjusting an intersecting angle between an arrangement direction of the nozzles of the nozzle row and the scanning direction.

In the present invention, preferably, the liquid drop supplying means is constructed to be capable of setting a time difference between a liquid drop supplying time of a predetermined nozzle corresponding to a position as seen from the direction perpendicular to the scanning direction and another liquid drop supplying time of another nozzle corresponding to another position other than the predetermined position as seen from the direction perpendicular to the scanning direction.

Next, the present invention provides a method for manufacturing a color filter substrate, having a film-forming step in which the liquid material is supplied onto a substrate to film-form a plurality of filter elements in a planar periodic pattern having a predetermined periodicity. In the film-forming process, a liquid drop supplying means is used which is constructed to be capable of supplying a liquid drop at a predetermined driving period to deposit the liquid material on the object; the presence or absence of the supply of the liquid drop by the liquid drop supplying means is controlled at each driving period in accordance with the periodicity of the planar periodic pattern to be formed on the object; and the liquid drop is supplied by the control of the liquid drop supplying means while the liquid drop supplying means is scanned at a predetermined scanning speed in a predetermined scanning direction relative to the object. A natural number times a value obtained by multiplying the driving period and the scanning speed is set to be the structural period of the planar periodic pattern, to be formed, in the scanning direction.

In the present invention, preferably, a step of scanning the liquid drop supplying means relative to the object in the scanning direction is performed several times and the operation of feeding the liquid drop supplying means to the object in a direction intersecting the scanning direction is performed during intervals between the scanning operations.

According to the invention, preferably, the liquid drop supplying means is provided with a nozzle row including a plurality of nozzles to supply the liquid drop, and the liquid drop supplying means is scanned relative to the object in the scanning direction in the position in which an arrangement period of the nozzles at the nozzle row as seen from a direction perpendicular to the scanning direction is set to correspond to a structural period as seen from a direction perpendicular to the scanning direction of the planar periodic pattern to be formed.

In the present invention, preferably, a difference between a phase difference between a periodicity of the planar periodic pattern in the scanning direction at a predetermined position as seen from a direction perpendicular to the scanning direction and another periodicity of the planar periodic pattern in the scanning direction at another position other than the predetermined position as seen from a direction perpendicular to the scanning direction, and a positional deviation as seen from the scanning direction between a predetermined nozzle corresponding to the predetermined position and another nozzle corresponding to the another position is set to 0 or a natural number times a value obtained by multiplying the driving period and the scanning speed, thereby forming a film.

In the present invention, preferably, a time difference is provided between a liquid drop supplying time of a predetermined nozzle disposed at a predetermined position as seen from the direction perpendicular to the scanning direction and a liquid drop supplying time of another nozzle disposed at another position other than the predetermined position as seen from the direction perpendicular to the scanning direction.

Further, preferably, a phase difference between a periodicity of the planar periodic pattern in the scanning direction at the predetermined position and another periodicity of the planar periodic pattern in the scanning direction at the another position, and a value obtained by multiplying the time difference and the scanning speed is set to 0 or a natural number times a value obtained by multiplying the driving period and the scanning speed, thereby forming a film.

In the present invention, preferably, the planar periodic pattern is obtained by arranging a plurality of colors of the filter elements in a planar periodic pattern, and the film-forming process is performed to at least one of the plurality of colors of the filter elements. When a plurality of colors of filter elements are arranged in a planar periodic pattern, the film-forming method of the present invention is applied to at least one color of the plurality of colors, thereby achieving a remarkable effect.

In the present invention, preferably, the film-forming process is performed to a blue color filter element. Particularly, the concentration difference (optical concentration) of the blue filter element is most noticeable. As a result, it is possible to reduce irregular color most effectively by application of the present invention when a film for the blue filter element is formed.

Next, the present invention provides a method for manufacturing a substrate for an electroluminescent device, having a film-forming step in which the liquid material is supplied onto the substrate to film-form a plurality of pixel regions in a planar periodic pattern having a predetermined periodicity. In the film-forming process, a liquid drop supplying means is used which is constructed to be capable of supplying a liquid drop at a predetermined driving period to deposit the liquid material on the object; the presence or absence of the supply of the liquid drop by the liquid drop supplying means is controlled at each driving period in accordance with the periodicity of the planar periodic pattern to be formed on the object; and the liquid drop is supplied by the control of the liquid drop supplying means while the liquid drop supplying means is scanned at a predetermined scanning speed in a predetermined scanning direction relative to the object. A natural number times a value obtained by multiplying the driving period and the scanning speed is set to be the structural period of the planar periodic pattern, to be formed on the object, in the scanning direction.

In the present invention, preferably, a step of scanning the liquid drop supplying means relative to the object in the scanning direction is performed several times and the operation of feeding the liquid drop supplying means to the object in a direction intersecting the scanning direction is performed during intervals between the scanning operations.

In the present invention, preferably, the liquid drop supplying means is provided with a nozzle row including a plurality of nozzles to supply the liquid drop, and the liquid drop supplying means is scanned relative to the object in the scanning direction in the position in which an arrangement period of the nozzles at the nozzle row as seen from a direction perpendicular to the scanning direction is set to correspond to a structural period as seen from a direction perpendicular to the scanning direction of the planar periodic pattern to be formed.

In the present invention, preferably, a difference between a phase difference between a periodicity of the planar periodic pattern, to be formed on the object, in the scanning direction, at a predetermined position as seen from a direction perpendicular to the scanning direction and another periodicity of the planar periodic pattern in the scanning direction at another position other than the predetermined position as seen from a direction perpendicular to the scanning direction, and a positional deviation as seen from the scanning direction between a predetermined nozzle corresponding to the predetermined position and another nozzle corresponding to the another position is set to 0 or a natural number times a value obtained by multiplying the driving period and the scanning speed, thereby forming a film.

In the present invention, preferably, a time difference is provided between a liquid drop supplying time of a predetermined nozzle disposed at a predetermined position as seen from the direction perpendicular to the scanning direction and a liquid drop supplying time of another nozzle disposed at another position other than the predetermined position as seen from the direction perpendicular to the scanning direction. A difference between a phase difference between a periodicity of the planar periodic pattern in the scanning direction at the predetermined position and another periodicity of the planar periodic pattern in the scanning direction at the another position, and a value obtained by multiplying the time difference and the scanning speed is set to 0 or a natural number times a value obtained by multiplying the driving period and the scanning speed, thereby forming a film.

In the present invention, the planar periodic pattern is obtained by arranging a plurality of colors of the pixel regions in a predetermined arrangement pattern, and preferably the film-forming process is performed to at least one of the plurality of colors of the pixel regions. When a plurality of colors of pixel regions are arranged in a planar periodic pattern, the film-forming method of the present invention is applied to at least one color of the plurality of colors, thereby achieving a remarkable effect.

In the present invention, preferably, the film-forming process is performed to a blue color pixel region. Particularly, the brightness intensity of the blue pixel region is easily noticeable, so that it is possible to reduce irregularity in film formation most effectively by application of the present invention when a film is formed with the blue pixel region.

also, the present invention provides a method for manufacturing a display device in which a plurality of pixels arranged at the planar periodic period is formed using any one of the film-forming methods described above.

Further, the present invention provides a method for manufacturing a display device in which a color filter substrate is formed using any one of the manufacturing methods described above.

Moreover, the present invention provides a method for manufacturing a display device in which a substrate for an electroluminescent device is formed using the manufacturing methods as described above.

Still further, the present invention provides a display device formed using the method for manufacturing a display device described above. According to this method, it is possible to construct a display device with high display quality by reducing the irregularity in film formation caused by the film-forming process. Particularly, in pixel rows arranged in the scanning direction, a greater improvement is made in the present invention than in the prior art because there is a smaller deviation in the film structure between pixels. As a result, it is possible to produce a display device with a reduction in the irregular color or brightness irregularity but with a remarkable increase in optical uniformity as compared with the prior art.

Also, the present invention provides an electronic apparatus comprising the aforementioned display device and control means for controlling the display device. The electronic apparatus of the present invention preferably includes all portable electronic apparatuses such as a portable information terminal including a portable telephone, a portable computer, and an electronic watch, although it is not limited thereto.

DETAILED DESCRIPTION

Hereinafter, a detailed description of the invention will be made about a film-forming method, a film-forming apparatus, an apparatus and a method for manufacturing a color filter substrate, an apparatus and a method for manufacturing a substrate for an electroluminescent device, a method for manufacturing a display device, a display device and an electronic apparatus with reference to accompanying drawings.

Basic Construction of a Film-Forming Method and a Film-Forming Apparatus

Figure 15:
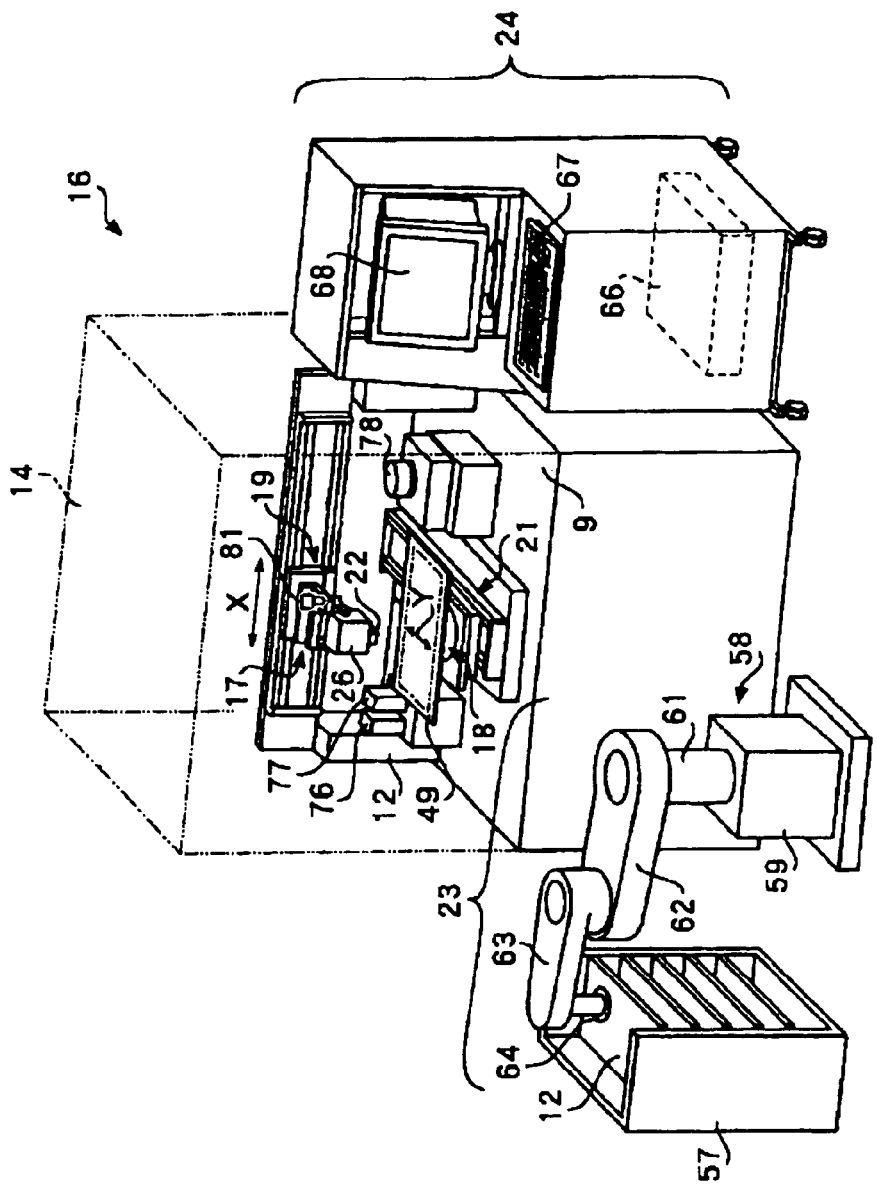
FIG. 15 is a schematic perspective view illustrating the whole structure of a film-forming apparatus.

First, a description will be made about a basic construction in an embodiment of a film-forming method and a film-forming apparatus according to the present invention. As shown in FIG. 15, a film-forming apparatus 16 (liquid drop discharge apparatus) of the present embodiment comprises: a head unit 26 having a liquid drop supplying head 22 (liquid drop discharge head) such as a liquid drop supplying head used in a printer or the like, a head position control unit 17 to control a position of the liquid drop supplying head 22, that is, a head position, a substrate position control unit 18 to control the position of an object (for example, a mother substrate 12), a scan driving device 19 as a scan driving means to scan and move the liquid drop supplying head 22 in the scanning direction X to the object (for example, mother substrate 12), feed driving means 21 to feed a liquid drop supplying head 22 to a feeding direction Y intersecting (perpendicular to) the scanning direction to the object, a substrate supply device 23 to supply the object (mother substrate 12) to a predetermined working position inside the film-forming apparatus 16, and a control unit 24 to control the film-forming apparatus 16 generally.

All of the aforementioned head position control unit 17, the substrate position control unit 18, the scan-driving device 19, the feed driving device 21 are installed on a base 9. Besides, such units are covered with a cover 14 if needed.

Figure 17:
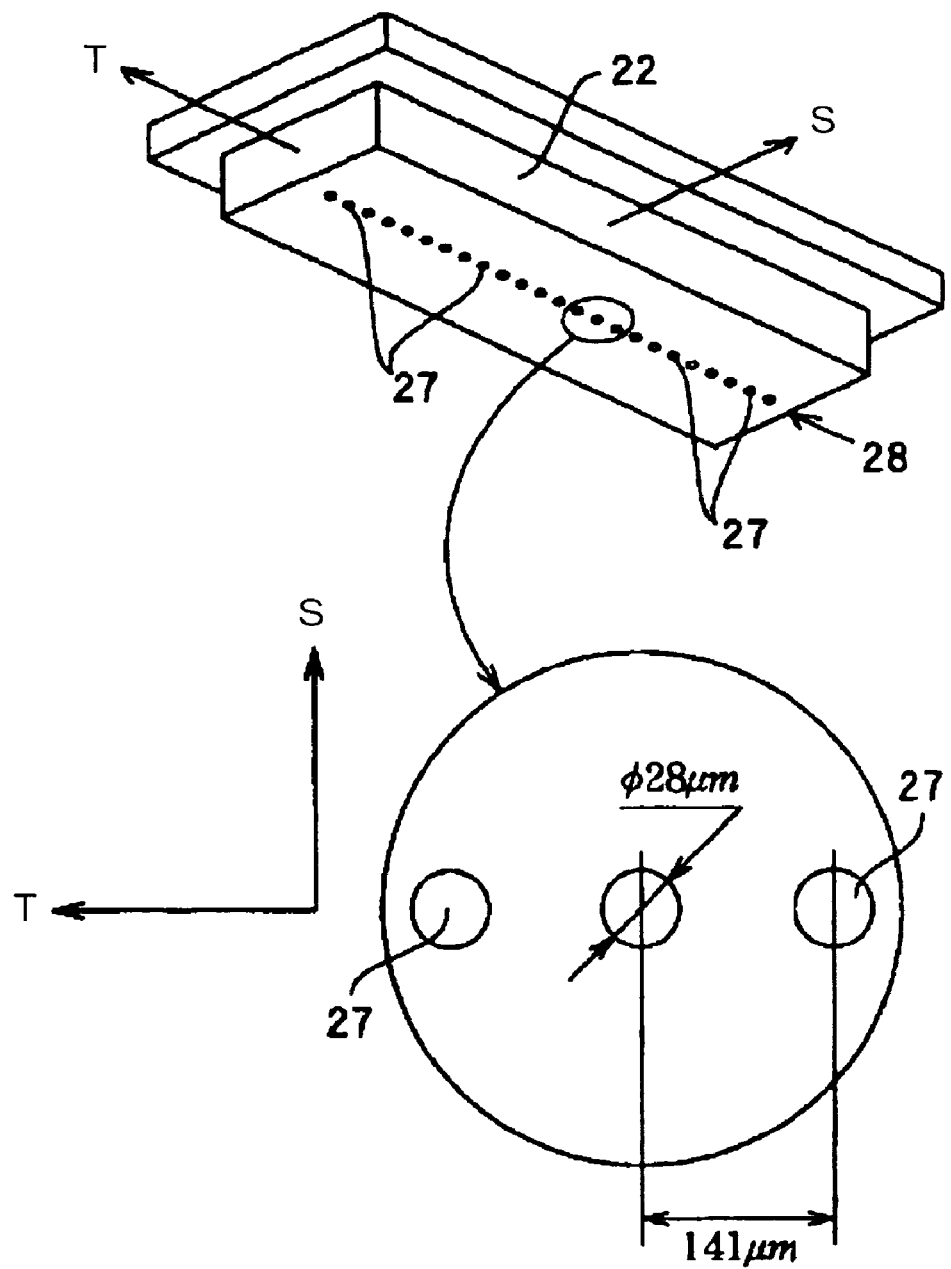
FIG. 17 illustrates the structure of a liquid drop supplying head.

As shown in FIG. 17, for example, the liquid drop supplying head 22 includes a nozzle row 28 in which a plurality of nozzles 27 are arranged. For example, the number of the nozzles 27 is, for example, one hundred eighty, the diameter of the nozzles 27 is, for example, 28 µm, and the pitch t of the nozzles 27 is, for example, 141 µm. Reference direction S shown in FIG. 17 indicates a reference scanning direction of the liquid drop supplying head 22, and arrangement direction T indicates an arrangement direction of the nozzles 27 in the nozzle row 28.

As shown in FIGS. 19(a) and (b), the liquid drop supplying head 22 includes a nozzle plate 29 made of stainless steel or the like, a vibration plate 31 facing the nozzle plate 29, and a plurality of partition members 32 interconnecting the nozzle plate 29 and the vibration plate 31. A plurality of material chambers 33 and a liquid reservoir 34 are formed between the nozzle plate 29 and the vibration plate 31 by the partition members 32. The material chambers 33 and the liquid reservoir 34 are inter-connected through passages 38.

A material supplying hole 36 is formed at an appropriate position of the vibration plate 31. A material supplying unit 37 is connected to the material supplying hole 36. When forming color filters, the material supplying unit 37 supplies a liquid material M comprising a filter element material having one color, for example, red, among red (R), green (G) and blue (B) to the material supplying hole 36. The liquid material M supplied in this way fills the liquid reservoir 34 and fills the material chambers 33 through passages 38.

Nozzles 27 are formed in the nozzle plate 29 for discharging the liquid material M from the material chambers 33 in the shape of jet. Besides, material pressers 39 corresponding to the material chambers 33 are mounted on the rear surface of the vibration plate 31 facing the material chambers 33.

As shown in FIG. 19(b), a material presser 39 has a piezoelectric element 41 and a pair of electrodes 42a and 42b sandwiching the piezoelectric element 41 therebetween. The piezoelectric element 41 is bent and deformed to protrude externally as indicated by arrow C when electricity is applied to both electrodes 42a and 42b, resulting in an increase in the volume of the material chamber 33. As a result, the increased volume of the liquid material M flows into the material chamber 33 through the passage 38 from the liquid reservoir 34.

Thereafter, if the application of electricity to the piezoelectric element 41 stops, the piezoelectric element 41 and the vibration plate 31 returns to their original shapes and the material chamber 33 also returns to its original volume. Thus, the pressure of the liquid material M in the material chamber 33 rises, and the liquid material M turns into a liquid drop 8 to be discharged from the nozzle 27. In addition, in order to prevent the flying of the liquid drop 8 (path) from being bent and prevent the nozzle 27 from clogging, a liquid-repellent layer 43 made of a Ni-tetrafluoroethylene eutectoid plated layer is provided at the periphery of the nozzle 27.

Next, referring to FIG. 16, a description will be made about the head position control unit 17, the substrate position control unit 18, the scan driving device 19, the feed driving device 21 and the like, which are arranged at the periphery of the liquid drop supplying head 22. The head position control unit 17 includes α motor 44 to rotate the liquid drop supplying head 22 mounted to the head unit 26 in a plane (a horizontal plane), β motor 46 to rock and rotate the liquid drop supplying head 22 around an axis parallel to the feeding direction Y, γ motor 47 to rock and rotate the liquid drop supplying head 22 around an axis parallel in the scanning direction X, and z motor 48 to vertically translate the liquid drop supplying head 22.

Besides, the substrate position control unit 18 includes a table 49 to put an object (mother substrate 12) and θ motor 51 to rotate the table 49 in a plane (a horizontal plane). Also, the scan driving device 19 includes an X guide rail 52 extending in the scanning direction X and an X slider 53 built with, for example, a linear motor to be pulse-driven.

The X slider 53 is translated in the scanning direction X along the X guide rail 52, for example, by the operation of the built linear motor.

Further, the feed driving device 19 includes a Y guide rail 54 extending to the feeding direction Y and a Y slider 56 built with, for example, a linear motor to be pulse-driven. The Y slider 56 is translated to the feeding direction Y along the Y guide rail 54, for example, by the operation of the built linear motor.

In the X slider 53 or Y slider 56, the pulse-driven linear motor can precisely control the rotational angle of an output shaft with a pulse signal supplied to the motor. Therefore, it is possible to control a position on the scanning direction X of the liquid drop supplying head 22 supported by the X slider 53 or another position on the feeding direction Y of the table 49 in high precision. In addition, the position control of the liquid drop supplying head 22 or table 49 is not limited to the position control using a plus-motor, but can be completed by a feedback control using a servomotor or other certain methods.

The table 49 is provided with positioning means 50 constructed with pins that regulate the plane position of an object (mother substrate 12). The object (mother substrate 12) is positioned and kept while the end faces thereof in the scanning direction X and feeding direction Y are in contact with the positioning means 50 by a substrate supply device 23, which will be described later. It is preferable that commonly known fixing means such as air suction (vacuum absorption)

is arranged on the table 49 so as to fix the object (mother substrate 12) that has been held in the aforementioned positioned state.

The description will be continued referring back to FIG. 15. The substrate supply device 23 illustrated in FIG. 15 includes a substrate accommodating part 57 to accommodate an object (mother substrate 12) and a substrate transfer mechanism 58 such as a robot that conveys the object (mother substrate 12). The substrate transfer mechanism 58 includes a base 59, an elevating shaft 61 which is elevated with respect to the base 59, a first arm 62 to rotate about the elevating shaft 61, a second arm 63 to rotate with respect to the first arm 62, and an absorption pad 64 provided at the underside of the second arm 63 at the tip thereof. The absorption pad 64 is constructed to absorb and hold the object (mother substrate 12) by suction (vacuum absorption) or the like.

Further, as shown in FIG. 15, a capping device 76 and a cleaning unit 77 are located below the scanning locus of the liquid supplying head 22 and disposed at one side position of the feed driving device 21. Besides, an electronic balance 78 is installed at the other side position of the feed driving device 21. In this case, the capping device 76 is to prevent the drying of the nozzle 27 (see FIG. 17) when the liquid drop supplying head 22 is in a stand-by state. The cleaning unit 77 is to clean the liquid drop supplying head 22. The electronic balance 78 is to measure the amount of a liquid drop 8 to be discharged from each nozzle 27 in the liquid drop supplying head 22. Moreover, a head camera 81 that integrally moves with the liquid drop supplying head 22 is mounted around the liquid drop supplying head 22.

The control unit 24 shown in FIG. 15 includes a computer main body 66 accommodating a processor, an input unit 67 such as a keyboard, and a display device 68 such as CRT. The computer main body 66 includes a central processing unit (CPU) 69 shown in FIG. 20, and an information recording medium 71 that is a memory for storing a variety of information.

Figure 19:
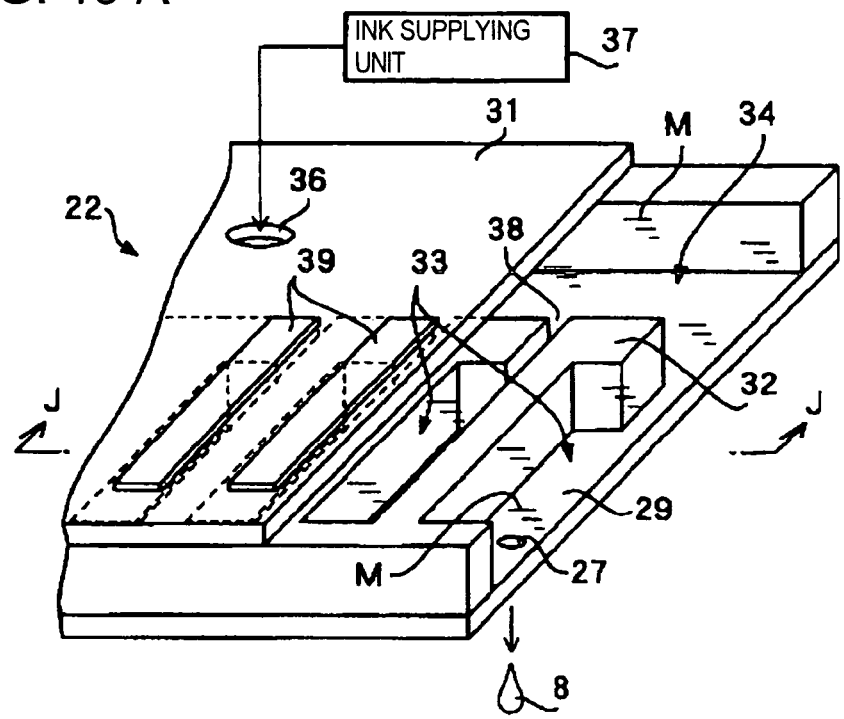
FIG. 19(a) is a perspective view illustrating the internal structure of a liquid drop supplying head.
FIG. 19(b) is a partial, longitudinal sectional view illustrating the internal structure of the liquid drop supplying head.
Figure 19:
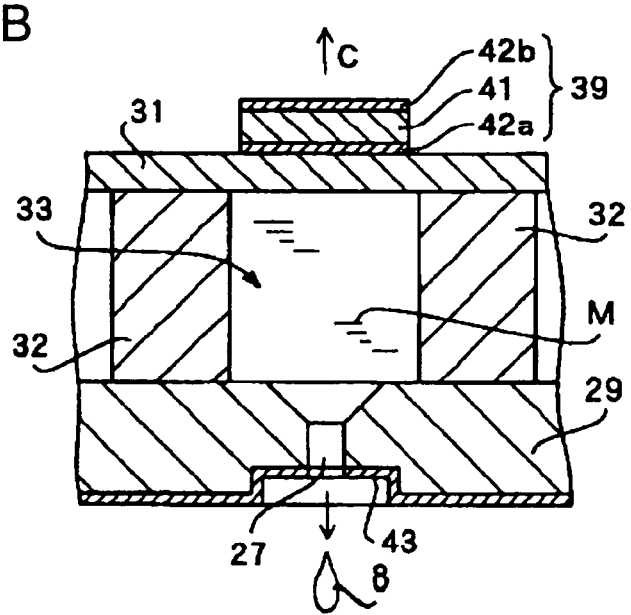
Figure 20:
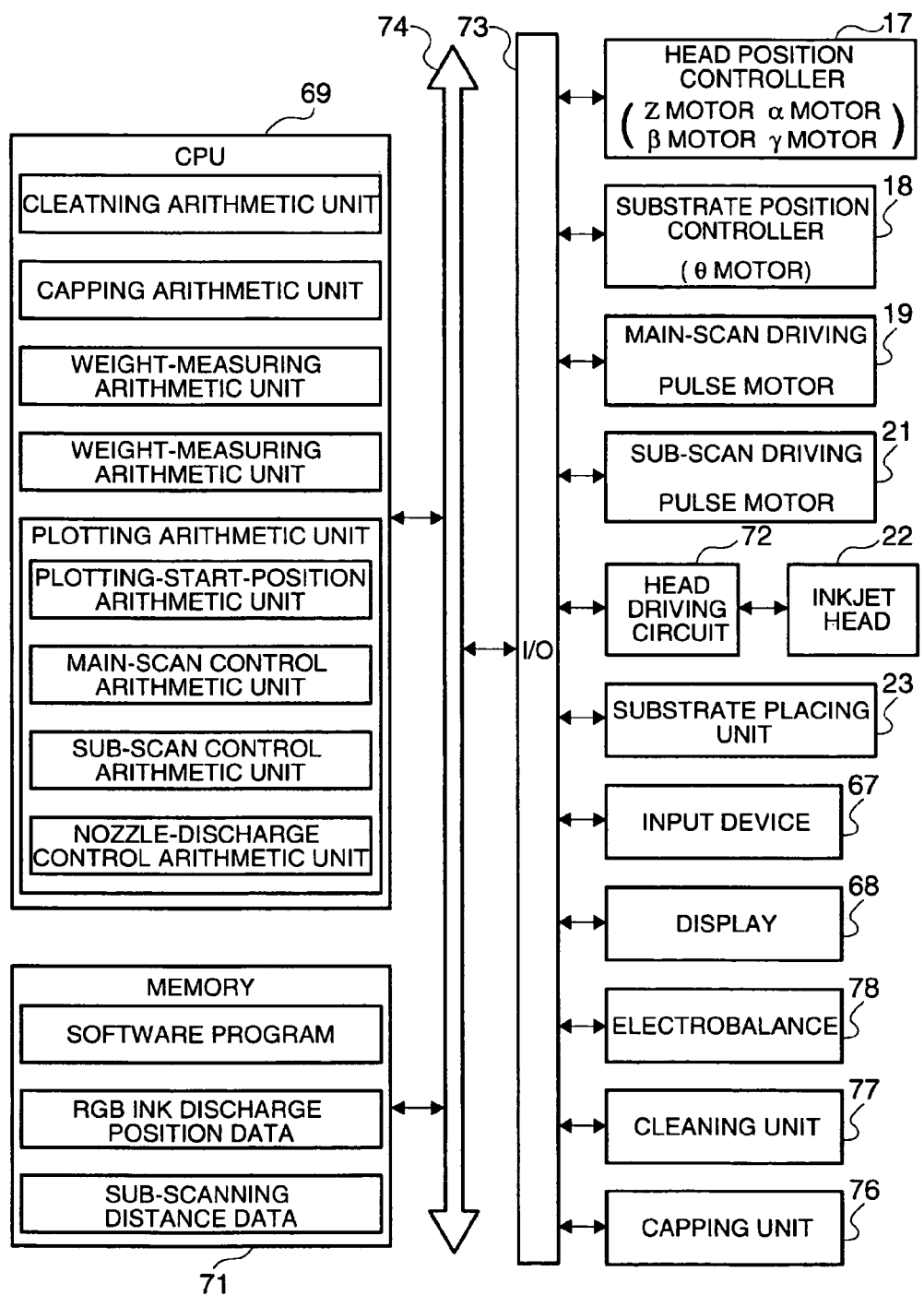
FIG. 20 is a block diagram illustrating the whole structure of a control system of a film-forming apparatus.

Respective devices such as the head position control unit 17, substrate position control unit 18, scan driving device 19, feed driving device 21, and head driving circuit 72 that drives a piezoelectric element 41 (refer to FIG. 19(*b*)) in the liquid drop supplying head 22, as shown in FIG. 20, are connected to CPU 69 via an input/output interface 73 and a bus 74. Besides, the substrate supply device 23, input unit 67, display device 68, capping device 76, cleaning unit 77, and electronic balance 78 are connected to CPU 69 via the input/output interface 73 and bus 74 similarly to the above construction.

The memory as an information recording medium 71 includes all external memory devices such as a semiconductor memory such as random access memory (RAM) and read only memory (ROM), a hard disc, a CD-ROM reading device, and a disc-type recording medium. The memory is functionally classified into a memory region to store a software program of describing an operational control procedure of a film-forming apparatus 16, a memory region for storing the positions of an object (mother substrate 12) where the liquid drop supplying head 22 supplies liquid drops as coordinate data, a memory region for storing the feeding amount of the object (mother substrate 12) to the feeding direction Y shown in FIG. 16, a region for functioning as a work area or a temporary file for CPU 69, and the other various memory regions.

CPU 69 performs a control to supply (discharge) liquid drops to a predetermined position on the surface of the object (mother substrate 12) according to the software program stored in the memory that is the information memory medium 71. As shown in FIG. 20, specific function-implementing units includes a cleaning operation unit that performs an operation for implementing a cleaning process, a capping operation unit for implementing a capping process, a weight-measuring operation unit for implementing the measurement of weight using the electronic balance 78, and a drawing operation unit 690 for discharging and depositing liquid drops to the surface of the object (mother substrate 12) and drawing a predetermined pattern b.

The drawing operation unit 690 includes a variety of functional operation units such as a drawing start position operation unit for installing the liquid drop supplying head 22 at an initial position for drawing, a scanning control operation unit for performing an operation that makes a control to scan and move the liquid drop supplying head 22 at a predetermined speed in the scanning direction X, a feeding control operation unit for performing an operation that makes a control to shift the object (mother substrate 12) by a preset feeding amount to the feeding direction Y, and a nozzle discharge control operation unit for performing an operation that makes a control on whether any one of the plurality of nozzles 27 in the liquid drop supplying head 22 is operated to discharge ink.

In addition, in the present embodiment, the aforementioned functions are implemented with the software program using CPU 69. However, if the functions can be implemented by an electronic circuit that does not use the CPU, they can also be implemented using such an electronic circuit.

Next, the operation of the film-forming apparatus 16 thus constructed will be described based upon a flowchart shown in FIG. 21. If the film-forming apparatus 16 operates with the input of electricity by an operator, initial setting is performed in step S1. Specifically, the head unit 26, the substrate supply device 23, and the control unit 24 are set to their predetermined initial states.

Figure 16:
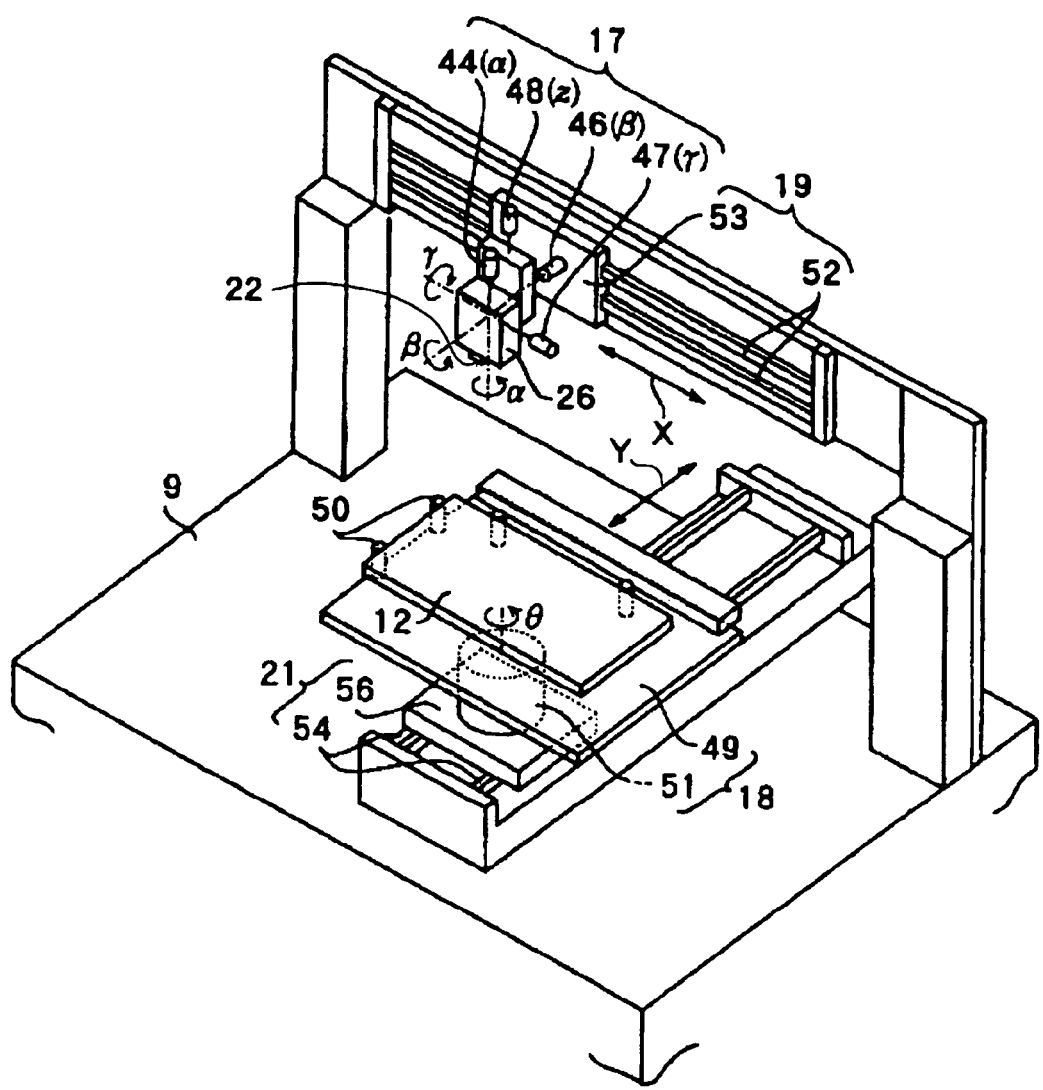
FIG. 16 is a partial perspective view illustrating main parts of the film-forming apparatus.

Next, if the weight measurement timing arrives (step S2), the scanning driving device 19 moves the head unit 26 shown in FIG. 16 to a place where the electronic balance 78 is placed as shown in FIG. 15 (step S3). Then, the electronic balance 78 is used to measure the amount of ink discharged from the nozzle 27 (step S4). According to a characteristic in the amount of the material discharged from the nozzle 27 thus measured, a voltage to be applied to the piezoelectric element 41 of each nozzle 27 is controlled (step S5).

Thereafter, when the cleaning time arrives (step S6), the head unit 26 is moved by the scan driving device 19 to a place where the cleaning unit 77 is positioned (step S7), and the liquid drop supplying head 22 is cleaned by the cleaning unit 77 (step S8).

If the weight measurement time or cleaning time does not arrive, or if the weight measurement or cleaning is completed, the substrate supply device 23 shown in FIG. 15 is operated to supply the object (mother substrate 12) to the table 49 in step S9. Specifically, while the object (mother substrate 12) placed in the substrate accommodating part 57 is sucked (vacuum adhered) and held by the absorption pad 64, the elevating shaft 61, the first and second arms 62, 63 are moved to convey the object (mother substrate 12) to the table 49, and press the object against the positioning means 50 previously provided at a proper position of the table 49. In addition, it is preferable that the object (mother substrate 12) is fixed to the table 49 by the air suction (vacuum absorption) means to prevent the object (mother substrate 12) from being dislocated on the table 49.

Next, an output shaft of the θ motor 51 is rotated in units of tiny angles to rotate the table 49 within the plane (horizontal plane), thereby positioning an object (mother substrate 12) (step S10). Then, while the object (mother substrate 12) is observed by the head camera 81 shown in FIG. 15, a position of starting a drawing with the liquid drop supply head 22 is determined by an operation (step S11). Then, the scan driving device 19 and the feed driving device 21 are properly operated to move the liquid drop supplying head 22 to a drawing start position (step S12).

Figure 29:
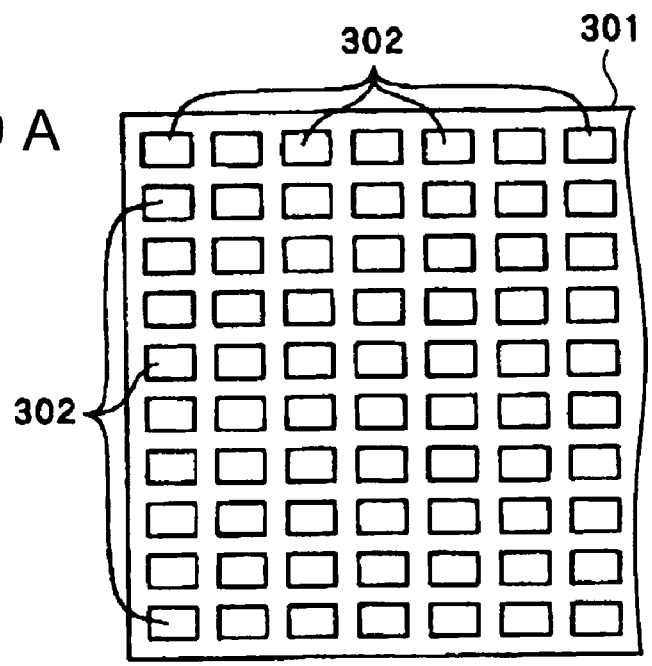
FIG. 29(a) is a partial plan view illustrating a color filter arrangement on a mother substrate.
FIG. 29(b) illustrates a method for forming a film on a mother substrate.
FIG. 29(c) illustrates a nozzle arrangement of the liquid drop supplying means.
Figure 29:
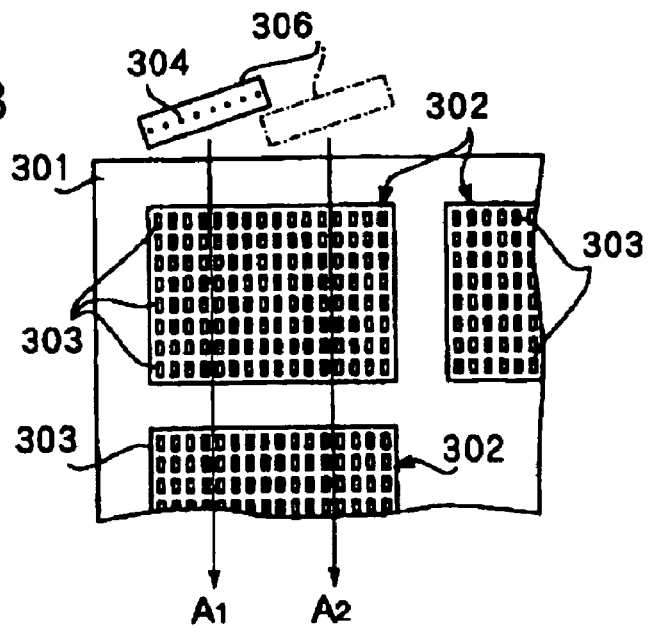
Figure 29:
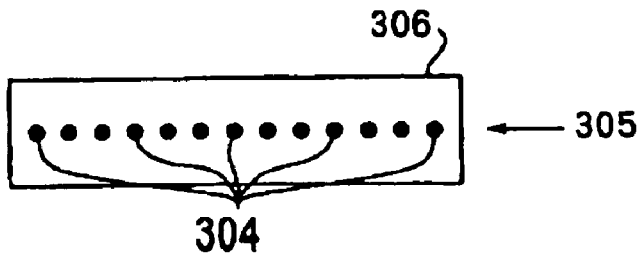
Figure 30:
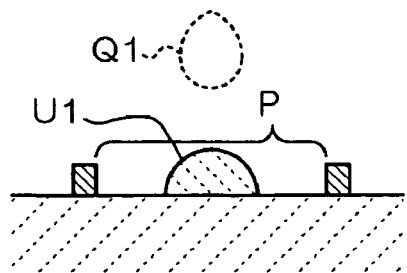
FIGS. 30(A-1) to 30(A-4) and FIGS. 30(B-1) to 30(B-4) are sectional views illustrating an arrangement of liquid drops on regions.
Figure 30:
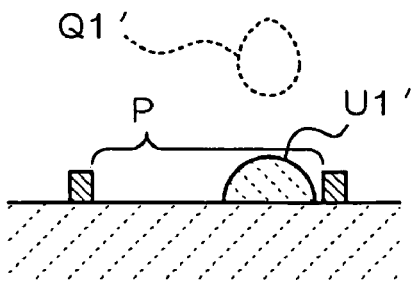
Figure 30:
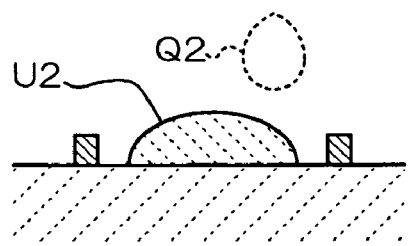
Figure 30:
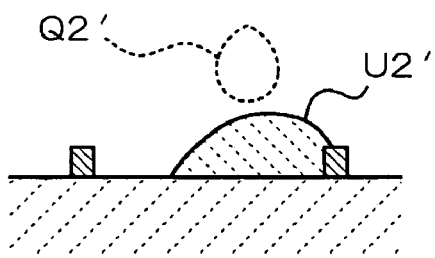
Figure 30:
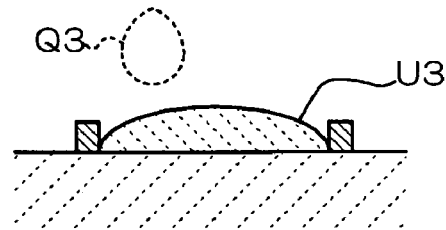
Figure 30:
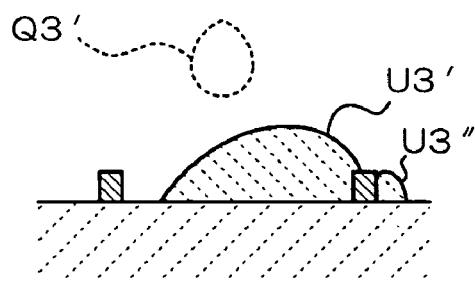
Figure 30:
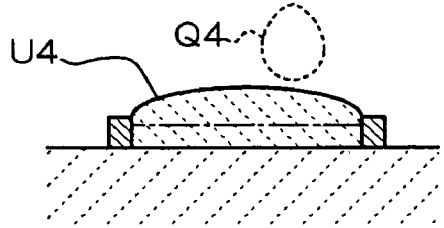
Figure 30:
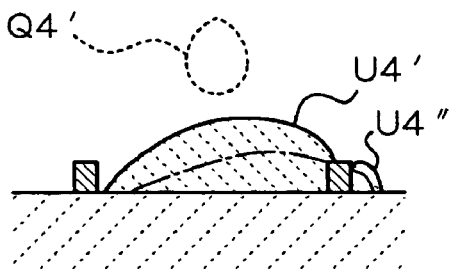
Figure 31:
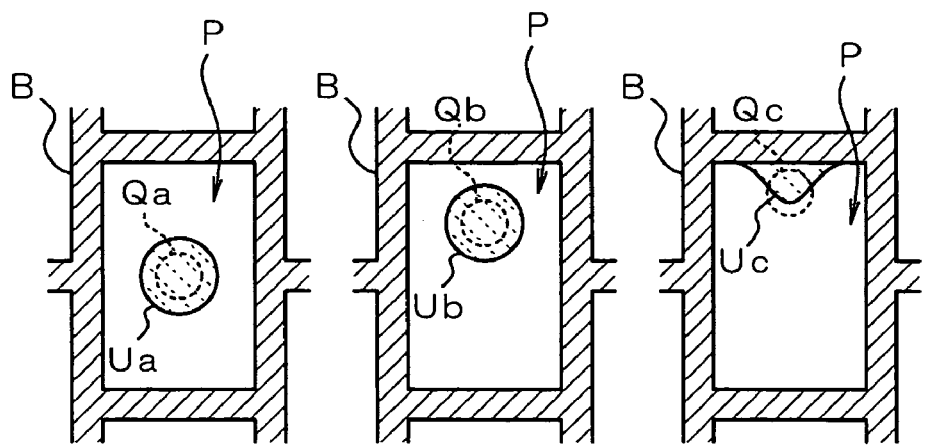
FIGS. 31(a) to 31(c) are plan views of an arrangement of a liquid drop material within regions by supply of liquid drops.
Figure 32:
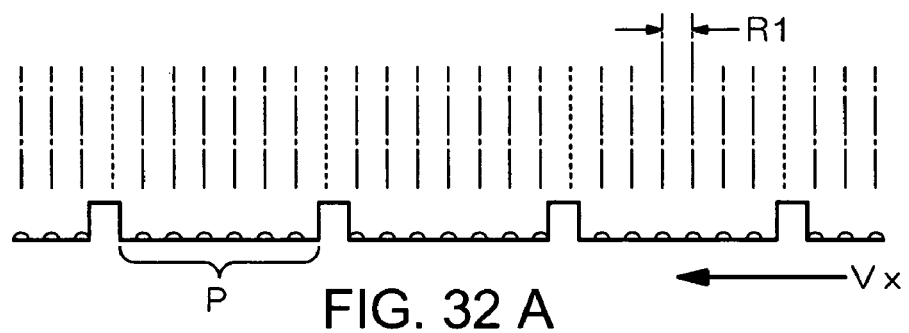
FIGS. 32(a) to 32(c) illustrates an arrangement of the liquid material depending on differences in resolutions R1 to R3 when liquid drops are supplied.
Figure 32:
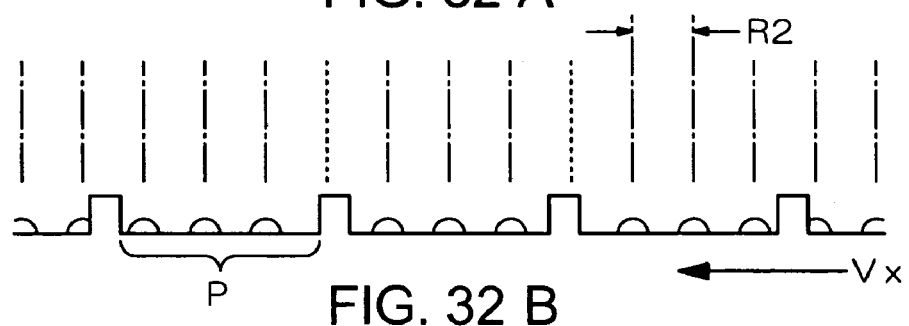
Figure 32:
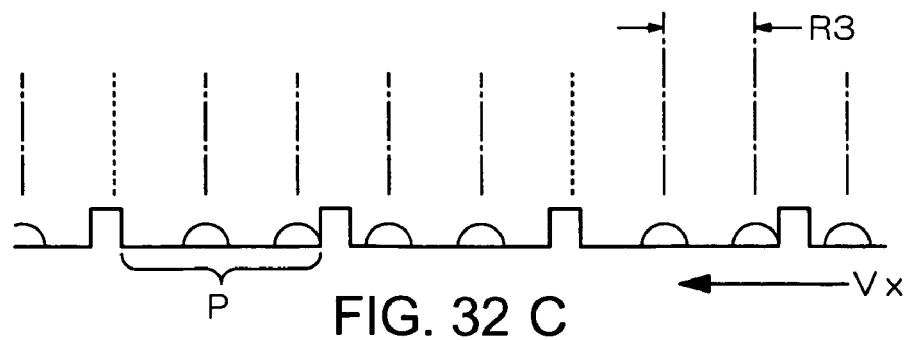
Figure 33:
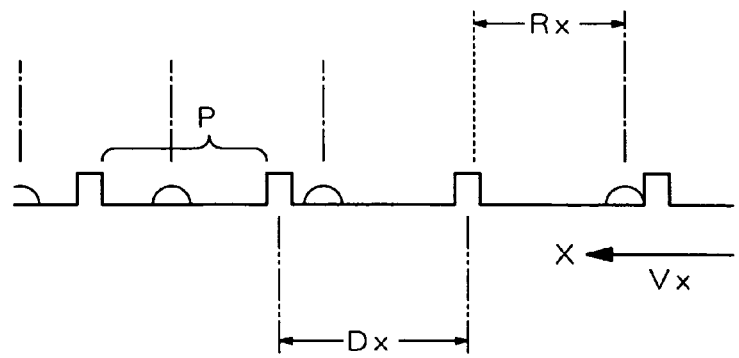
FIG. 33 illustrates the relationship between a liquid drop supplying resolution and an arrangement of the liquid material in regions.
Figure 34:
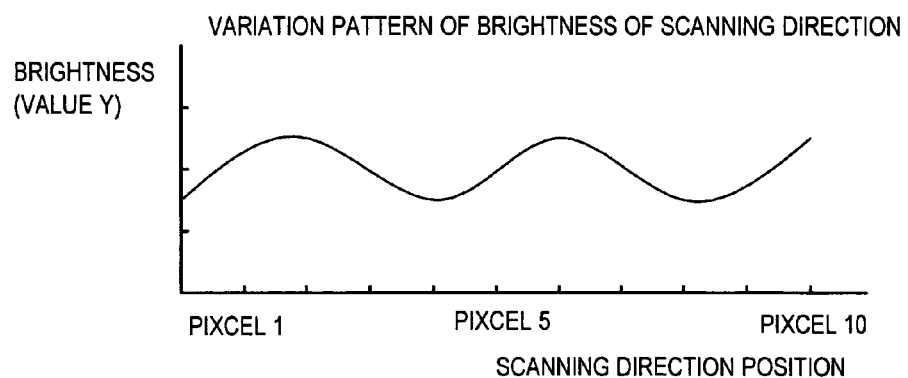
FIG. 34(a) is a graph illustrating a variation in brightness Y of the scanning direction.
FIG. 34(b) is a graph illustrating a variation in brightness Y of the feeding direction.
Figure 34:
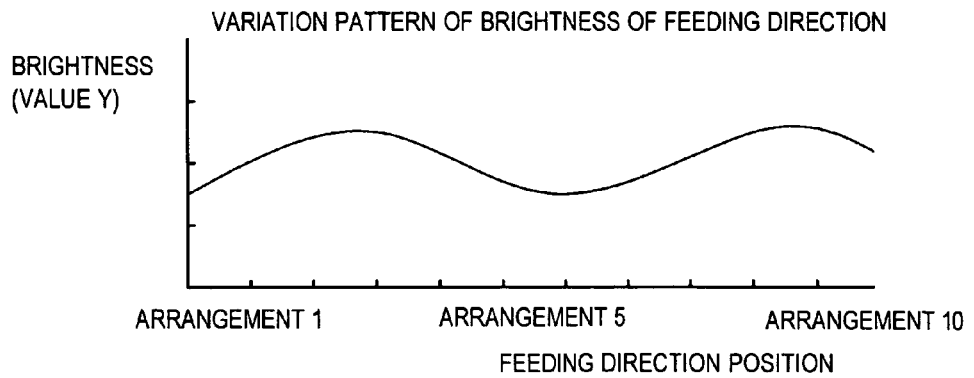

At this time, the liquid drop supplying head 22 may take such a position that the reference direction S shown in FIG. 17 coincides with the scanning direction X, or, as shown in FIG. 29(b), may be constructed that the reference direction S is inclined in the scanning direction X at a predetermined angle of inclination. There is often a difference between the pitch of the nozzles 27 and that of a position of an object where ink is to be deposited. Thus, the angle of inclination is used as measures to make the dimension component of the pitch of the nozzles 27, in the feeding direction Y, arranged to the arrangement direction T, geometrically equal to the pitch at the depositing position onto the object (mother substrate 12) in the feeding direction Y when the liquid drop supplying head 22 is moved in the scanning direction X.

Figure 21:
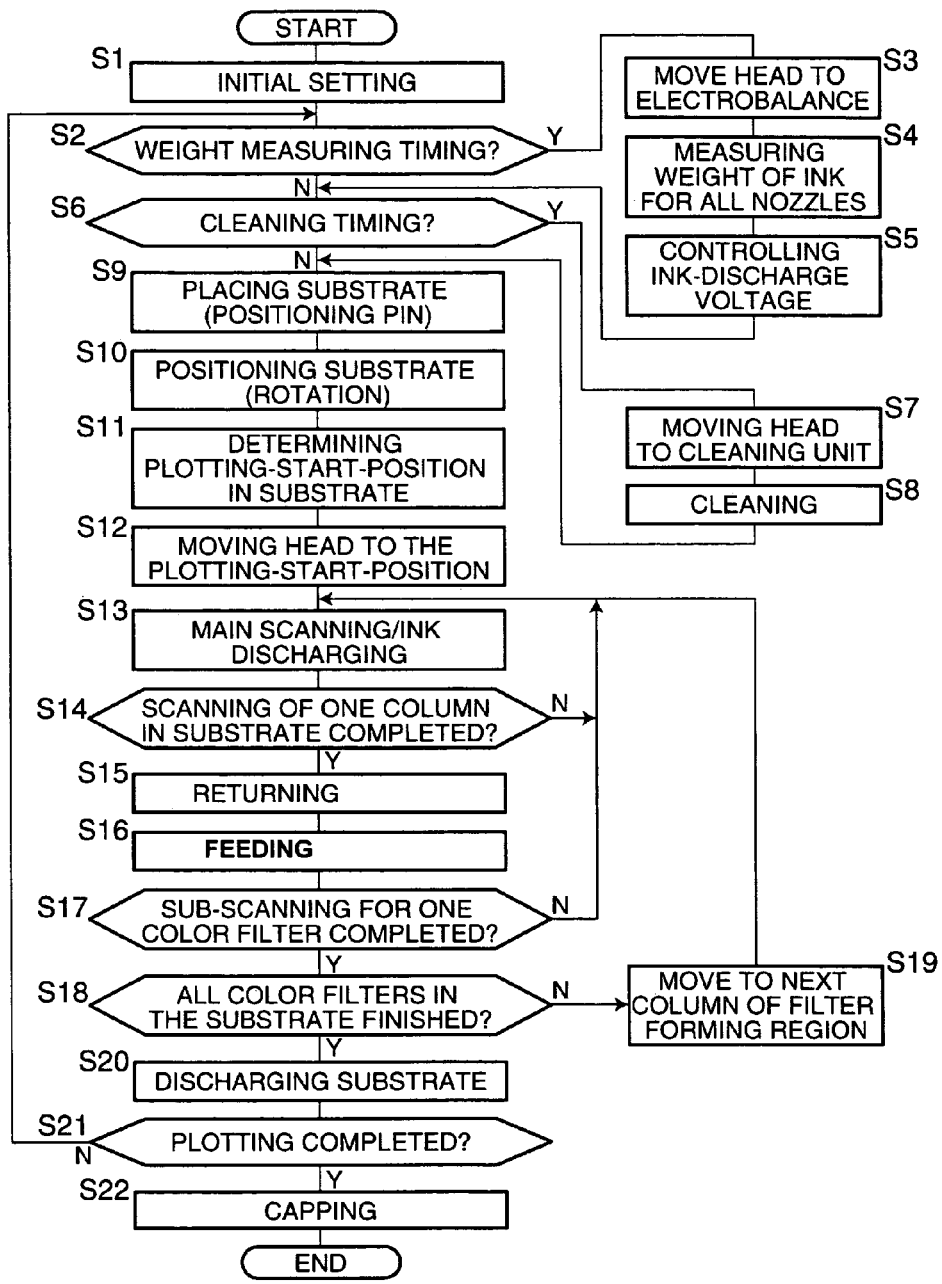
FIG. 21 is a schematic flowchart illustrating the operation of a film-forming apparatus.

If the liquid drop supplying head 22 is placed at the drawing start position in step S12 shown in FIG. 21, the liquid drop supplying head 22 is scanned and moved linearly in the scanning direction X at a constant level of speed in step S13. While the liquid drop supplying head 22 is scanned, a liquid drop is discharged from the nozzle 27 of the liquid drop supplying head 22 to the surface of the object (mother substrate 12).

In addition, the amount of a liquid drop may be set to discharge the whole amount of the liquid drop within a range of discharge that can be covered by the liquid drop supplying head 22 with one-time scanning process. For example, as described later, if the liquid drop supplying head 22 is constructed to discharge only a fractional portion (for example, one fourth) of the amount of the liquid material to be originally discharged at one-time scanning process, and if the liquid drop supplying head 22 is scanned several times, the liquid drop supplying head 22 may be constructed such that the scanning range thereof partially overlaps the feeding direction Y and the discharge of the liquid material is performed to all the areas several times (for example, four times).

When the scanning process for one line of the object (mother substrate 12) is completed (step S14), the liquid drop supplying head 22 returns to its initial position (step S15), and moves to the feeding direction Y by a predetermined amount (the set feeding amount) (step S16). At this time, the scanning process is again performed to discharge the liquid material in step S13, and, then, the aforementioned processes are repeated to perform the scanning processes over a plurality of lines. In this case, if the scanning process for one line is completed, the liquid drop supplying head 22 may be scanned in returns such that it is moved by a predetermined amount to the feeding direction Y and it is returned to perform the scanning process in reverse.

At this time, a description will be made about a case that a plurality of color filters are formed in the mother substrate 12. If all the filter element materials are discharged to one row of the color filter region in the mother substrate 12 is completed (step S17), the liquid drop supplying head 22 is moved by a predetermined amount to the feeding direction Y to repeat the operation of the aforementioned steps S13 to S16. Then, if the filter element materials are completely discharged to all rows of the color filter region of the mother substrate 12 (step S18), the mother substrate 12 is ejected outside after treatment by the substrate supply device 23 or other conveying mechanism in step S20. Thereafter, as long as there is no operation completion command from an operator, the operation for supplying the mother substrate 12 and for discharging liquid drops will be repeatedly performed.

If there is an operation completion command from an operator (step S21), CPU 69 conveys the liquid drop supplying head 22 to a place where the capping device 76 shown in FIG. 15 is positioned, and the capping device 76 performs a capping process to the liquid drop supplying head 22 (step S22).

While the liquid drop supplying head 22 is scanned in the scanning direction X, the film-forming apparatus 16 thus constructed discharges liquid drops of ink continuously and repeatedly performs the scanning through the movement to the feeding direction Y (feeding operation). As a result, the liquid material is two-dimensionally deposited to a predetermined region on the surface of the object (mother substrate 12), thereby forming a film.

Generally, the discharge amount of the plurality of nozzles 27 composing the nozzle row 28 of the liquid drop supplying head 22 is not necessarily identical. Instead, there is a tendency that the discharge amount gets greater at several nozzles (for example, ten nozzles at each side) 27 positioned at both ends of the nozzle row 28. In this way, it is not preferable to use nozzles 27 having a greater amount of discharge than the other nozzles 27, in that the thickness of a film to be formed by discharge of ink is not uniform. Therefore, preferably, several nozzles, for example, about ten nozzles, positioned at both ends E of the nozzle row 28, among the plurality of nozzles 27 composing the nozzle row 28, are previously set not to discharge ink, and only the nozzles 27 positioned at the other parts of the nozzle row 28 are used.

Besides, it is possible to reduce the irregularity in the thickness of the formed film by using a plurality of liquid drops instead of just a single liquid drop discharged from the liquid drop supplying head 22 when a film-forming process is carried out at a predetermined area of an object. In other words, when a film-forming process is performed in a plurality of areas and a plurality of liquid drops are used for each area, there will be reduced irregularity in the thickness of a film to be formed at respective areas even if there may be more or less irregularity in the amount of respective liquid drops.

Figure 18:
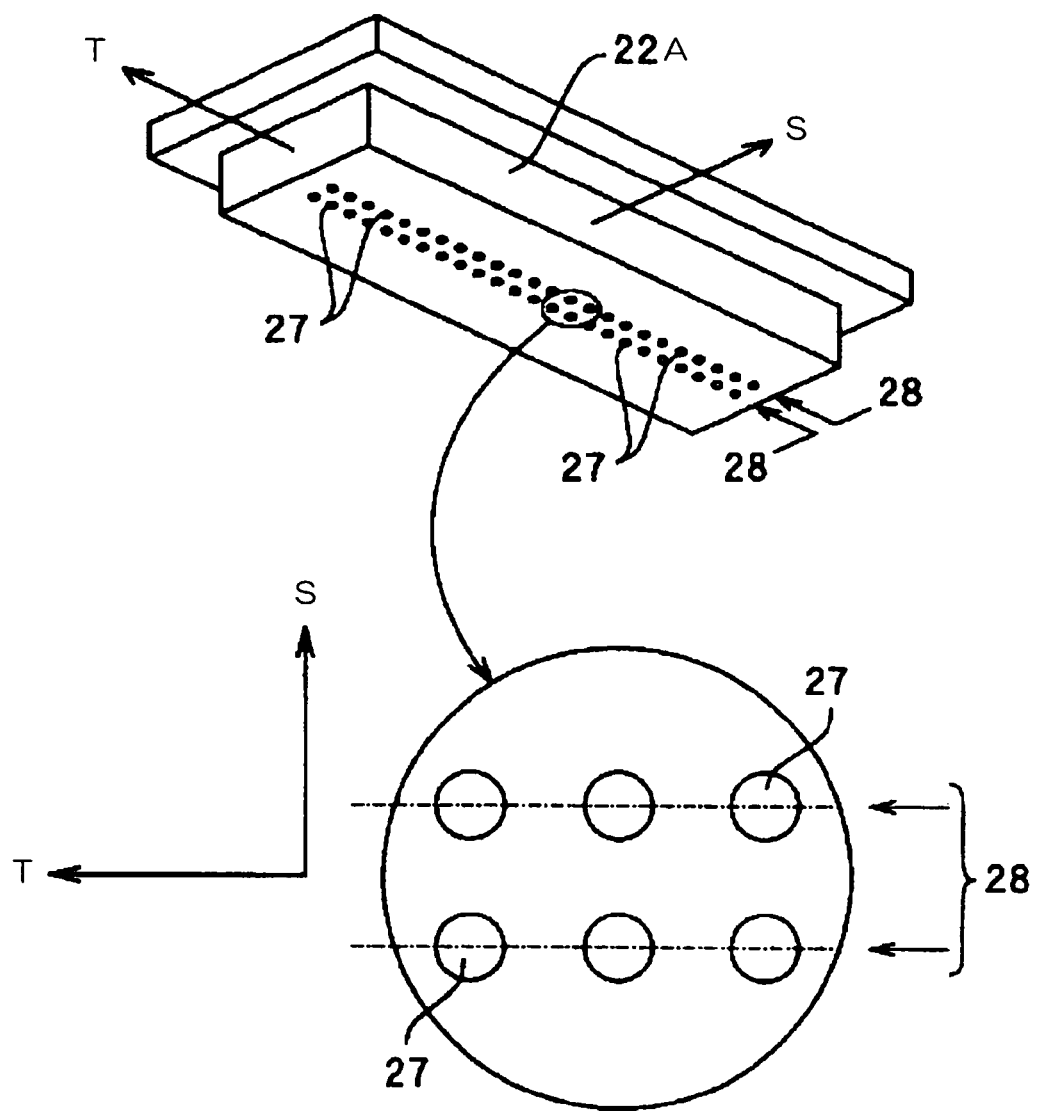
FIG. 18 illustrates the structure of another liquid drop supplying head.
Figure 22:
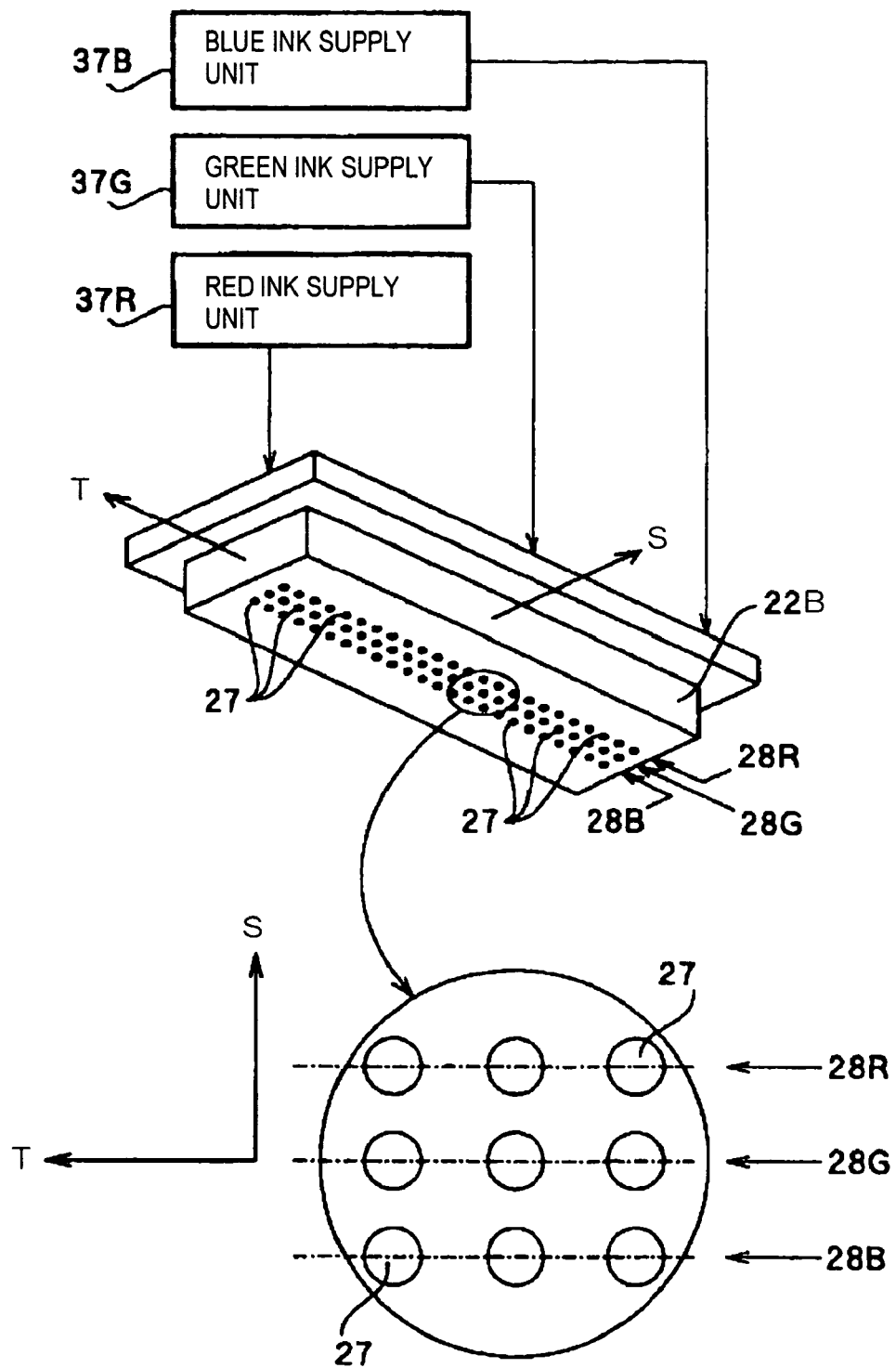
FIG. 22 illustrates the structure of another liquid drop supplying head.

The scope of the invention is not limited to the structure of the liquid drop supplying head 22 described above, but there may be many other structures for constructing the liquid drop supplying head. For example, a liquid drop supplying head 22A shown in FIG. 18 includes two nozzle rows 28 arranged in the reference direction S and a plurality of nozzles 27 are included in both nozzle rows 28. Further, the liquid drop supplying head 22B illustrated in FIG. 22 includes three nozzle rows 28R, 28G, 28B arranged in the reference direction S. In either of the liquid drop supplying heads 22A, 22B, the material of liquid drops to be discharged from the nozzles 27 of each nozzle row 28 may be the same or different. For example, the liquid drop supplying head 22A shown in FIG. 18 is constructed to discharge the same material of liquid drops from the nozzles 27 in either of the two nozzle rows 28. However, in the liquid drop supplying head 22B shown in FIG. 22, the liquid material to be discharged from the nozzles 27 of each nozzle row 28R, 28G, 28B is different, for example, filter element materials 13R, 13G, 13B which will be described below may be used.

Details of a Film-Forming Method and a Film-Forming Apparatus

Next, a detailed description will be made about the characteristics of the film-forming method and the film-forming apparatus according to the present invention. The following descriptions will be related to a general structure, not directly related to the specific structure of the film-forming method and apparatus. Therefore, the structure of the present embodiment can be recognized in the general structure and also in the specific film-forming method and apparatus shown in FIGS. 15 to 22.

Figure 1:
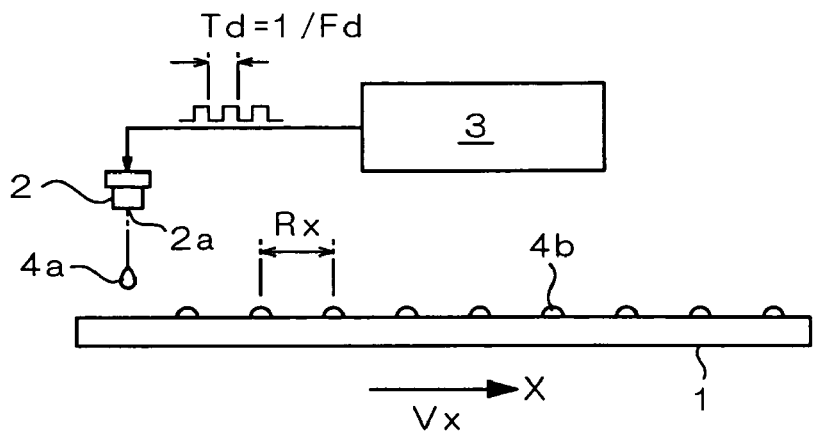
FIG. 1 illustrates an embodiment of a film-forming method according to the present invention.

FIG. 1 illustrates the principles of the film-forming method and apparatus of the present embodiment. First, an object 1 such as a substrate is arranged, and a liquid drop supplying means 2 (corresponding to the liquid drop supplying head 22 described above) to supply a liquid drop 4a to the surface of the object 1 is arranged to face the object 1. The liquid drop supplying means 2 is constructed to be capable of relatively scanning the object 1 in the scanning direction X. In this case, the object 1 is moved in the scanning direction X at the scanning speed Vx in the illustrated embodiment. On the contrary, the liquid drop supplying means 2 may be moved, and both the object 1 and the liquid drop supplying means 2 may also be moved. In the illustrated embodiment, only the positive direction of the scanning direction X is set as a direction to which the object 1 is moved, but it may be set as the relative movement direction of the liquid drop supplying means 2. In any event, it is preferable to get the sign of various parameters (δx, δd) uniformly set in a certain direction.

The liquid drop supplying means 2 is driven by a driving signal 3a output from driving means 3. For example, the driving means 3 comprises an appropriate driving circuit to output the driving signal 3a. The driving signal 3a outputted by the driving means 3 is a periodic signal having a driving period Td (a reverse number of driving frequency Fd). When one liquid drop 4a is discharged from a nozzle 2a of the liquid drop supplying means 2 by a driving waveform of a driving period Td, the driving signal 3a is made to supply a liquid material 2b onto the surface of the object 1. Therefore, if liquid drops 4a are continuously discharged, predetermined driving waveforms appear repeatedly at the driving period Td. When liquid drops 4a need not be discharged for a certain period of time, there will be no driving waveform in the predetermined driving period Td of the driving signal 3a equivalent to the certain period of time. In other words, the driving means 3 is constructed to determine whether a driving waveform is formed at every driving period Td of the driving signal to drive the liquid drop supplying means 2.

The liquid drop supplying means 2 can discharge liquid drops 4a with the driving signal 3a at every driving period Td. Thus, when the liquid drop supplying means 2 is relatively scanned to the object 1 at the scanning speed Vx, the resolution Rx of the liquid drop supplying position on the surface of the object 1 is obtained by multiplying driving period Td and scanning speed Vx. That is, Rx=Td×Vx. The resolution Rx is a minimum gap of the liquid drop supplying positions when liquid drops 4a is continuously discharged by the liquid drop supplying means 2 in the scanning direction X.

Figure 2:
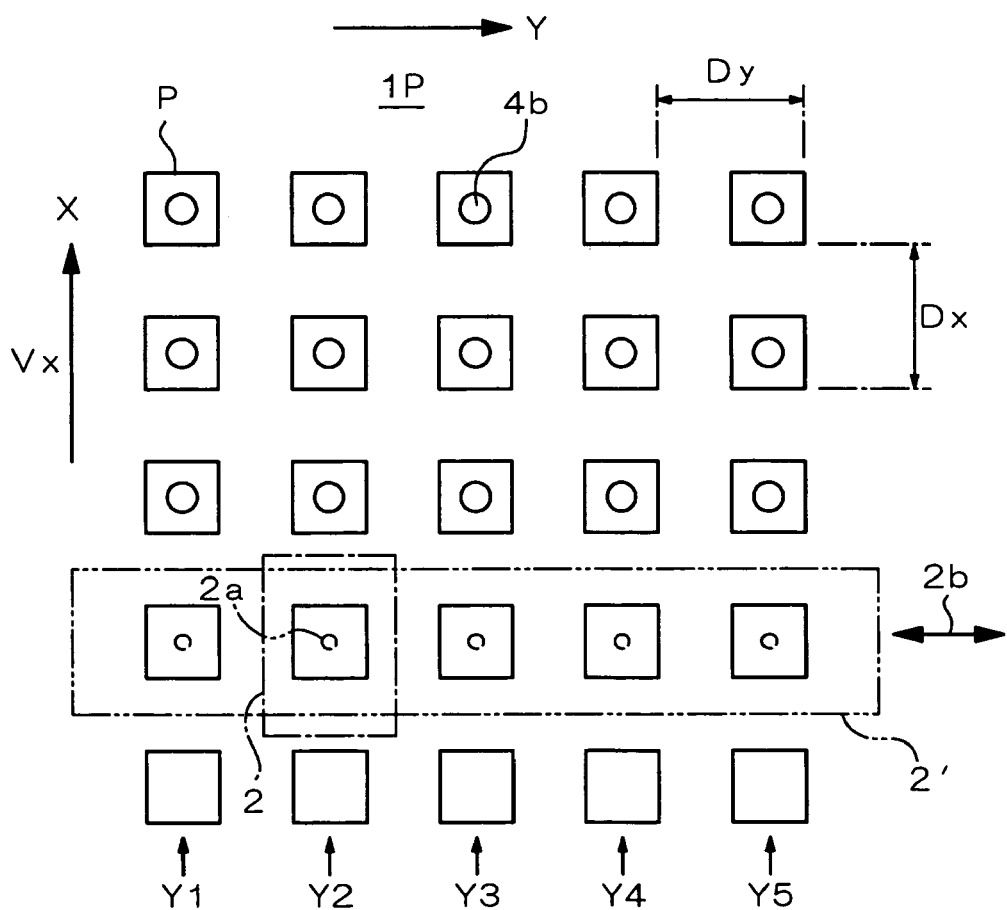
FIG. 2 is a plan view illustrating the film-forming method according to the present invention.

FIG. 2 is a plan view illustrating the relationship between a planar periodic structure 1P arranged on the surface of the object 1 and a liquid material 4b that will be supplied in accordance with the planar periodic structure 1P. The planar periodic structure 1P is constructed to form a film with the liquid material 4b that has been deposited and arranged by a liquid drop 4a supplied by the liquid drop supplying means 2. For example, in an example shown in FIG. 2, there is a periodic structure having regions P arranged horizontally and vertically with a gap on the surface of the object 1. In this structure, regions P are arranged with almost an identical gap in both directions, the vertical scanning direction Y in the drawing and the horizontal feeding direction Y in the drawing. In this case, the structural period of scanning direction X and that of feeding direction Y are respectively indicated by Dx and Dy in the planar periodic structure 1P. Additionally, the scanning direction X and the feeding direction Y are positioned perpendicular to each other in the illustrated example, but they need not be positioned perpendicular to each other. They may simply be positioned to intersect each other. The planar periodic structure 1P is patterned to have no phase difference in the periodicity of scanning direction X in rows Y1 to Y5 of two regions P at two different positions as seen from the feeding direction Y perpendicular to scanning direction X.

When the planar periodic structure 1P described above is constructed, liquid drops 4a are discharged to the regions P supposedly assigned on the surface of the object 1, and the liquid material 4b is arranged within the corresponding regions P. At this time, in the present embodiment, the natural number times of the resolution Rx (=Td×Vx) is set to be the structural period Dx of the scanning direction X in a planar periodic structure 1P to be formed. In other words, Dx=n×Rx (n is a natural number). Then, when the liquid drop supplying means 2 is relatively scanned to the object 1 in the scanning direction X to discharge the liquid drop 4a as shown in FIG. 1, the liquid material 4b can be arranged within a plurality of corresponding regions P arranged in the scanning direction X, as shown in FIG. 2. For example, if the liquid material 4b is arranged substantially at the center of a certain region P as in the illustrated example, it is possible to make the liquid material 4b arranged substantially at the center of another region P. Accordingly, it is possible to reduce irregularity in the arrangement of the liquid material 4b in a plurality of regions P arranged in the scanning direction X, which results in a decrease in the unevenness of a formed film.

At this time, if the liquid drop supplying means 2 has only a single nozzle 2a as indicated by a single dot chain line, for example, a row Y2 of region P shown in FIG. 2 is scanned in the scanning direction X and the liquid drop 4a is discharged to arrange the liquid material 4b. Then, a feeding process is performed to feed the liquid drop supplying means 2 as much as the structural period Dy in feeding direction Y Thereafter, the aforementioned scanning process is performed to a row Y3 of another region P and the liquid drop 4a is discharged to arrange the liquid material 4b. The same process is repeated to rows Y4, Y5 arranged in the scanning direction X, so as to arrange liquid drops one after another. As a result, there can be formed a planar periodic structure 1P having periodicity in both vertical and horizontal directions.

However, the liquid drop supplying means 2 need not be constructed with only a single nozzle 2a, but may include a plurality of nozzles 2a. For example, a plurality of nozzles 2a is arranged along an arrangement direction 2b in liquid drop supplying means 2' illustrated in the drawing. In this case, by making the arrangement period of nozzles 2a equal to the structural period of the planar periodic structure 1P as seen from a direction intersecting the scanning direction X, a plurality of nozzles 2a make it possible to arrange the liquid material to a plurality of rows Y1 to Y5 at one time. In the illustrated example, the structural period Dy of the planar periodic structure 1P as seen from the feeding direction Y coincides with the arrangement period of nozzles 2a while the feeding direction Y perpendicular to the scanning direction X is made to coincide with the arrangement direction 2b of the nozzles 2a in the liquid drop supplying means 2'. At this time, if a liquid drop 2a is discharged by the liquid drop supplying means 2', there can, be almost no irregularity in the arrangement of the liquid material 4b in regions P arranged in the feeding direction Y as well as in the regions P arranged in the scanning direction X. In addition, even when the liquid drop supplying means 2' having a plurality of nozzles as such is used, the scanning step can be performed several times with an insertion of a feeding operation to the feeding direction Y, similarly to the liquid drop supplying means 2 described above. Besides, when a plurality of liquid drops are supplied to respective regions P to form a planar periodic structure 1P, the sequential scanning step can be repeatedly performed with an insertion of a feeding operation in which the liquid drop supplying means 2' having a plurality of nozzles is fed with fewer rows than the number of nozzles in the feeding direction Y. Thus, it is possible to reduce the unevenness in film forming, which is caused by the irregularity in the discharge amount of the liquid material between a plurality of nozzles.

Figure 3:
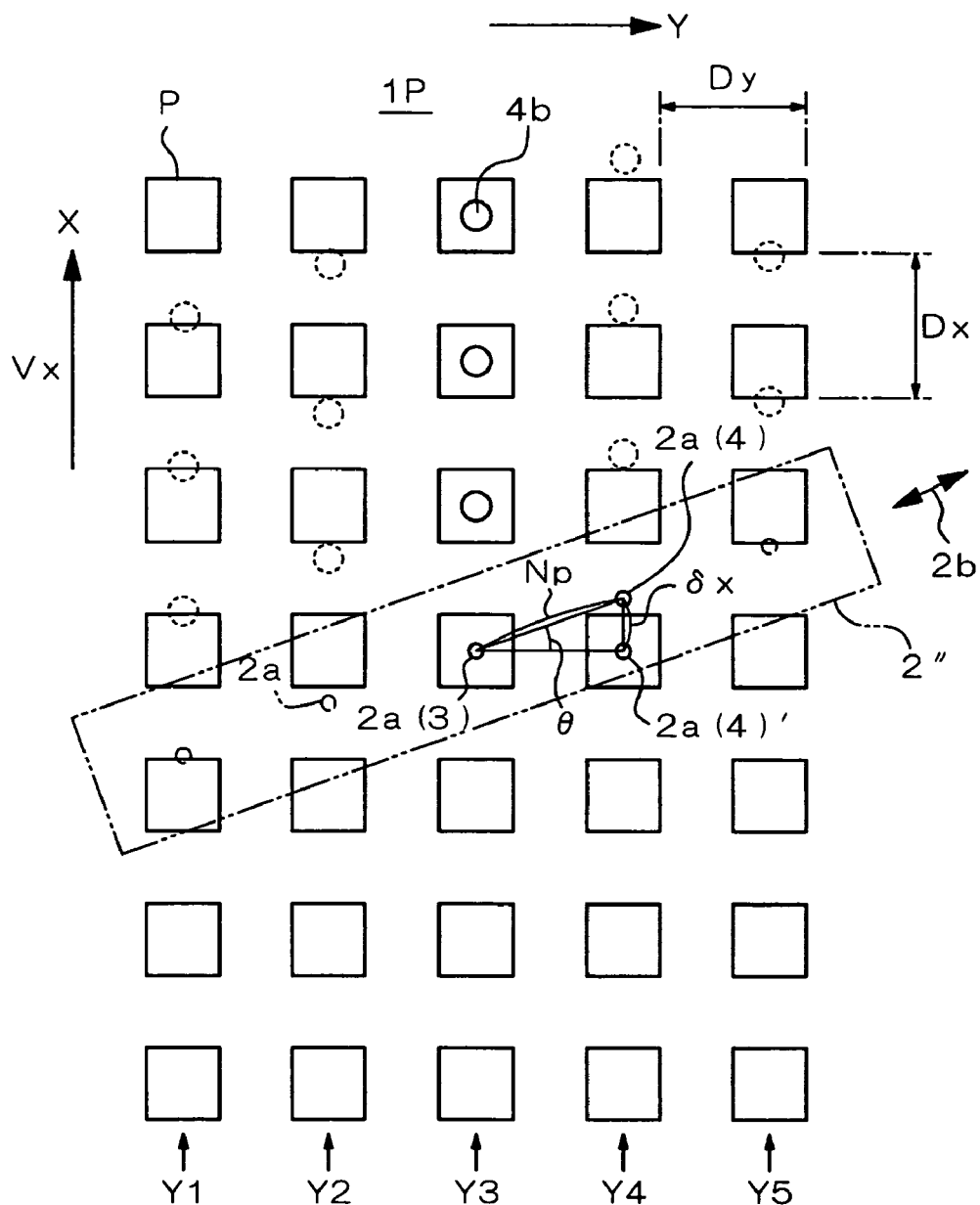
FIG. 3 is a plan view illustrating a modification of the film-forming method according to the present invention.

FIG. 3 is a plan view illustrating the relationship with a planar periodic structure 1P to be formed in the object 1 when a liquid drop supplying means 2" different from the one described above is used. At this time, a plurality of nozzles 2a are arranged in the arrangement direction 2b in the liquid drop supplying means 2". Here, a gap between such nozzles 2a is designated as Np. Also, a structural period of the planar periodic structure 1P in the scanning direction X and a structural period thereof in the feeding direction Y are respectively designated as Dx and Dy. In this example, there is a difference between the structural period Dy as seen from the feeding direction Y perpendicular to the scanning direction X and the nozzle gap Np of the liquid drop supplying means 2". Therefore, the arrangement direction 2b of the nozzles 2a in the liquid drop supplying means 2" is inclined at an angle θ with respect to the feeding direction Y so as to make the gap (Np·cos θ) of the feeding direction Y of nozzles 2a coincide with the structural period Dy.

When the liquid drop supplying means 2" is scanned in the scanning direction X to discharge the liquid drop in the above described position, the supplying position of the liquid drop is made to coincide with the periodicity of the planar periodic structure 1P in the feeding direction Y. However, if the arrangement direction 2b of nozzles 2a is inclined with respect to the feeding direction Y, there may be a positional deviation δx of the scanning direction X, δx=Np·sin θ=Dy·tan θ between adjacent nozzles 2a. The positional deviation δx depends on the angle θ of inclination set to make the nozzle gap of the liquid drop supplying means 2" equal to the structural period Dy of the scanning direction Y. In general, the positional deviation is not limited to that equal to the natural number times of the resolution Rx (refer to FIG. 1). Therefore, when liquid drops are simultaneously discharged from a plurality of nozzles 2a of the liquid drop supplying means 2" (for example, when all the nozzles are operated by a common driving signal), and, for example, if liquid drops are discharged to arrange the liquid material 4b at the center of the row Y3 of region P arranged in the illustrated scanning direction X, the liquid material may be arranged at positions deviated from the center of the region P, in case of rows Y1, Y2, Y4, Y5, other than the row Y3, as illustrated with a dot line. More specifically, in case of rows Y2, Y4 neighboring the row Y3, the positions of the liquid drop may be deviated as far as δx in the scanning direction X from the center of region P. In case of rows Y1, Y5 opposite to the rows Y2, Y4, respectively, the positions of the liquid drop may be deviated as far as δx in the scanning direction X from the center of region P. In other words, if the nozzles 2a are arranged with an identical gap, the positional deviation of respective nozzles in the scanning direction X is iδx (i is a natural number). For example, in case of the illustrated example, if there are nozzles at the position of reference numeral 2a(4)', there will be no problem. However, the nozzles 2a(4) are actually deviated as far as δx in the scanning direction X from the nozzle 2a(3). Therefore, when liquid drops are discharged simultaneously from the nozzles 2a(3) and 2a(4), the supplying position of the liquid drop is deviated as far as δx in the scanning direction X.

In actuality, the driving period to supply the liquid drop in nozzles 2a(3) corresponding to the row Y3 and that in nozzle 2a corresponding to the other rows are made different depending to the positional deviations δx, 2δx by the driving means 3 shown in FIG. 1, so that it is possible to make the positional deviation of the liquid material in the scanning direction X smaller than δx. However, it is impossible to completely eliminate the positional deviation in the scanning direction X in the arrangement of the liquid material 4b at regions P arranged in the feeding direction Y as long as the positional deviation δx is not natural number times of resolution Rx as described above. Therefore, there may be periodic deviation of the liquid material in the feeding direction Y, a stripe pattern of a formed film in the feeding direction Y (color or brightness irregularity in case of a color filter or a luminous body) may occur.

Figure 4:
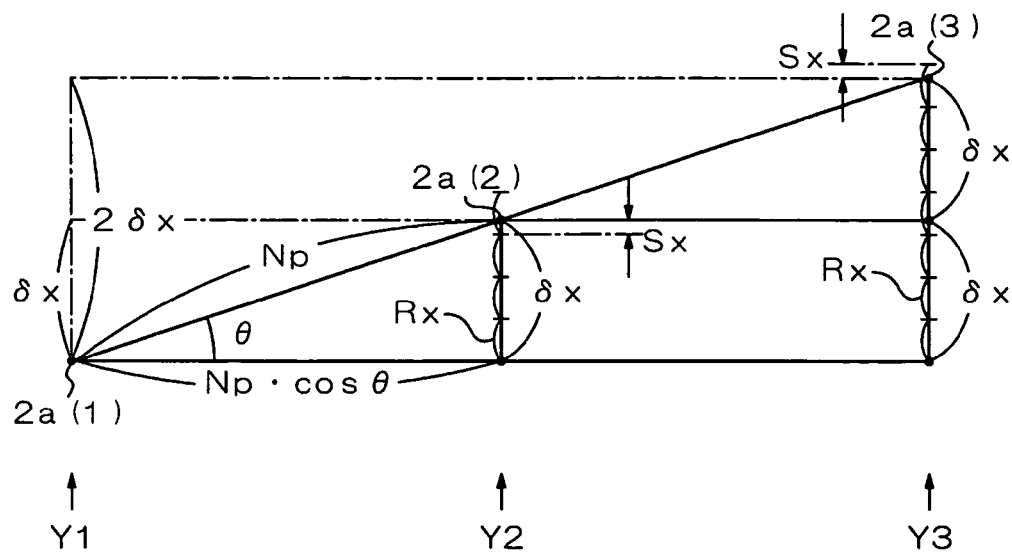
FIG. 4 illustrates the concept of the film-forming method shown in FIG. 3.

Accordingly, the position of nozzles 2a may be deviated in the scanning direction X to compensate the positional deviations δx, 2δx. For example, as shown in FIG. 4, in case of nozzles 2a(1), 2a(2), 2a(3) respectively corresponding to rows Y1, Y2, Y3, there are deviations δx, 2δx respectively between nozzle 2a(1) and nozzle 2a(2) and between nozzle 2a(1) and nozzle 2a(3). At this time, if the positions of nozzle 2a(2) and nozzle 2a(3) are corrected in reverse in the scanning direction X (a vertical direction as illustrated) as far as they are deviated, so as to eliminate a positional deviation of the liquid drop supplying position, which is caused by positional deviations of nozzles.

However, the correction amount of nozzle positions of the liquid drop supplying means 2 is a distance corresponding to an angle of inclination θ, δx=Np·sin θ. In the case that a plurality of nozzles are provided, the correction amount of nozzles spaced apart from each other is great. It is generally difficult to construct the material chamber that can receive such a great correction amount without problem. Therefore, in order to reduce the correction amount, the positional correction amount of nozzles 2a can be obtained as a remainder of a natural number quotient m when δx is divided by resolution Rx, instead of δx, or as a value when the remainder is subtracted from the resolution Rx (hereinafter, simply referred to as 'remainder value'), Sx=δx−m·Rx (m is a natural number), or Sx=2δx−m·Rx. In this case, the natural number m is a natural number that satisfies (m−1)·Rx<δx<m·Rx, or, m·Rx<δx<(m+1)·Rx (or, (m−1)·Rx<2δx<m·Rx, or, m·Rx<2δx<(m+1)·Rx). In the aforementioned method, it is possible to achieve a significant reduction in the positional correction amount of nozzles 2a.

Figure 5:
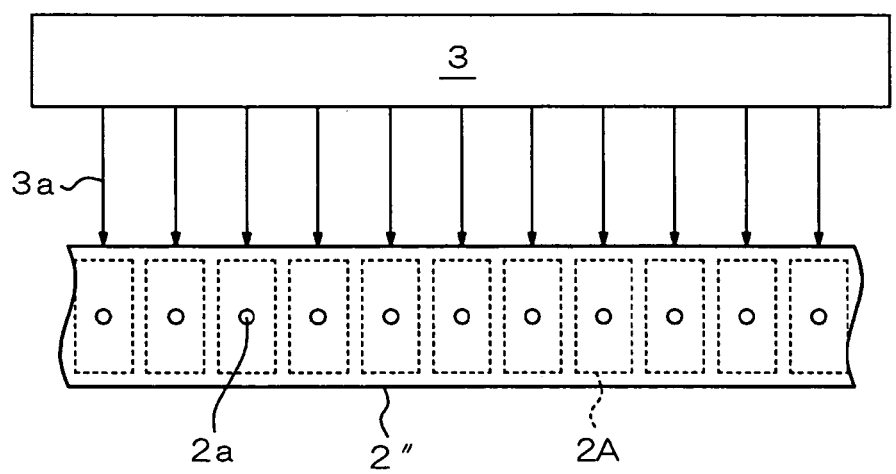
FIG. 5 is a structural view illustrating a liquid drop supplying means for implementing a film-forming method shown in FIG. 4.

In the structure thus constructed, it is necessary to independently control a plurality of nozzles 2a of the liquid drop supplying means 2". For example, as shown in FIG. 5, it may be considered that the liquid drop supplying means 2" is provided with a plurality of independent liquid drop supplying structures 2A respectively having nozzles 2a. The independent liquid drop supplying structures 2A may discharge the liquid drop according to separate driving waveforms when driving signals 3a are separately received from the driving means 3. A plurality of driving signals 3a corresponding to the plurality of liquid drop supplying structures 2A are set to have a driving waveform sent by a synchronized common driving period. However, such a driving waveform may be different with each of the plurality of driving signals 3a. Therefore, it is possible to independently select whether the liquid drop is discharged at a certain driving period or not for each of the plurality of nozzles 2a.

Figure 6A:
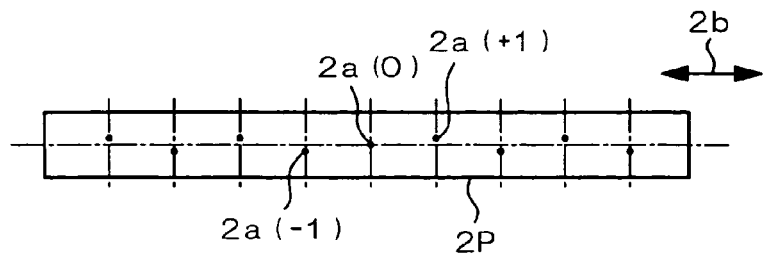
FIGS. 6(a) and 6(b) illustrate a nozzle arrangement for implementing a film-forming method.
Figure 6B:
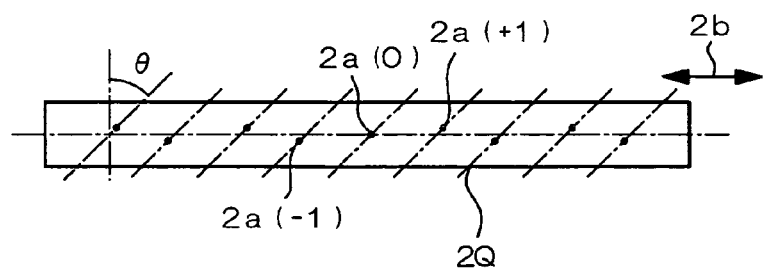

Further, as in the liquid drop supplying means 2P shown in FIG. 6(a), an aspect of correcting the position of nozzles 2a may be considered in which the positions of the nozzles 2a(+1) and 2a(−1) at both sides of a certain nozzle 2a(0) are corrected to deviate from their original positions to the direction perpendicular to the arrangement direction 2b of nozzles, and they are finally placed at the aforementioned optimum positions of nozzles. In addition, as in the liquid drop supplying means 2Q shown in FIG. 6(b), another aspect of correcting the position of nozzles 2a may be considered in which an angle of inclination θ corresponding to a planar periodic pattern 1p with respect to the original positions of nozzles is obtained and the positions of the nozzles are inclined to make an angle intersecting the arrangement direction 2b equal to the angle of inclination θ.

Instead of correcting the positions of nozzles 2a as described above, it may be possible to respectively delay the liquid drop supplying timings of nozzle 2a(2) or nozzle 2a(3) as much as δt=δx/Vx and 2δt=2δx/Vx in comparison with the liquid drop supplying timing of the nozzle 2a(1) shown in FIG. 4. In this case, it is necessary to independently control the discharge of the liquid drop at each nozzle. The structure illustrated in FIG. 5 can be employed as the liquid drop supplying means 2″. In this case, the remainder value Sx is used to set the difference in the supplying timings between nozzles 2a to δts=Sx/Vx=(δx−m·Rx)/Vx (or =(2δt−m·Rx)/Vx) instead of δt, 2δt. In this case, the natural number m is a natural number to satisfy (m−1)·Rx<δx<m·Rx, or, m·Rx<δx<(m+1)·Rx (or, (m−1)·Rx<2δx<m·Rx, or, m·Rx<2δx<(m+1)·Rx). The aforementioned methods make it possible to minimize time differences in the liquid drop supplying timings among a plurality of nozzles.

Figure 8:
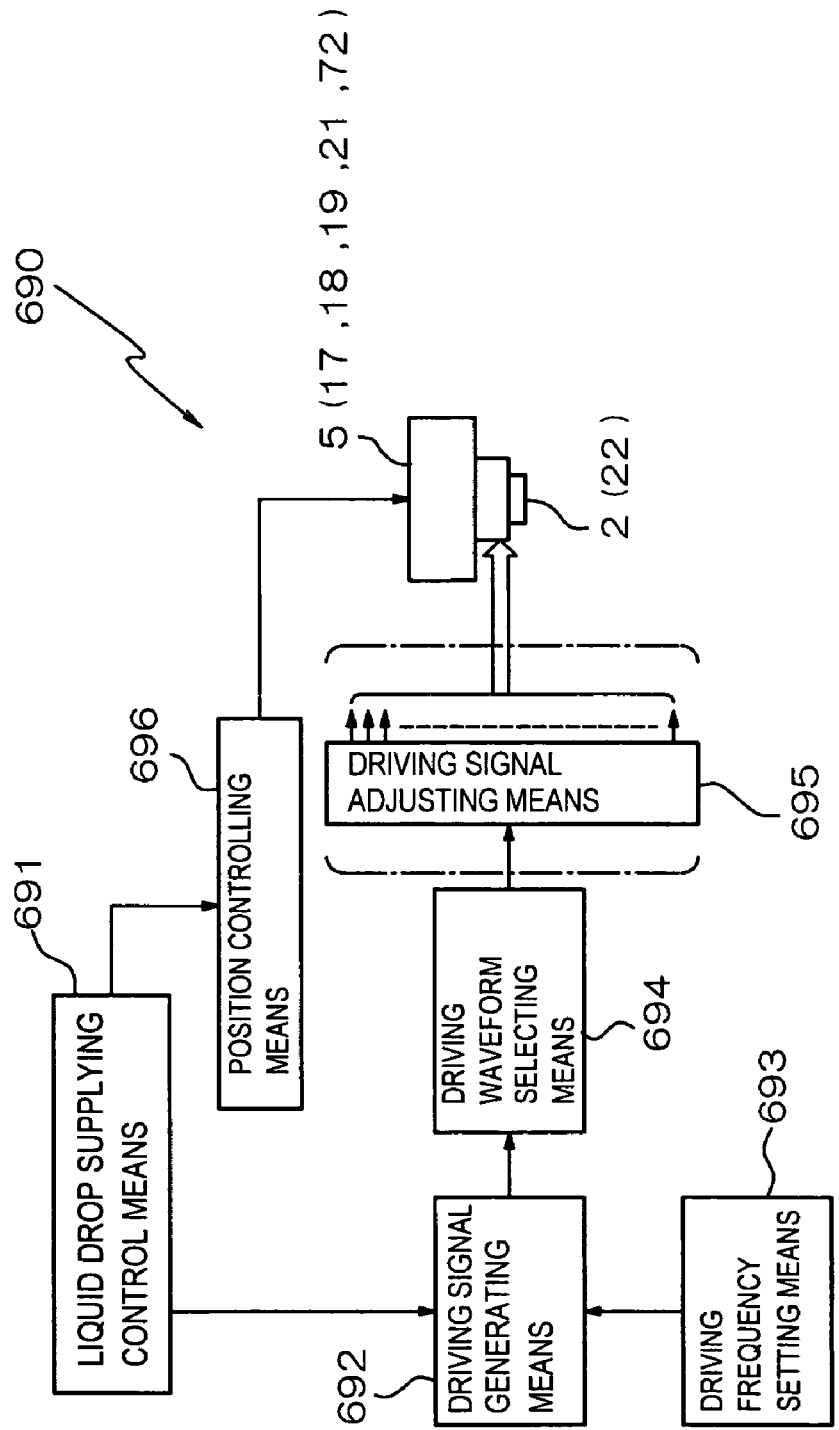
FIG. 8 is a block view illustrating the structure of a drawing control unit.
Figure 9:
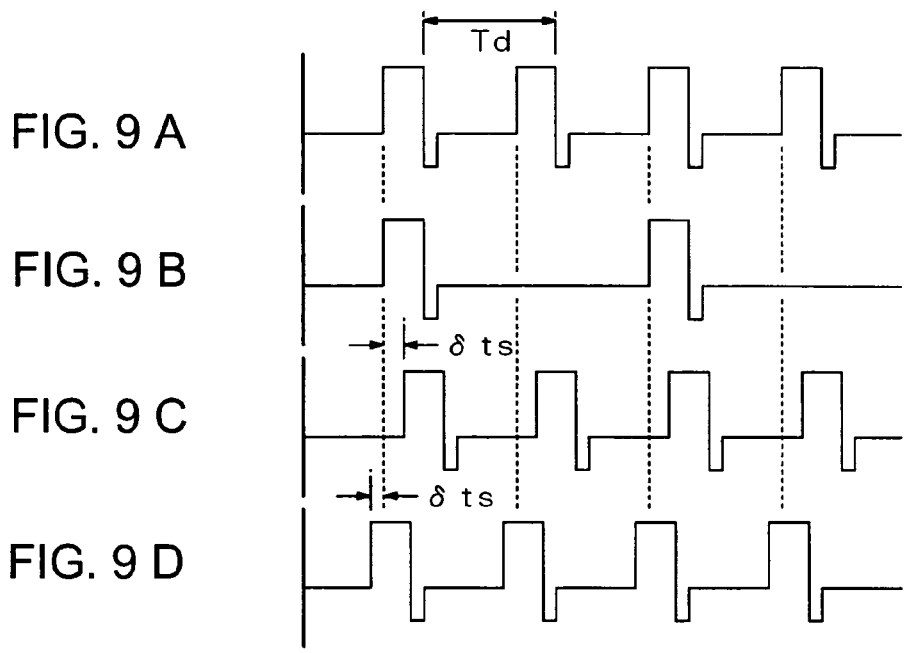
FIGS. 9(a) to 9(d) are timing charts illustrating driving signals of a liquid drop supplying means.

FIG. 8 is a block diagram illustrating the drawing operation unit 690 with a different structure. Function implementing means of the drawing operation unit 690 includes a liquid drop supplying control means 691 for controlling discharge of the liquid drop as a whole, driving signal generating means 692 for generating a driving signal having a predetermined driving frequency Fd (driving period Td) under the control of the liquid drop supplying control means 691, driving frequency setting means 693 for setting a driving frequency Fd or driving period Td of the driving signal generating means 692, and driving waveform selecting means 694 for selecting a driving waveform of a driving signal outputted from the driving signal generating means. A predetermined driving signal 3a shown in FIG. 9(a) is outputted by the driving waveform selecting means 694.

The driving frequency setting means 693 can set the driving frequency Fd (or driving period Td) of the driving signal generating means 692. Then, the driving frequency Fd is set to adjust the resolution Rx=Td×Vx to an appropriate value. Therefore, without a change in the scanning speed Vx, the resolution Rx can be modified or adjusted so as to make the liquid drop supplying positions of the scanning direction X uniform and improve a film-forming quality without deteriorating the manufacturing efficiency.

Besides, position controlling means 696 is provided that is controlled by the liquid drop supplying controlling means 691. The position controlling means 696 controls and drives driving mechanism 5 (equivalent to the head position control unit 17, substrate position control unit 18, scan driving device 19, feed driving unit 21, head driving circuit 72) that operates the liquid drop supplying means 2 (equivalent to the liquid drop supplying head 22) or the object 1.

In the present embodiment, driving signal adjusting means 695 is provided to supply a different driving signal 3a to each of the plurality of nozzles shown in FIG. 5. The driving signal adjusting means 695 forms independent driving signals having driving waveforms for driving periods respectively necessary at each plurality of nozzles on the basis of the driving waveforms (see FIG. 9(a)) outputted from the driving waveform selecting means 694. For example, as shown in FIG. 9(b), individual driving signals determine whether a driving waveform will be formed or not at a certain driving period Td at each nozzle. In addition, if only a single driving signal is needed, the driving signal adjusting means 695 is not required.

As shown in FIG. 9(c) or (d), the aforementioned driving signals may have a phase difference as great as the time difference of the supplying timings δts with respect to the driving signal (a) or (b) corresponding to a reference nozzle. Further, it is possible to delay the liquid drop supplying timings among nozzles correspondingly to the time difference δts. Thus, a plurality of driving signals having the aforementioned time difference at the driving period is applied to liquid drop supplying structures 2A respectively provided at the plurality of nozzles 2a. As a result, it is possible to restrict irregularity in liquid drop supplying positions between the regions P in the feeding direction Y according to the aforementioned principle.

Embodiment

Figure 7:
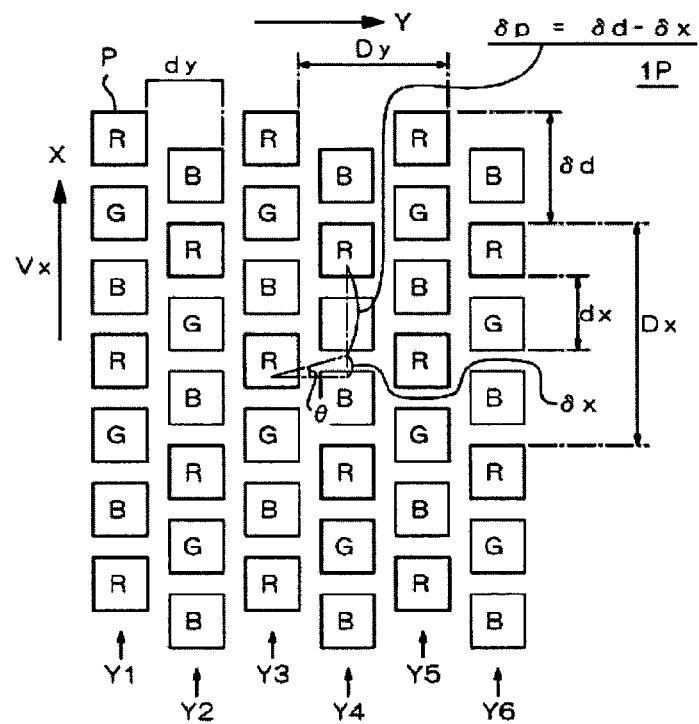
FIG. 7 is a plan view illustrating a planar periodic pattern of a delta arrangement.

Next, more specific embodiments corresponding to the aforementioned description will be described below. FIG. 7 illustrates a planar periodic pattern (color pattern) 1P' referred to as a delta arrangement. A specific embodiment of the planar periodic pattern 1P' may include an arrangement pattern of filter elements of a color filter or an arrangement pattern in a light emitting area of an EL device, which will be described below. One of a plurality of types of color elements R, G, B is formed in a plurality of regions P arranged in the planar periodic pattern 1P'. In this case, a structural period as seen from the scanning direction X in the planar periodic pattern 1P' is classified into a small structural period dx, when the regions P of all the color elements R, G, B are regarded as an identical structural unit, and into a large structural period Dx when the color elements R, G, B are respectively regarded as a different structural unit. Similarly to this, a structural period as seen from the feeding direction Y in the planar periodic pattern 1P' is classified into a small structural period dy, when the regions P of all the color elements R, G, B are regarded as an identical structural unit, and into a large structural period Dy when the color elements R, G, B is respectively regarded as a different structural element.

In the present embodiment, different liquid drop supplying means 2R, 2G, 2B are respectively utilized for color elements R, G, B in case of the planar periodic pattern 1P' having the aforementioned delta arrangement. If attention is paid to only one of those color elements R, G, B, it is possible to perform a film-forming method similar to that described above while the planar periodic pattern 1P' is regarded as a planar periodic structure in which only a region P having only one type color element (for example, R) with structural periods Dx, Dy arranged.

In addition, the planar periodic pattern 1P' having the delta arrangement is different from the one shown in FIGS. 1 to 3 which has a positional relationship among rows Y1 to Y6 of regions P arranged in the scanning direction X. In other words, there are two different positions as seen from the direction perpendicular to the scanning direction X, that is, the feeding direction Y, in the planar periodic pattern 1P'. For example, there exists a half period in periodicity of the scanning direction X, that is, a phase difference equivalent to half (πrad(180 degrees)) a structural period Dx. This is completely similar to a case when attention is paid to a region P of a color element R. Accordingly, as shown in FIGS. 1 to 3, in the case that the periodicity of the scanning direction X has the same phase for all the rows Y1 to Y5 as the relationship of the liquid drop supplying positions between rows, the film-forming process can be carried out similarly to the above description by delaying the nozzle positions as much as half a periodicity in the scanning direction X, by changing the driving period to discharge a liquid drop as much as the phase difference (half a period) of the structural period Dx, or by adjusting the liquid drop supplying timing as much as the phase difference.

In other words, when a description is made about the planar periodic structure 1P, there is no phase difference in the periodicity of the scanning direction among adjacent rows. Therefore, it is necessary to consider only a deviation δx in nozzle positions. However, in the planar periodic pattern 1P', there exists a phase difference δd (=0.5Dx) in the periodicity of the scanning direction among neighboring rows. Thus, it is necessary to obtain a difference δp (=δd−δx) between the positional deviation δx of nozzles and the phase difference Ad. Then, it is possible to eliminate a change in the liquid drop supplying positions among rows by making the difference δp 0 or natural number times resolution Rx, by correcting the nozzle positions, or delaying the liquid drop supplying timing among nozzles, similarly to the above description.

Next, a film-forming process is actually carried out using the film-forming unit 16 to the planar periodic pattern 1P' described in FIG. 7. In this case, it is possible to respectively apply the aforementioned film-forming method to color elements R, G, B. However, the film-forming method may be applied to only one or two color elements. If the film-forming method is applied to only one of the color elements, it is preferable that the film-forming method is used particularly for only a color element B (blue). This is because the color or brightness irregularity due to unevenness of a formed film may be easily noticeable in the color element B (blue) in comparison with the other color element R (red) or G (green).

Figure 10:
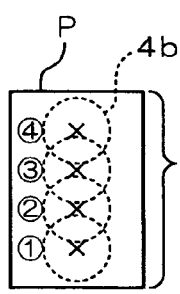
FIG. 10 illustrates positions of supplying liquid drops to regions.

In that case, in the delta arrangement of the planar periodic pattern 1P', a small structural period dx of the scanning direction X, a small structural period dy of the feeding direction Y, a gap as seen from the scanning direction X between neighboring regions P and a gap as seen from feeding direction Y are respectively set to 114 μm, 116 μm, 16 μm and 27 μm. The number of nozzles in the nozzle row is one hundred eighty, the nozzle pitch is 141.11 μm, and the angle of inclination θ is 34.7 degrees. As shown in FIG. 10, liquid drops of four dots are injected at one-time scanning process, and scanning processes are performed four times, thereby injecting liquid drops of a total of sixteen dots. In general, the number of liquid drops to be injected during one scanning process and the number of scanning processes (number of passes) are respectively indicated as j and k, so that a total of liquid drops L=j×k can be injected.

The amount of the liquid material to be included in a liquid drop is 8 to 10 ng, and the scanning speed Vx is 80 mm/second. The driving frequency Fd of the liquid drop supplying means 2 in the present embodiment is 13.3 kHz (that is, the driving period Td is 75.188 microseconds), and the relevant resolution Rx is 6 μm. At this time, the structural period Dx of the scanning direction X is 342 am, which is divided by the resolution 6 μm to lead to a natural number of 57 for quotient with no remainder. The embodiment is made by the film-forming method with the aforementioned parameters.

Besides, the resolution Rx is 4 μm, and other conditions are made the same. At this time, similarly to the above description, if the structural period Dx of the scanning direction X is divided by the resolution Rx, the quotient is not a natural number that is divisible. A film-forming method performed with the aforementioned parameters is a comparative example 1.

Moreover, even when the resolution Rx is 8 μm and other parameters are made the same, the structural period Dx of the scanning direction X is not divided by the resolution Rx. The film-forming method performed with the aforementioned parameters is a comparative example 2.

In addition, the above embodiment and comparative examples 1 and 2 are all performed by the method in which there is no compensation for deviation in liquid drop supplying positions among regions arranged in the feeding direction Y.

Figure 11:
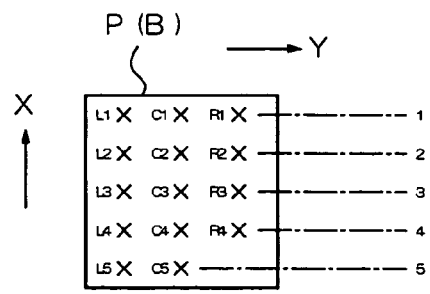
FIG. 11(a) illustrates measurement points of regions.
FIGS. 11(b) and 11(c) are brightness graphs of the measurement points.
Figure 11:
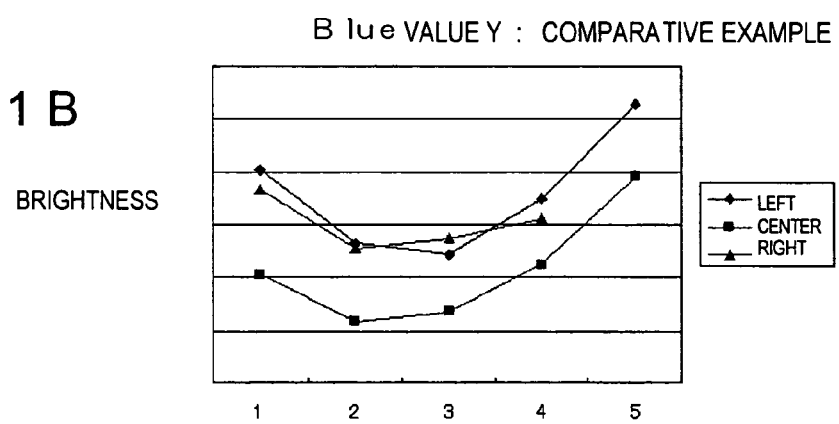
Figure 11:
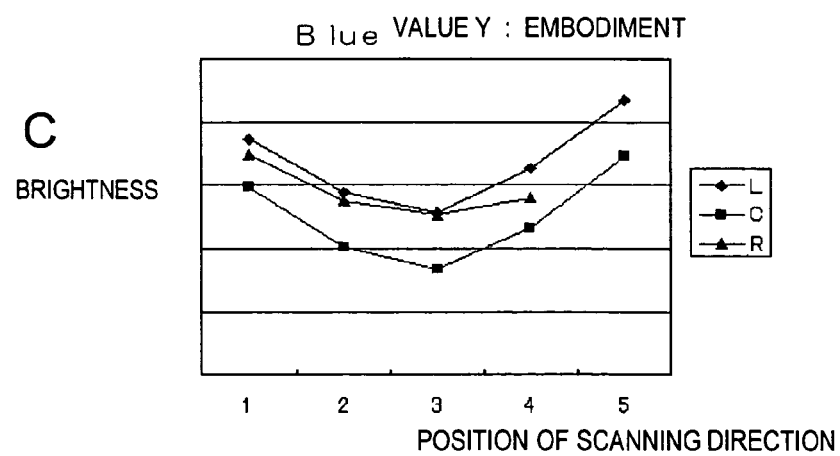

FIG. 11 illustrates a measurement result for brightness distribution inside a region P(B) of the corresponding color element B when the film-forming method is performed to the region P of color element B (blue) in the comparative example 2 and the embodiment. FIG. 11(*a*) illustrates the inside of a region P(B) consisting of fourteen measurement points whose interval is set to around 20 μm. Besides, FIG. 11(*b*) illustrates the distribution of brightness Y at the measurement points of the region P(B) in the comparative example 2. FIG. 11(*c*) illustrates the distribution of brightness Y at the measurement points of the region P(B) in the embodiment. In this case, reference numerals 1 to 5 indicate five measurement positions as seen from the scanning direction, and there are three measurement points, i.e., left (L), center (C), and right (R), or two measurement points with respect to the measurement positions 1 to 5 as seen from the scanning direction.

As shown in the graph, the irregularity in the brightness Y of respective measurement points gets much smaller in the region P of the embodiment than in the comparative example 2. Therefore, it is possible to obtain a more uniform and flatter state of a film in the embodiment than in the comparative example 2.

Figure 12:
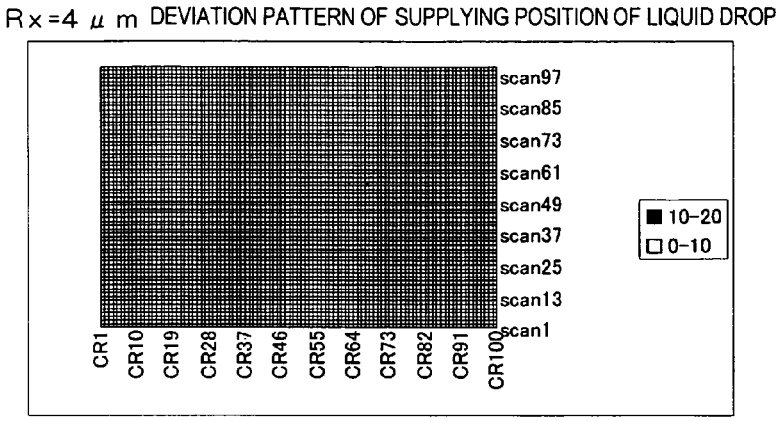
FIG. 12(a) shows a deviation pattern of liquid drop supplying positions in a comparative example 1.
FIG. 12(b) is a graph showing a positional deviation of the scanning direction in the comparative example 1.
FIG. 12(c) is a graph showing a positional deviation of the feeding direction in the comparative example 1.
Figure 12:
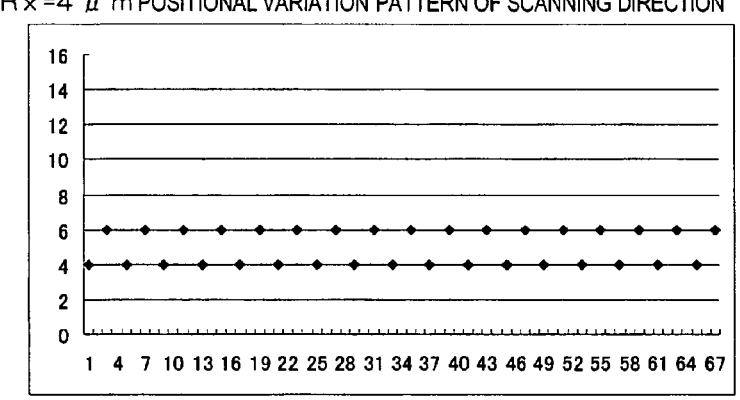
Figure 12:
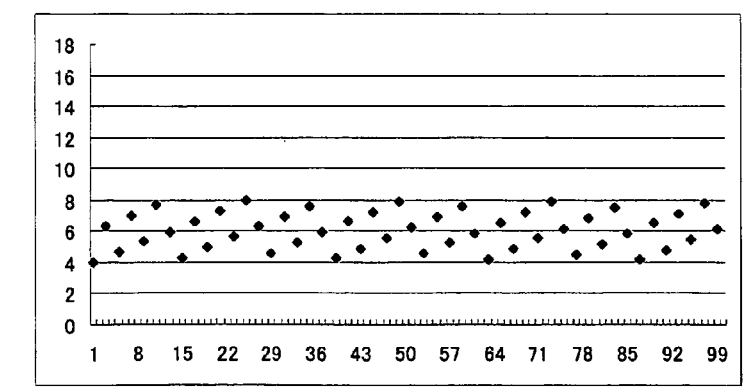
Figure 13:
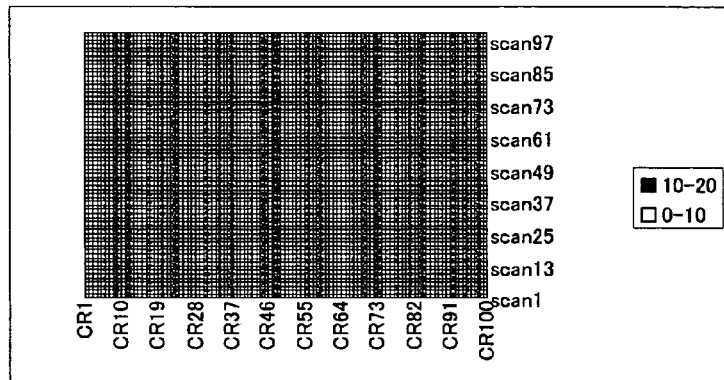
FIG. 13(a) shows a deviation pattern of liquid drop supplying positions in an embodiment.
FIG. 13(b) is a graph showing a positional deviation of the scanning direction in the embodiment.
FIG. 13(c) is a graph showing a positional deviation of the feeding direction in the embodiment.
Figure 13:
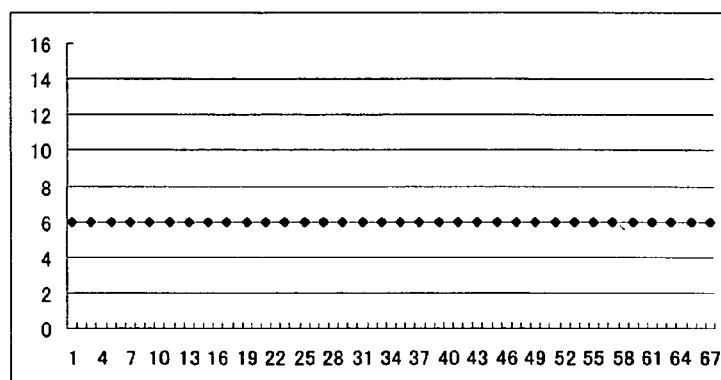
Figure 13:
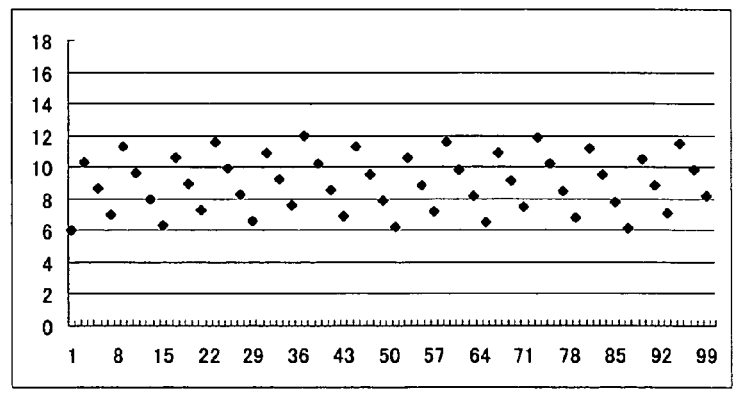
Figure 14:
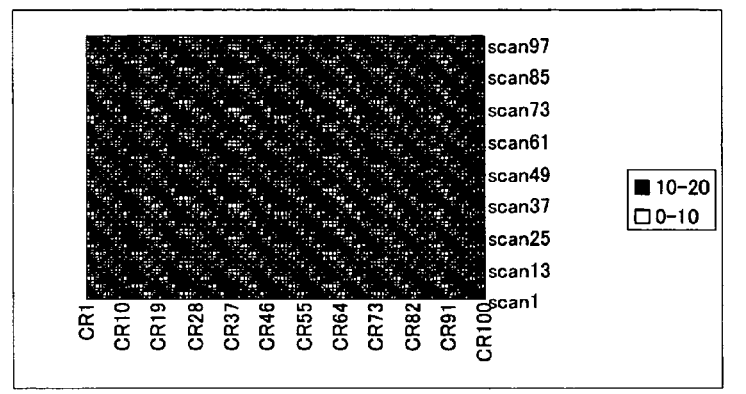
FIG. 14(a) shows a deviation pattern of liquid drop supplying positions in a comparative example 2.
FIG. 14(b) is a graph showing a positional deviation of the scanning direction in the comparative example 2.
FIG. 14(c) is a graph showing a positional deviation of the feeding direction in the comparative example.
Figure 14:
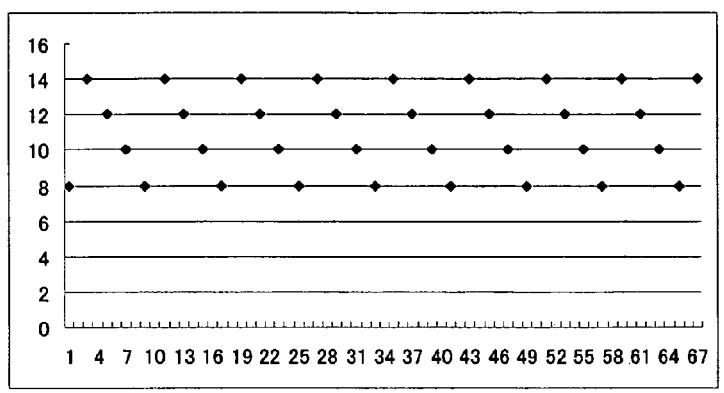
Figure 14:
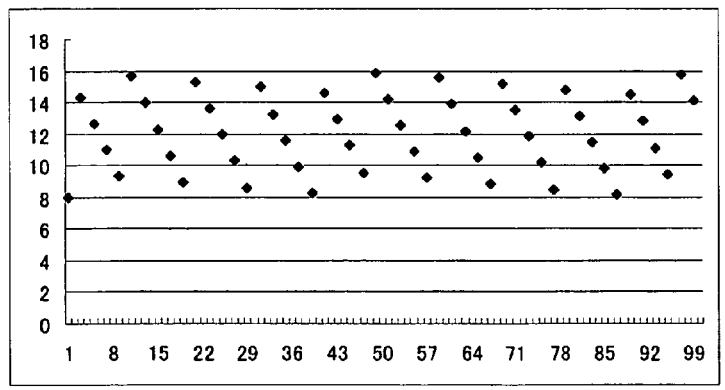

Next, FIG. 12 illustrates a result test-calculating a positional deviation in supplying positions of liquid drops in the comparative example 1. FIG. 13 illustrates a result test-calculating a positional deviation in supplying positions of liquid drops in the embodiment. FIG. 14 illustrates a result test-calculating a positional deviation in supplying positions of liquid drops in comparative example 2. Such data illustrates positions of the scanning direction X of liquid drops discharged toward the supplying position ④ on the side of the scanning direction X among four liquid drop supplying positions ① to ④ shown in FIG. 10, at the first scanning time. In the drawings, (A) designates a plane pattern of the positional deviations, and the vertical and horizontal directions are respectively designated as the scanning direction X and feeding direction Y. The positions having a large positional deviation (10 to 20 μm) are indicated in black, but the ones having a small positional deviation (less than 10 μm) is indicated in white. In addition, in the drawings, (B) plots a position variation pattern for the regions P arranged in the scanning direction, and (C) plots a position variation pattern for the regions P arranged in the feeding direction.

Since no film-forming method compensates deviation in the positions of liquid drops in the feeding direction Y, there is a periodicity (irregularity in film formation) of feeding direction Y in any method. However, there is no deviation in the liquid drop supplying positions of the scanning direction in the embodiment. On the other hand, in the comparative example 1, the liquid drop supplying positions of scanning direction X change periodically with a small variation margin. In the comparative example 2, the variation margin of the liquid drop supplying position of the scanning direction is 14 μm, which is a great change. Accordingly, compared with the embodiment where there is almost no irregularity in film formation in the scanning direction, there is a great irregularity in film formation in the scanning direction X in the comparative examples 1, 2.

In the planar periodic structures (planar periodic patterns) 1P, 1P' formed using the film-forming method and the film-forming apparatus of the present embodiment, the state (thickness or density distribution) of a film formed at respective regions P as seen at least from a predetermined direction (scanning direction X) is uniform. As a result, there is no conventional periodic variation in the state of a formed film. Therefore, even in the planar periodic structure in which about several to tens micrometers of tiny regions are arranged, an observation is made with an enlarged visual field. Thus, it is possible to easily confirm that a high quality control is made to the state of the formed film.

Color Filter and its Manufacturing Method

Figure 27:
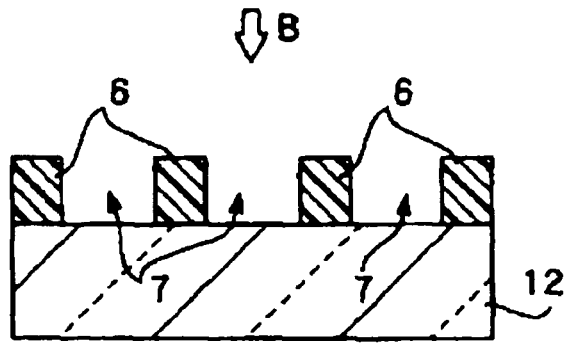
FIGS. 27(a) and 27(d) are sectional views illustrating the processes of manufacturing a color filter substrate.
Figure 27:
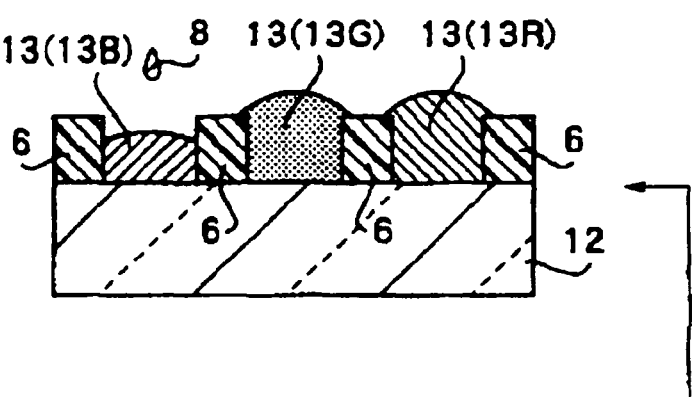
Figure 27:
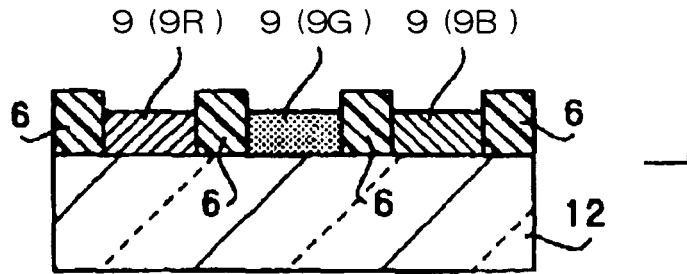
Figure 27:
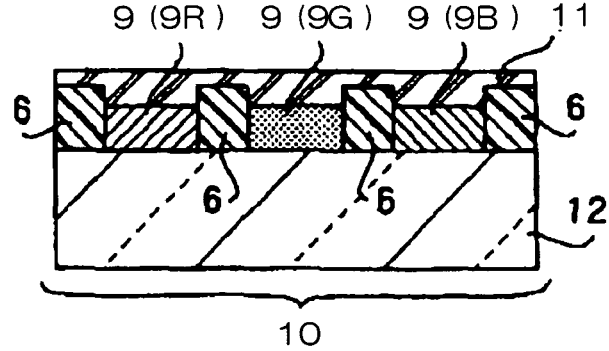

Next, a description will be made about an embodiment of a method for manufacturing a color filter substrate according to the present invention. In this embodiment, a method for manufacturing a color filter substrate using the film-forming apparatus 16 is described, but the method is not limited by the structure of an apparatus used for manufacturing the color filter substrate. FIG. 27 includes sectional views (a) to (d) for illustrating the manufacturing processes of a color filter substrate 2. The color filter substrate includes a color filter formed on the substrate 12. Besides, it is preferable that the substrate 12 is a large area of a mother substrate including a plurality of color filters 1 arranged in the vertical and horizontal directions similarly to a mother substrate 301 shown in FIG. 29(a).

As shown in FIG. 27(d), a color filter substrate 10 of the present embodiment includes a plurality of filter elements 9 arranged in a dot pattern (dot matrix) on the surface of, for example, a square substrate (base material) 12 made of glass or plastic. Besides, a protective film 11 is laminated on the surfaces of the filter elements 9 in the color filter substrate 10.

Figure 37:
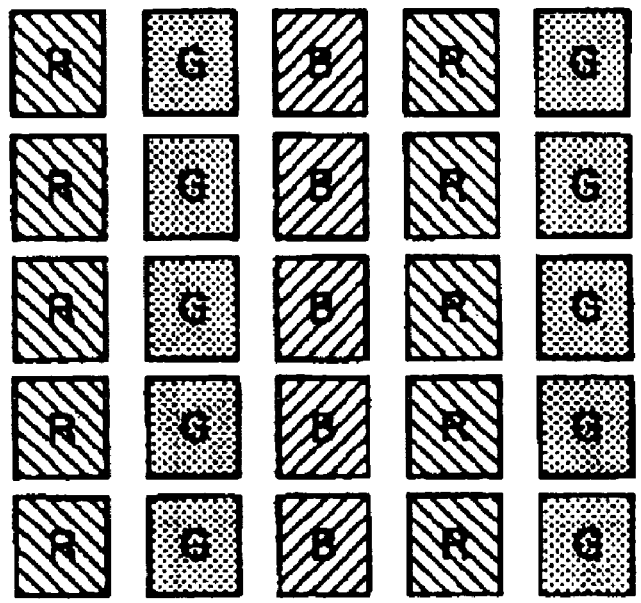
FIGS. 37(a) and 37(b) are plan views illustrating arrangement patterns of color filters.
Figure 37:
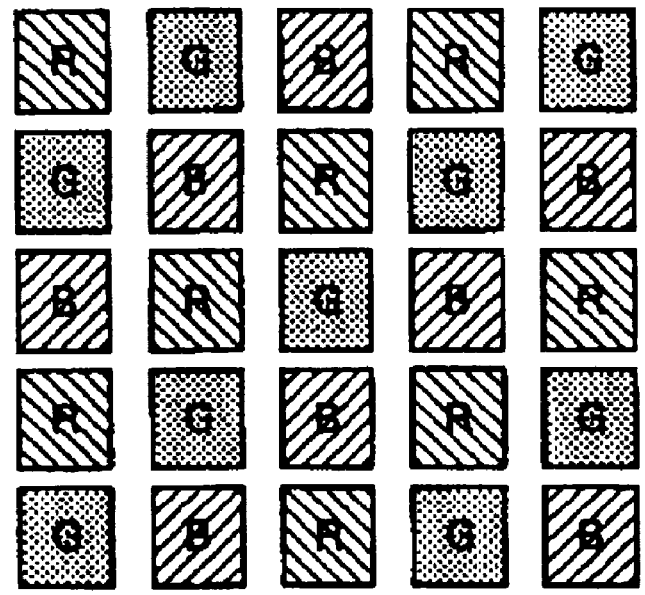

In the color filter substrate 10, a latticed pattern of partition wall 6 made of resin material having no light transmissivity is formed on the surface of the substrate 12, square regions 7 are divided by the partition wall 6, and filter elements 9 are formed by filling the regions 7 with color materials. Such filter elements 9 are respectively formed from any one of the color materials, R (red), G (green), B (blue), and the filter elements 9R, 9G, 9G of the respective colors are arranged in a predetermined arrangement. The arrangement of the filter elements include, for example, a stripe arrangement (an arrangement in which all the vertically arranged rows of filter elements in the matrix are identically colored) shown in FIG. 37(a), and a mosaic arrangement (an arrangement in which three arbitrary filter elements linearly arranged in the vertical and horizontal directions have three colors R, G, and B) shown in FIG. 37(c) in addition to the delta arrangement (an arrangement in which filter elements are arranged in steps and three arbitrary adjacent filter elements have three colors R, G, and B) shown in FIG. 7). Besides, 'partition wall' in the present invention includes the meaning of 'bank', so that the use of the word is not limited to a side face almost perpendicular to the substrate, but also includes an angled side face and a protruded portion as seen from the substrate.

Besides, the dimension of one filter element 9 of the color filter substrate 10 is, for example, 30×100 μm. The gap between adjacent filter elements 9, that is, the pitch between neighboring elements is, for example, 75 μm.

When the color filter substrate 10 of the present embodiment is utilized as an optical element for color display (full-color display), a pixel is constructed with three filter elements 9 of R, G, and B in a unit. The color display is made by selectively transmitting light with an individual color filter element or in combination of three color filter elements within a single pixel. At this time, the partition wall 6 made of resin material having no light transmissivity can be constructed to function as a black mask.

When a plurality of color filters are formed on the large area of a mother substrate, the mother substrate is cut and separated to form an individual color filter substrate 10. Specifically, a pattern for one color filter is formed on the surface of each of a plurality of color filter forming regions (unit region) set in the mother substrate. Then, scribed grooves are formed around such color filter forming regions, and stress is applied along the grooves to divide (break) the mother substrate, thereby forming each color filter substrate 10.

Next, the aforementioned method for manufacturing the color filter substrate 10 will be described in detail. As shown in FIG. 27(a), partition wall 6 is made of a resin material having no light transmissivity on the surface of the substrate 12 in a latticed pattern as seen from arrow B. The holes of the latticed pattern correspond to regions 7 for forming filter elements 9, that is, filter element forming regions. The plane dimension (as seen from arrow B) of individual regions 7 formed by the partition wall 6 is, for example, about 30 μm×100 μm.

The partition wall 6 has a function to block the flow of filter element material 13 that is the liquid material to be supplied to regions 7 and a function serving as a black mask to block light from being transmitted between regions 7. The partition wall 6 is formed by a patterning method, for example, a photolithographic method, and, if necessary, the partition wall 6 is baked by heating with a heater.

As shown in FIG. 27(b), after formation of the partition wall 6, liquid drops 8 of filter element materials 13 are supplied to respective regions 7 to bury the regions 7 with filter element materials 13. For example, this burying process is performed by discharging liquid drops 8 from the liquid drop supplying head 22 of the aforementioned film-forming apparatus 16 and depositing the liquid drops 8 inside the regions 7. In FIG. 27(b), reference numerals 13R, 13G, 13B respectively indicate filter element materials of different colors, red (R), green (G), and blue (B).

When the respective regions 7a are filled with a predetermined amount of filter element materials 13, the solvent of the filter element materials 13 is evaporated by heating up to, for example, about 70° C. with a heater. As shown in FIG. 27(c), such a vaporization results in a decrease in the volume of the filter element materials 13, thereby leading to planarization. When there is a remarkable reduction in volume, the process of supplying liquid drops 8 of filter element materials 13 and that of heating liquid drops 8 are repeatedly carried out until the thickness of a film enough for a color filter is obtained. Through the aforementioned processes, only solid content of the filter element materials 13 finally remains to be a film, so that respective filter elements 9 of desired colors turn into a complete film.

After the filter elements 9 are formed, a heating process can be performed at a predetermined temperature level for a predetermined period of time to completely dry the filter elements 9. Then, a protective film 11 is additionally formed by any appropriate method such as a spin coating method, a roll coating method, a dipping method, or an ink jet method. The protective film 11 is formed for protection of the filter elements 9 and for planarization of the surface of the color filter substrate 10. In addition, in the present embodiment, the resin of the partition wall 6 has no light transmissivity and used for a light shielding function (black matrix). However, if the partition wall 6 is made of resin material having light transmissivity, a light shielding layer made of metal such as Cr in a size further bigger than the resin may be formed under the resin.

As shown in FIG. 27(b), the filter element material 13 of the present embodiment is ink, and the liquid drop 8 of the ink is deposited to respective regions 7 by the film-forming apparatus 16 to thereby form filter elements 9. At this time, three types of filter element materials 13R, 13G, 13B to form the three colors of filter elements 9 (9R, 9G, 9B) are discharged to the substrate 12 (mother substrate) while the liquid drop supplying head 22 is relatively scanned in the scanning direction X. The method of repeatedly performing the scanning and feeding processes one after another is the same as what has been described in relation to the film-forming apparatus 16, and the method for controlling the liquid drop supplying positions in the present embodiment is the same as what has been described in the aforementioned film-forming method.

A display device having a color filter and a method for manufacturing the same

Figure 23:
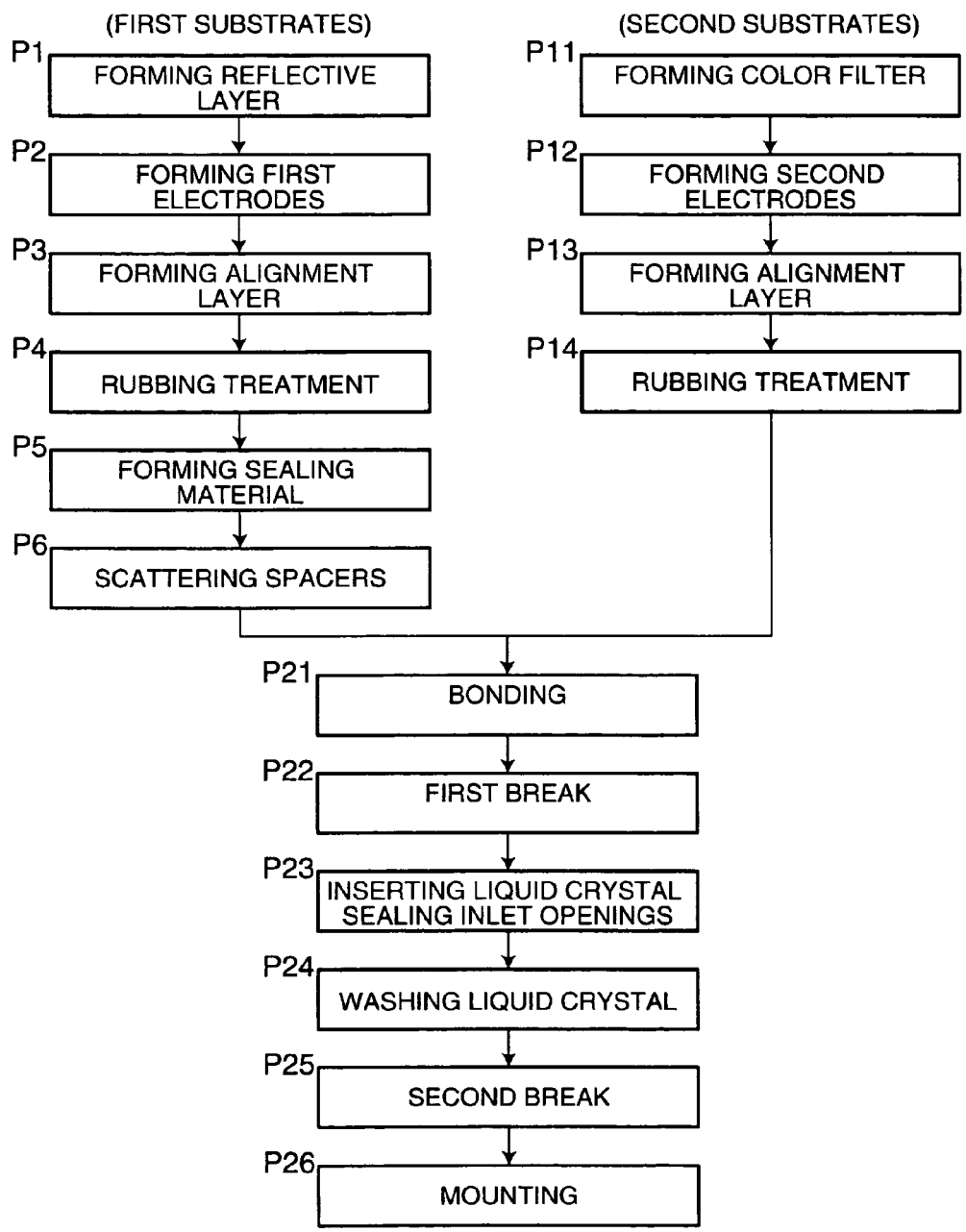
FIG. 23 is a schematic flowchart illustrating the processes of manufacturing a liquid crystal device.
Figure 24:
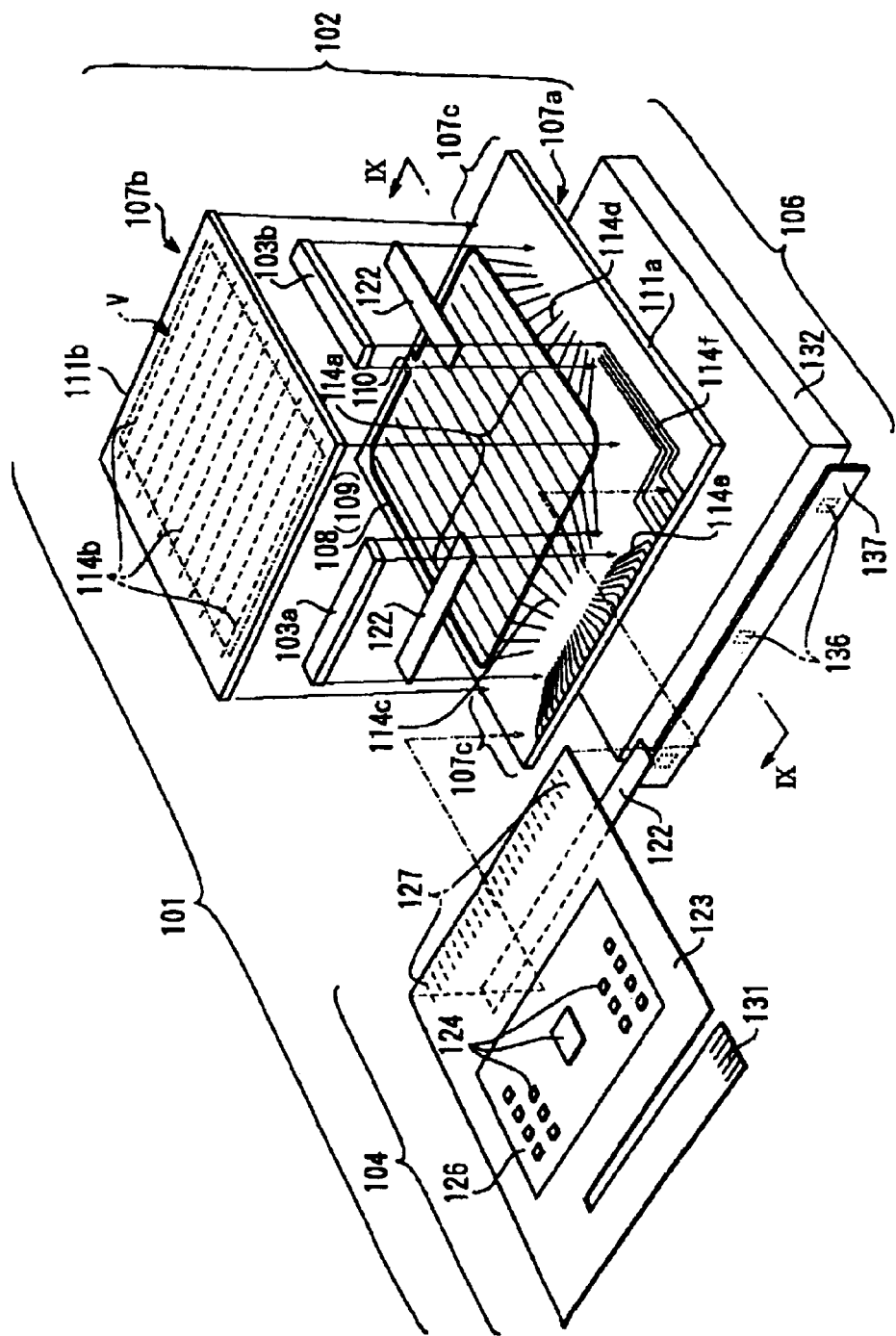
FIG. 24 is an exploded perspective view of the liquid crystal device.
Figure 25:
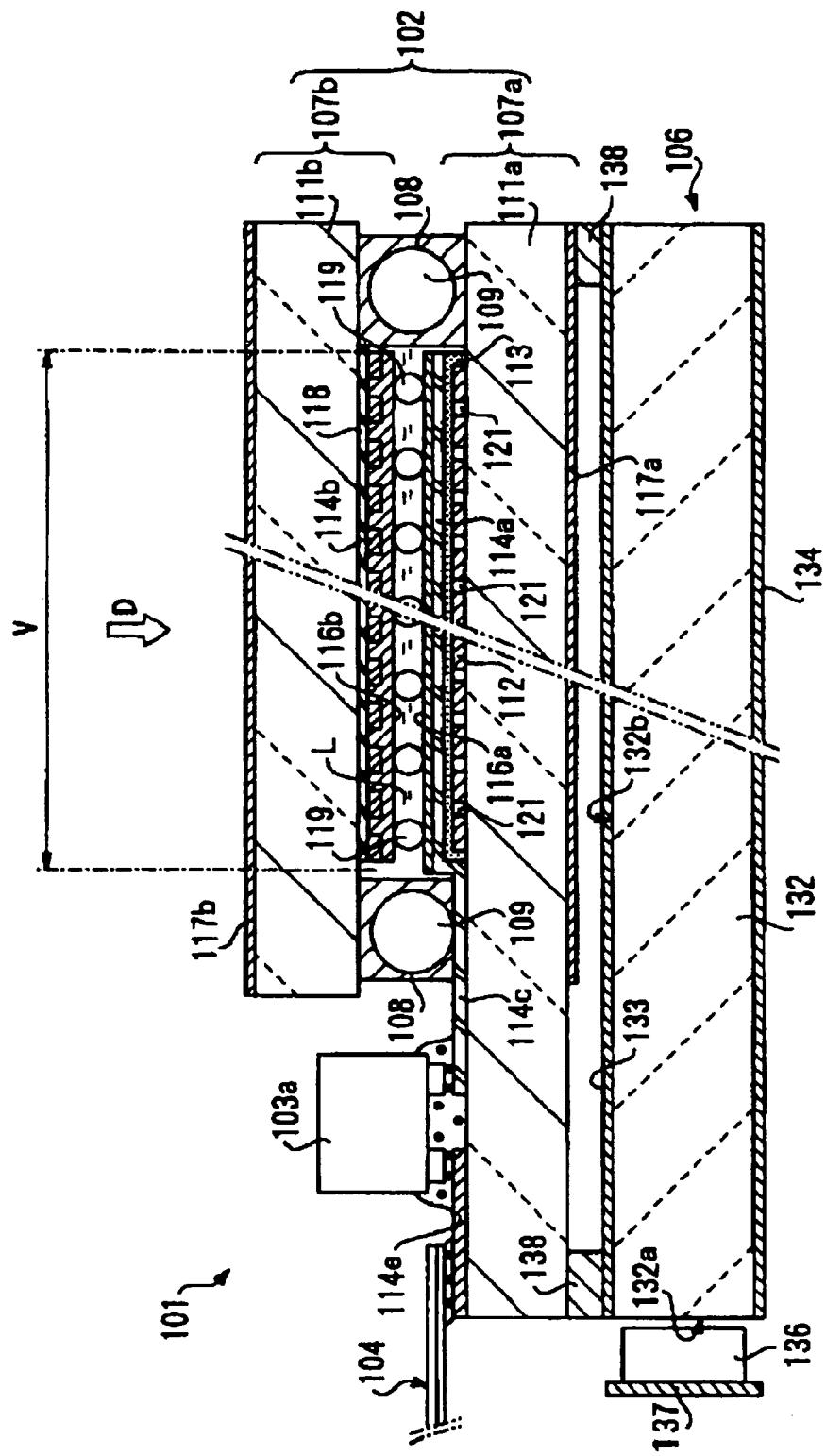
FIG. 25 is a longitudinal sectional view of the liquid crystal device cut along line IX-IX of FIG. 24.

FIG. 23 illustrates an embodiment of a method for manufacturing a liquid crystal device as an example of the method for manufacturing a display device (electro-optical device) according to the present invention. Besides, FIG. 24 illustrates an embodiment of a liquid crystal device 101 as an example of a display device (electro-optical device), which is manufactured according to the manufacturing method. FIG. 25 illustrates a sectional structure of the liquid crystal device 101 taken along line IX-IX of FIG. 24. First, the structure of the liquid crystal device 101 will be described with reference to FIGS. 24 and 25. Besides, the liquid crystal apparatus 101 is a transflective liquid crystal device performing full color display in a simple matrix method.

As shown in FIG. 24, the liquid crystal device 101 has a liquid crystal driving IC 103a and a liquid crystal driving IC 103b composed of semiconductor chips mounted on a liquid crystal panel 102 and a flexible print circuit 104 as a wiring connecting element connected to the liquid crystal panel 102. The liquid crystal device 101 is constructed by additionally providing an illuminating device 106 as a backlight on the backside of the liquid panel 102.

The liquid crystal panel 102 is formed by bonding first and second substrates 107a, 107b to each other with a sealing material 108. The sealing material 108 is formed, for example, by attaching an epoxy-type resin to the inner surface of the first substrate 107a or the second substrate 107b in a loop shape (a frame shape) by screen printing or the like. In addition, as shown in FIG. 25, a spherical or cylindrical electric conductive material 109 is dispersed inside the sealing material 108.

As shown in FIG. 25, the first substrate 107a includes a plate-shaped base member 111a formed of transparent glass or plastic. A reflecting film 112 is formed on the inner surface (the upper surface in FIG. 25) of the base member 111a. Besides, an insulating film 113 is laminated on the reflecting film 112. First electrodes 114a are formed on the insulating film 113 in a stripe shape (refer to FIG. 24) as seen from arrow D. Then, an alignment film 116a is formed on the first electrodes 114a. In addition, a polarizer 117a is mounted on the outer surface (lower surface in FIG. 25) of the base member 111a by attachment or the like.

In FIG. 24, a gap in the arrangement of the first electrodes 114a is drawn bigger than in practice for easy viewing. Therefore, more first electrodes 114a are mounted on the base member 111a in actuality than those drawn and seen in the drawing.

As shown in FIG. 25, the second substrate 107b includes a plate-shaped base member 111b formed of transparent glass or plastic. A color filter 118 is formed on the inner surface (the lower surface in FIG. 25) of the base member 111b. Second electrodes 114b are formed perpendicular to the first electrodes 114a in a stripe shape (refer to FIG. 24) as seen from arrow D. Then, an alignment film 116b is formed on the second electrodes 114b. In addition, a polarizer 117b is mounted on the outer surface of the base member 111b (the upper surface in FIG. 25) by pasting or the like.

In FIG. 24, a gap in the arrangement of the second electrodes 114b is drawn bigger than in practice for easy viewing like in the first electrodes. Therefore, more second electrodes 114b are mounted on the base member 111b in actuality than those drawn and seen in the drawing.

As shown in FIG. 25, liquid crystal L, for example, STN (super twisted nematic) liquid crystal, is encapsulated in a substrate gap, that is, a so-called cell gap of liquid crystal encapsulating region surrounded by the first and second substrates 107a, 107b and a sealing material 108. A plurality of tiny spherical spacers 119 are dispersed on the inner surface of the first and second substrates 107a, 107b. The presence of such spacers 119 in the cell gap keeps the cell gap uniform.

The first and second electrodes 114a and 114b are arranged to extend in a direction perpendicular to each other. The portions of the electrodes intersecting each other in a plane are arranged in a dot matrix as seen from the arrow D in FIG. 25. Each of the intersections arranged in the dot matrix constitutes a single display dot. The color filter 118 are constructed in an arrangement of a predetermined pattern, for example, a stripe arrangement, a delta arrangement, a mosaic arrangement or the like, when the respective color elements (filter elements) of red (R), green (G) and blue (B) are seen from the arrow D. Each display dot corresponds to each of the red, green and blue elements. One pixel consists of three colors of display dots.

The display dots arranged in a matrix are selectively turned on to display an image such as letters or figures on the external side of the second substrate 107b of the liquid crystal panel 102. The region where an image is displayed is an effective display area. The effective display area is designated by reference numeral V in FIGS. 24, 25.

As described in FIG. 25, the reflecting film 112 is made of a light reflective material such as APC alloy or aluminum. Openings 121 are formed in the reflecting film 112 at positions corresponding to respective display dots, that are the intersections of the first and second electrodes 114a, 114b. Therefore, the openings 121 are arranged in a matrix similarly to display dots as seen from the arrow D of FIG. 25.

For example, the first and second electrodes 114a, 114b are made of ITO (indium tin oxide) that is a transparent conductive material. Besides, the alignment films 116a, 116b are formed by attaching a uniformly thick of polyimide-based resin film. Such alignment films 116a, 116b are subjected to a rubbing process so as to determine an initial alignment of liquid crystal molecules on the surface of the first and second substrates 107a, 107b.

As shown in FIG. 24, the area of the first substrate 107a is made greater than that of the second substrate 107b. When these substrates are attached to each other with the sealing material 108, the first substrate 107a has a substrate protruded portion 107c protruded out of the second substrate 107b. In addition, a variety of wires such as a lead wire 114c extended out of the first electrode 114a, another wire 114d in electric connection with the second electrode 114*b* of the second substrate 107*b* through the electric connection material 109 (refer to FIG. 25) existing in the sealing material 108, a metal wire 114*e* connected to an input bump, i.e., an input terminal of the liquid crystal driving IC 103*a*, and another metal wire 114*f* connected to another input bump of the liquid crystal driving IC 103*b* are formed in a predetermined pattern on the substrate protruded portion 107*c*.

At this time, the lead wire 114*c* extending from the first electrode 114*a* and the lead wire 114*d* electrically connected to the second electrode 114*b* are made of the same material, ITO, as the electrodes 114*a*, 114*b*. Besides, the metal wires 114*e*, 114*f* that are input wires of the liquid crystal driving ICs 103*a*, 103*b* are made of a metal material having a low value of electric resistance, for example, APC alloy. The APC alloy is an alloy in which Ag is a main component and Pd and Cu are added thereto, for example, an alloy having a composition ratio of Ag: 98 wt %, Pd: 1 wt %, and Cu: 1 wt %.

The liquid crystal driving ICs 103*a*, 103*b* are mounted by bonding them on the surface of the substrate protruded portion 107*c* with ACF (anisotropic conductive film) 122. In other words, the present embodiment is a structure where a semiconductor chip is directly mounted on the substrate, a so-called COG (chip-on glass) type liquid crystal panel. In the COG type mounting structure, the input bumps of the liquid crystal driving IC 103*a*, 103*b* are electrically connected to the metal wires 114*e*, 114*f* by conductive particles included in the ACF 122, and the output bumps of the liquid crystal driving IC 103*a*, 103*b* are connected to the lead wires 114*c*, 114*d* by conductive particles included in the ACF 122.

In FIG. 24, FPC 104 includes a circuit 126 comprising a flexible resin film 123 and a chip component 124, and a metal wire terminal 127. The circuit 126 is directly mounted on the surface of the resin film 123 by welding or other conductive connection method. In addition, the metal wire terminal 127 is made of APC alloy, Cr, Cu or other conductive material. A part of FPC 104 in which the metal wire terminal 127 is formed is connected to a part of the first substrate 107*a* in which the metal wires 114*e*, 114*f* are formed with ACF 122. Further, the metal wires 114*e*, 114*f* of the substrates are electrically connected to the metal wire terminal 127 of FPC by conductive particles included in ACF 122.

An external connection terminal 131 is formed at the opposite edge of the FPC 104 and the external connection terminal 131 is connected to an external circuit, which is not shown here. The liquid crystal driving ICs 103*a*, 103*b* are driven on the basis of a signal transmitted from the external circuit to respectively supply a scanning signal and a data signal to one and the other sides of the first and second electrodes 114*a*, 114*b*. As a result, the display dots arranged in the effective display area V are individually voltage-controlled to thereby separately control the alignment of liquid crystal L.

As illustrated in FIG. 25, the illuminating device 106 in FIG. 24 includes a light guide 132 of acryl resin, a diffusive sheet 133 provided at the light emitting surface 132*b* of the light guide 132, a reflective sheet 134 provided opposite to the light emitting surface 132*b* of the light guide 132, and LED (light emitting diode) 136 as a light emitting source.

LED 136 is supported by an LED substrate 137, which is mounted to, for example, a supporting part (not shown) integrally formed with the light guide 132. The LED substrate 137 is mounted to the predetermined position of the supporting part, so that the LED 136 is placed at a position facing the light incident surface 132*a* that is a lateral edge face of the light guide 132. In addition, reference numeral 138 is a shock-absorbing member for absorbing an impact applied to the liquid crystal panel 102.

If LED 136 emits light, the light is introduced from the light incident surface 132*a*, and is guided to the inside of the light guide 132 and it is emitted from the light emitting surface 132*b* through the diffusive sheet 133 as plane light while the light is reflected and transmitted by the wall surface of the reflective sheet 134 or light guide 132.

In the liquid crystal device 101 described above, if an external light such as a solar light or a room light is sufficiently bright, the external light is introduced from the second substrate 107*b* of FIG. 25 into the liquid crystal panel 102, passed through liquid crystal L, reflected by the reflective film 112 and supplied to liquid crystal L again. The alignment of liquid crystal L is controlled according to the display dots of R, G, and B by the electrodes 114*a*, 114*b* between which the liquid crystal is interposed. Accordingly, the light supplied to liquid crystal L is modulated for every display dot. Then, this modulation allows the light to pass and not to pass through the polarizer 117*b* to display an image such as letters or figures on the external side of the liquid crystal panel 102, thereby performing reflective display.

On the other hand, if the amount of external light obtained is not enough, LED 136 emits light, plane light is then emitted from the light emitting surface 132*b* of the light guide 132, and the light is supplied to the liquid crystal L through the opening 121 formed in the reflective film 112. At this time, similarly to the reflective display, the supplied light is modulated for every display dot by the liquid crystal L whose alignment is controlled. Thus, it is possible to perform the transmissive display of displaying an image to the outside.

The liquid crystal apparatus 101 thus constructed is manufactured according to, for example, the method shown in FIG. 23. In the aforementioned manufacturing method, a series of processes P1 to P6 relate to formation of the first substrate 107*a*, and a series of processes P11 to P14 relate to formation of the second substrate 107*b*. In general, the first substrate forming processes and the second substrate forming processes are separately carried out.

First, in the first substrate forming processes, a reflective film 112 equivalent to a plurality of liquid crystal panels 102 is formed by the photolithographic method on the surface of the large mother substrate made of transparent glass or plastic. Besides, an insulating film 113 is formed on the reflective film 112 using a known film-forming method (process P1). Next, the photolithographic method is utilized to form the first electrodes 114*a*, lead wires 114*c*, 114*d* and metal wires 114*e*, 114*f* (process P2).

Thereafter, an alignment film 116*a* is formed on the first electrode 114*a* by coating or printing (process P3). Then, the alignment film 116*a* is subjected to a rubbing treatment to determine an initial alignment of liquid crystal (process P4). Next, the sealing material 108 is formed in a loop shape by, for example, screen printing (process P5), and then spherical spacers 119 are dispersed on the sealing material 108 (process P6). The aforementioned processes result in the first large mother substrate having a plurality of panel patterns on the first substrate 107*a* of the liquid crystal panel 102.

Aside from the processes of forming the first substrate, processes (processes P11 to P14 in FIG. 23) are performed to form a second substrate. First, a large original mother substrate, which is made of glass or plastic having light transitivity, is prepared, and a color filter 118 equivalent to a plurality of liquid crystal panels 102 is formed on the surface of the mother substrate (process P11). The process of forming the color filter 118 is performed using the method illustrated in FIG. 27. The color filter elements of R, G and B are performed using the film-forming apparatus 16 illustrated in FIG. 15. Since the method for manufacturing the color filter and that for controlling the liquid drop supplying head 22 have been already described above, such description will be omitted herein.

As shown in FIG. 27(*d*), after color filters 1, i.e., color filters 118, are formed on the mother substrate 12, i.e., the original mother substrate, the photolithographic method is followed to form the second electrodes 114*b* (process P12). Besides, an alignment film 116*b* is formed by coating or printing (process P13). Next, the alignment film 116*b* is subjected to a rubbing treatment to determine the initial alignment of liquid crystal (process P14). As a result of the processes, a second large mother substrate is formed to have a plurality of panel patterns on the second substrate 107*b* of the liquid crystal panel 102.

After the first and second large mother substrates are formed, such mother substrates are aligned, in other words, matched with each other, and are then bonded to each other with the sealing material 108 therebetween (process P21). As a result, a vacant panel structure is formed in which a panel part equivalent to a plurality of liquid crystal panels is included, but liquid crystal is not yet encapsulated therein.

Then, scribed grooves, that is, separating grooves are formed at predetermined positions of the vacant panel structure. When pressure or heat is applied or when light is emitted to the panel structure using the scribed grooves as a reference, the substrate is broken into respective units (process P22). As a result of the processes, a strip-shaped vacant panel structure is finally formed with the liquid crystal injection openings 110 (refer to FIG. 24) of the sealing materials 108 of respective liquid crystal panel portions being exposed to the outside.

Thereafter, liquid crystal L is injected into the liquid crystal panel portions through the exposed liquid crystal injection openings 110, and the liquid crystal injection openings 110 are sealed by resin and the like (process P23). According to a general liquid crystal injecting treatment, liquid crystal is injected by a pressure difference between the inside and outside of the liquid crystal panels, that is, by reducing pressure at the liquid crystal panels. For example, liquid crystal is stored in a storing vessel, the liquid crystal storing vessel and a strip-shaped vacant panel are put in a chamber, and the chamber is made to be a vacuum. Then, the-strip-shaped vacant panel is dipped into the liquid crystal contained in the chamber. Then, when the chamber is put out in atmosphere pressure, since the inside of the vacant panel is in the vacuum state, the liquid crystal to which atmosphere pressure has been applied is introduced into the panels through the liquid crystal injection openings. Then, liquid crystal is attached around the liquid crystal panel structure after the injection of liquid crystal, and a cleaning process is performed on the strip-shaped panels after the liquid crystal injection process in the process P24.

Then, scribed grooves are formed at predetermined positions of the strip-shaped panels which have been subjected to the liquid crystal injection and cleaning processes. Depending upon the scribed grooves, the strip-shaped panels are separated into a plurality of liquid crystal panels 102 (process P25). As shown in FIG. 24, the liquid crystal driving ICs 103*a* and 103*b* and the illuminating device 106 as a backlight are mounted to each liquid crystal panel 102 to be connected with FPC 104, thereby completing the formation of the desired liquid crystal apparatus 101 (process P26).

As described above, in the liquid crystal apparatus and the method for manufacturing the apparatus, particularly, the step of manufacturing color filters is performed by one of the aforementioned film-forming methods. As a result, it is possible to eliminate the irregularity in the liquid drop supplying positions among a plurality of regions arranged along the scanning direction of the liquid drop of filter element material and, additionally, reduce the difference in the liquid drop supplying positions among a plurality of regions arranged according to the feeding direction with an additional structure. Accordingly, since strip-shaped irregular color caused by the scanning direction similarly to the above is reduced, the display quality of a liquid crystal device is improved.

The present embodiment of the invention is constructed to make natural number times resolution Rx of the liquid drop supplying positions of the scanning direction X relate to a structural period Dx, thereby making it possible to reduce irregularity in film formation without forcibly lowering the scanning speed Vx or raising driving frequency Fd, and without concerns about reducing manufacturing efficiency.

In addition, a description has been made about a liquid crystal device having liquid crystal panels as display devices in the aforementioned embodiment of the invention, however, the display device having the aforementioned color filter (substrate) can be applied to other electro-optical devices provided with color filters, such as an EL element and a plasma display panel, other than the liquid crystal display device. In other words, for example, in the case of the EL element, color filters having filter elements relating to a plurality of display dots with a light emitting function are overlapped in a plan view to thereby achieve the same effects as in the above embodiment.

Figure 26:
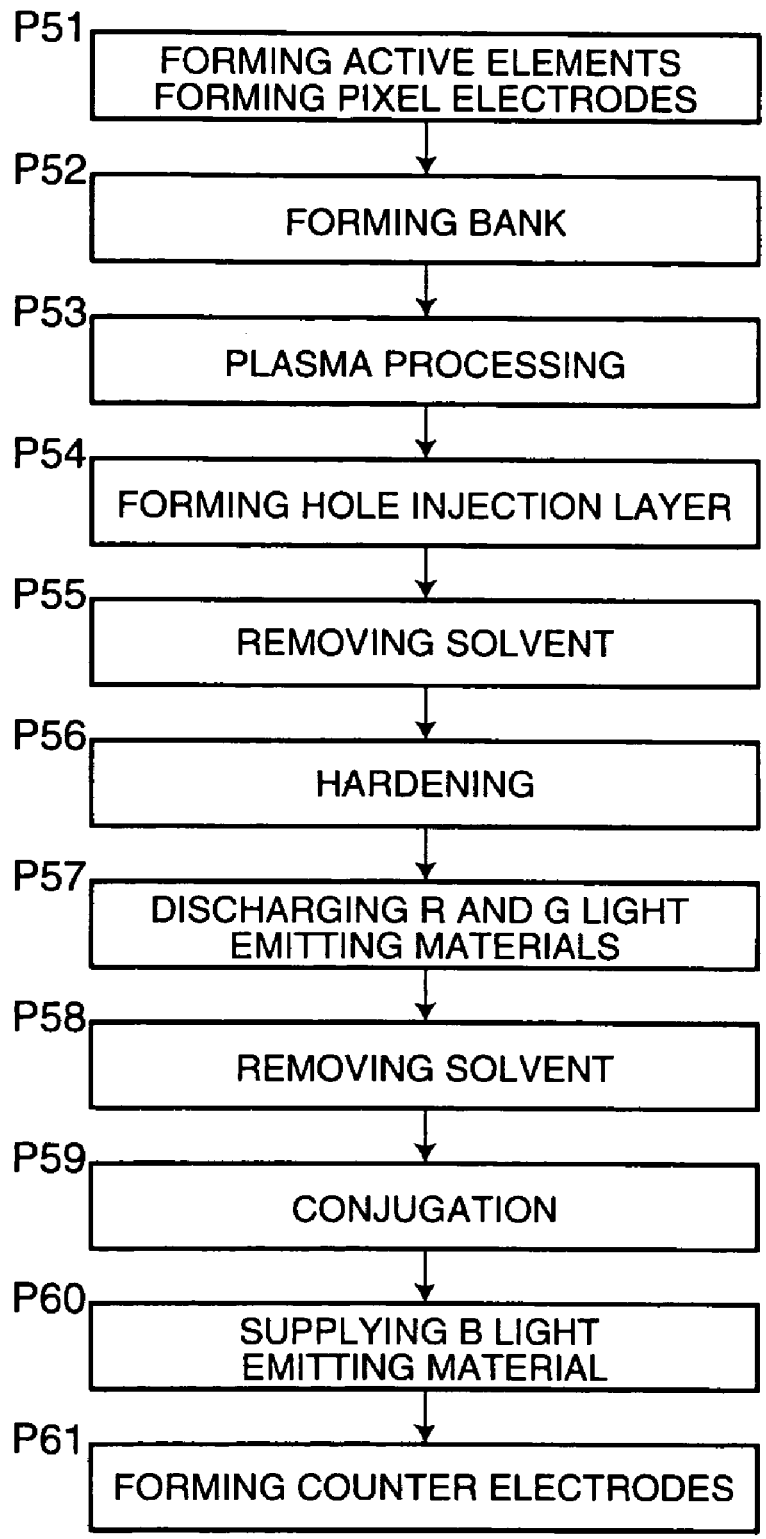
FIG. 26 is a flowchart illustrating the processes of manufacturing an EL device (or a substrate for an EL device).

A Display Device (Electro-Optical Device) Using EL Element and a Method for Manufacturing the Display Device FIG. 26 illustrates an embodiment of an EL device (a substrate for an EL device) and a method for manufacturing the same, as an example of a display device (electro-optical device) and a method for manufacturing the display device constructed according to the present invention.

Figure 28:
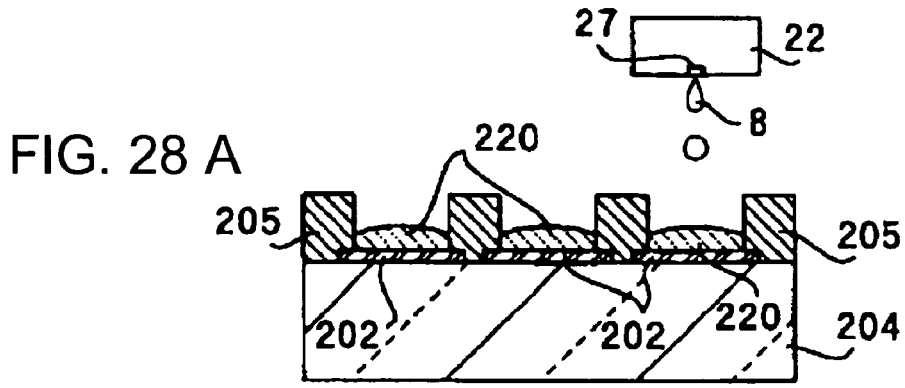
FIGS. 28(a) to 28(d) are sectional views illustrating the processes of manufacturing an EL device.
Figure 28:
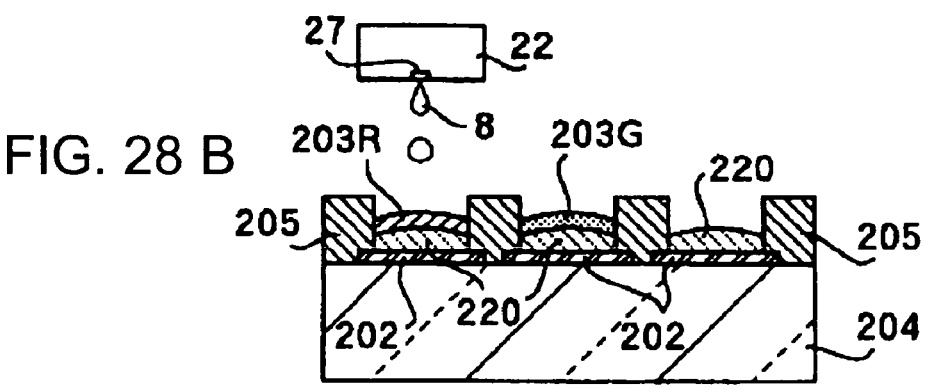
Figure 28:
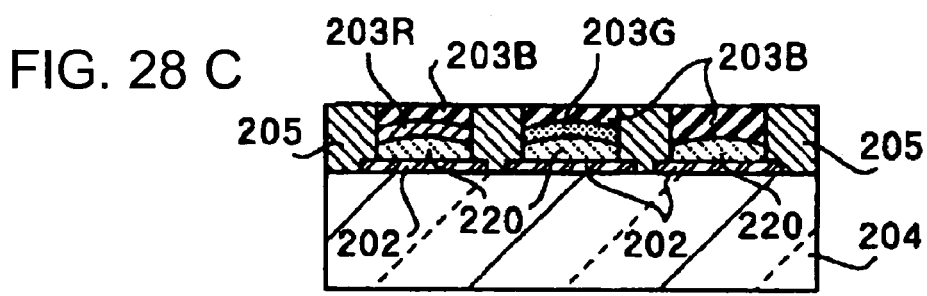
Figure 28:
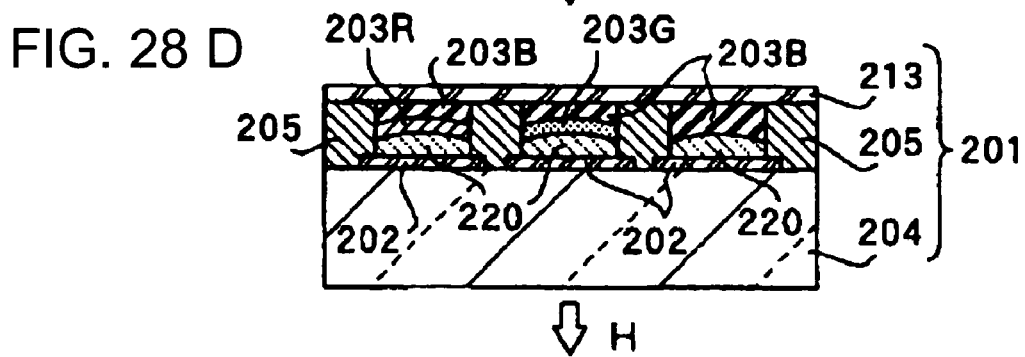

FIG. 28 illustrates a key sectional structure of an EL device finally obtained by key processes of the method for manufacturing the EL device. As shown in FIG. 28(*d*), an EL device 201 includes pixel electrodes 202 formed on a transparent substrate 204, and banks 205 between the respective pixel electrodes 202 made in a latticed pattern as seen from the arrow G. A hole injection layer 220 is formed in the grooves of such a latticed pattern, so as to make R, G and B color light-emitting layers 203R, 203G, 203B in a predetermined arrangement like a stripe pattern as seen from the arrow G. Then, counter electrode 213 is formed thereon.

When the pixel electrode 202 is driven by two-terminal type active element, such as TFD (Thin film diode) element, the counter electrode 213 is formed in a stripe pattern as seen from the arrow G. Besides, when the pixel electrode 202 is driven by a 3-terminal active element such as TFT (thin film transistor), the counter electrode 213 is formed as a single planar electrode.

A region sandwiched between the pixel electrode 202 and its counter electrode 213 is regarded as one display dot, and display dots having three colors R, G, and B is made into one unit, a pixel. By controlling current flowing to the respective display dots, light is emitted from any of the plurality of display dots as desired. As a result, light is emitted in the direction of arrow H to display a colorful image as desired.

For example, the EL device 201 is manufactured according to the manufacturing method shown in FIG. 26. In other words, as described in the process P51 and illustrated in FIG. 28(*a*), active elements such as TFD elements or TFT elements are formed on the surface of the transparent substrate 204, and then a pixel electrode 202 is formed thereon. As a method for forming the pixel electrode 202, there are (among possible others) photolithography, a vacuum deposition method, sputtering method, and pyrosol method. ITO, indium tin-oxide, and a composite oxide of indium oxide and zinc oxide can be used for a material for forming the pixel electrode 202.

Next, as described in the process P52 and shown in FIG. 28(*a*), a well-known patterning method, for example, a photolithography is used to form the partition walls, that is, banks 205 which separate transparent pixel electrodes 202. As a result, it is possible to improve contrast and to prevent a mixture of light emitting materials and light leakage between pixels. The material of the bank 205 should have durability against the solvent of light emitting material, and preferably, some organic materials, such as acryl resin, epoxy resin and photosensitive polyimide, which can be changed to tetrafluoroethylene by fluorocarbon gas plasma treatment.

Next, right before the hole injecting the liquid material is coated as a functional liquid material, consecutive plasma treatments are performed to the transparent substrate 204 with oxygen gas and fluorocarbon gas (process P53). Therefore, the polyamide surface is hydrophobic but the ITO surface is hydrophilic to control the wettability of the substrate for delicately patterning the liquid drop. A plasma generating apparatus in vacuum or in air may be used as a plasma generating apparatus.

Then, as described in the process P54 and described in FIG. 28(*a*), a liquid material for the hole injecting layer is discharged from the liquid drop supplying head 22 of the film-forming apparatus 16 shown in FIG. 15 to form a pattern on the pixel electrodes 202. A specific method for controlling the liquid drop supplying head 22 is chosen out of the aforementioned methods. After coating, a solvent is removed under the conditions, in vacuum (1 torr), at room temperature and for 20 minutes. Then, a heat treatment is applied in air, at 20° C. (using a hot plate) for ten minutes, so as to form a hole injection layer 220 that is insoluble in a liquid material for the light-emitting layer (process P56). Under the aforementioned conditions, the thickness of the layer 220 is 40 nm.

Then, as described in P57 and illustrated in FIG. 28(*b*), by a liquid drop discharging method, an R light emitting the liquid material and a G light emitting the liquid material as EL light emitting materials, that is, functional liquid materials are applied to the hole injection layer 220. At this time, the respective light emitting liquid materials are discharged from the liquid drop supplying head 22 of the film-forming apparatus 16 shown in FIG. 15. As a method for controlling the liquid drop supplying head 22, any one of the aforementioned methods is used in which light-emitting colors of EL light emitting materials instead of the colors of the color filters is applied. According to such an ink jet (liquid drop supplying) method, a fine patterning process can be easily performed within a short period of time. Besides, it is possible to make a change in the thickness of the film when a change is made in the solid density or discharging amount of the liquid material.

After the light emitting liquid material is applied, a solvent is removed under conditions, in vacuum (1 torr), at room temperature, for 20 minutes (process P58). A heat treatment under nitrogen atmosphere, at 150° C., for 4 hours is performed to conjugate and form an R color light-emitting layer 203R and a G color light-emitting layer 203G (process P59). Under the aforementioned conditions, the thickness of the layer is 50 nm. The light-emitting layers conjugated by the heating treatment are insoluble in solvent.

In addition, the consecutive plasma treatments can be performed with oxygen and fluorocarbon gas on the hole injection layer 220 before the formation of the light-emitting layer. Thus, a fluoride layer is formed on the hole injection layer 220 to raise ionization potential and increase hole injecting efficiency with high illumination efficiency, thereby providing an organic EL device with high light emitting efficiency.

Next, as described in the process P60 and shown in FIG. 28(*c*), a B color light-emitting layer 203B, functional liquid, as a EL light-emitting material is formed to overlap with the R color light-emitting layer 203R, G color light-emitting layer 203G, and the hole injection layer 220 in each display dot. Therefore, it is possible to achieve planarization by filling up the step difference between the R color light-emitting layer 203R and the G color light-emitting layer 203G and bank 205 as well as the formation of the three primary colors of red, green and blue. As a result, it is possible to obtain an effect of surely preventing a circuit short between the upper and lower electrodes.

In addition, the B color light-emitting layer 203B deposited on the R color light-emitting layer 203R or the G color light-emitting layer 203G functions as an electron injecting/carrying layer not to emit light by adjusting the thickness of the B color light-emitting layer 203B.

For, example, a general spin coating method, as a wet method, or an ink jet method used for forming the R color light-emitting layer 203R and the G color light-emitting layer 203G may be used for forming the B color light-emitting layer 203B.

Then, as described in the process P61 and shown in FIG. 28(*d*), the counter electrode 213 is formed to result in formation of a desired EL device. If the counter electrode 213 is a planar electrode, it may be made of a material, for example, Mg, Ag, AL and Li, by a film-forming method such as a deposition method or a sputtering method. Besides, if the counter electrode 213 is a stripe-shaped electrode, it may be formed by a patterning method such as a photolithography.

According to the aforementioned EL device 201 and the method for manufacturing the same, a few methods may be selected as a method for controlling the liquid drop supplying head, thereby making it possible to reduce the stripe pattern of color irregularity resulting from the scanning direction and to equalize the light-emitting distribution characteristic of the light-emitting surface of the EL device 201 on the plane.

In addition, the film-forming device 16 shown in FIG. 15 is used for the EL device and the manufacturing method thereof to form respective color display dots of red, green, and blue by discharging ink with the liquid drop supplying head 22. Thus, there is no need to go through the complicated processes of the photolithographic method and no material is wasted.

Electronic Apparatus

Figure 35:
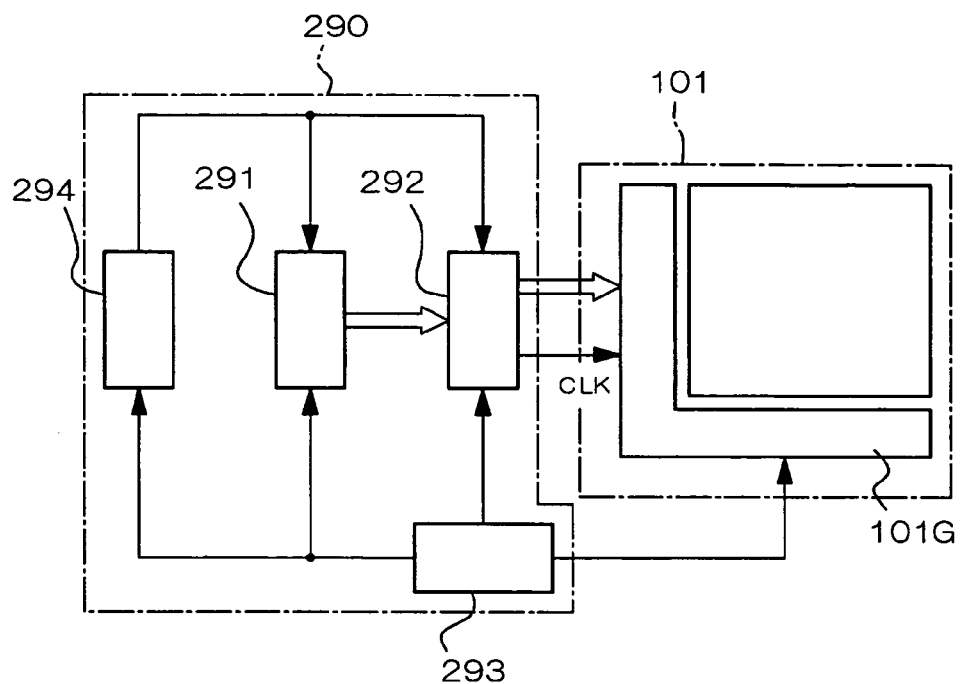
FIG. 35 is a block diagram illustrating the structure of a display control system in an electronic apparatus comprising the liquid crystal device 101.

Finally, a description will be made about an embodiment of an electronic apparatus related to the present invention with reference to FIGS. 35 and 36. An electronic apparatus having a liquid crystal device 101, that is, an electro-optical device as display means will be described in the present embodiment. FIG. 35 is a schematic structural view illustrating a whole structure of a control system (display control system) for a liquid crystal device 101 in the electronic apparatus of the present embodiment. In the electronic apparatus shown here, a display control circuit 290 is constructed with a display information output source 291, display information processing circuit 292, power source circuit 293 and a timing generator 294. Besides, a driving circuit 101G for driving the display regions is installed in the liquid crystal device 101. The driving circuit 101G is constructed with the liquid crystal driving ICs 103*a*, 103*b* and the circuit 126. The driving circuit 101G may be constructed with a semiconductor IC or circuit pattern formed on the panel surface, a semiconductor IC chip or circuit pattern mounted on the circuit substrate electrically connected on the liquid crystal panel or a variety of circuits included in the electronic apparatus.

The display data output source 291 is constructed with a memory including ROM (Read Only Memory) or RAM (Random Access Memory), a storage unit including magnetic recording disc or optical recording disc and a resonant circuit synchronically outputting digital image signals to provide display data in a predetermined formatted form of a image signal to the data processing circuit 292 on the basis of a variety of clock signals generated by the timing generator 294.

The display information processing circuit 292 includes a variety of well-known circuits such as a serial-parallel converting circuit, an amplification/inversion circuit, a rotation circuit, a gamma-correction circuit, and a clamp circuit to process input display information and then provide the image information for the driving circuit 101G along with clock signals CLK. The driving circuit 101G includes scanning line driving circuit, signal line driving circuit and test circuit. In addition, the power source circuit 293 supplies a predetermined level of voltage to respective components described above.

Figure 36:
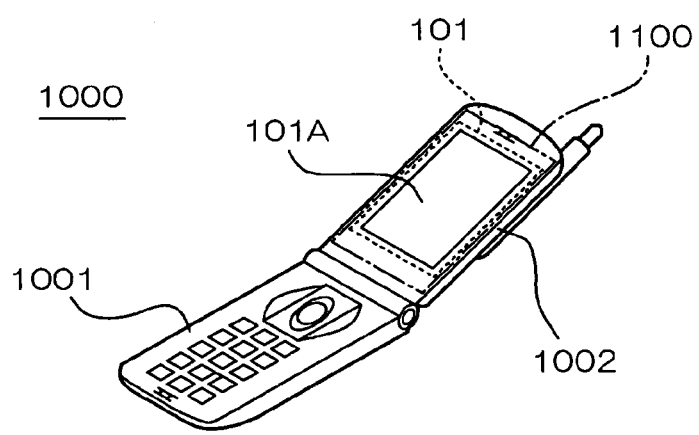
FIG. 36 illustrates an external appearance as an embodiment of an electronic apparatus.

FIG. 36 illustrates a cellular phone as an embodiment of the electronic apparatus according to the present invention. The cellular phone 1000 includes a manipulation part (keypad) 1001 and a display part 1002. A plurality of manipulating buttons are arranged on the front surface of the manipulating part 1001 and a microphone is built in a mouthpiece. Besides, a speaker is arranged in the earpiece of the display part 1002.

In case of the display part 1002, a circuit board 1100 is arranged in a case body, and the liquid crystal device 101 described above is mounted on the circuit board 1100.

The liquid crystal device 101 installed in the case body is constructed to see the display surface through a display window 101A.

Other Embodiments

While the invention has been described in terms of preferred embodiments, the scope of the invention is not limited to the aforementioned embodiment, but various changes and modifications including those that will be described below may be effected with other specific structures and shapes to accomplish the object of the invention.

For example, in the film-forming apparatus (a color filter substrate manufacturing apparatus, a manufacturing apparatus for manufacturing a substrate of an EL device) as shown in FIG. 15 and FIG. 16, the substrate 12 is scanned by moving the liquid drop supplying head 22 in the scanning direction, and a feeding process to the substrate 12 of the liquid drop supplying head 22 is performed by getting the substrate 12 moved by the feed driving apparatus 21. In contrast, the scanning process may be performed by the movement of the substrate 12, and the feeding process may be performed by movement of the liquid drop supplying head 22. Besides, any other structure may be constructed to relatively move the liquid drop supplying head 22 along the surface of the mother substrate 12 by a relative movement of at least one or more parts, like moving the mother substrate 12 without movement of the liquid drop supplying head 22 or moving both parts in opposite directions.

In the above embodiment, the liquid drop supplying head 421 constructed in a structure of discharging a liquid material by using bending transformation of the piezoelectric elements, but another structure of the liquid drop supplying head may be constructed and used for discharging the liquid material by bubbles generated by, for example, heating.

In addition, the use of the film-forming apparatus 16 is not limited to manufacturing a color filter substrate, liquid crystal device 101 or an EL device 201, but the film-forming apparatus 16 may also be used for manufacturing an electron emitting device such as a FED (Field Emission Display), a PDD (Plasma Display Panel), an electrophoresis device which is a device to make a display at respective pixels by discharging functional the liquid material containing charged particles to grooves between partitions of respective pixels and collecting electrically charged particles at one side electrode with application of voltage to electrodes installed to keep respective pixels at top and bottom, a thin CRT (cathode-ray tube) or any other display device (electro-optical device) having processes for forming predetermined films on the top of a substrate (board).

The film-forming apparatus or film-forming method of the invention is a device having a substrate (base material) including a color filter or display device (electro-optical device) and can be used for manufacturing a variety of devices where a process of discharging a liquid drop 8 to the substrate (base material) may be used. For example, in order to form electric wirings of the print circuit board, liquid metal, conductive material or coating material containing metal is discharged in an ink jet method to construct metal wirings. An optical member may be constructed by discharging tiny micro lenses to a substrate in the ink jet method. The ink jet method may be used for coating a resist to only the required parts of the substrate. A light diffuser is formed by forming a light diffusing convex portion or a tiny white pattern in the ink jet method on a light transmissive substrate such as plastic. A biochip may be formed by manufacturing a fluorescent mark probe in an ink jet method by discharging to spike spot RNA (ribonucleic acid) to be arranged in a pattern of matrix on a DNA (deoxyribonucleic acid) chip for hybridization on the DNA chip, or by discharging specimen, antibody, DNA in an ink jet method to dot-shaped positions partitioned on a substrate.

Besides, as a liquid crystal device 101, an active matrix liquid crystal panel including transistors such as TFT and active elements of TFD at pixels, a color filter 1 may be constructed by forming partitions 6 surrounding pixel electrodes and then discharging ink in an ink jet method to grooves formed by partitions 6. A color filter 1 formed on the pixel electrodes may be constructed as a conductive color filter by discharging mixture of color materials and conductive materials as ink for pixel electrodes by an ink jet method. Any part to make an electro-optical unit machine of the liquid crystal device 101 may be constructed by discharging spacer particles of keeping a gap between substrates in an ink jet method.

Besides, the scope of the invention is not limited to the color filter 1, but may be applicable to other electro-optical device such as an EL device 201. At this time, the EL device 201 may be constructed in a stripe type of EL stripes relating to three colors of red, green and blue, an active matrix type having a transistor controlling current flowing in the light-emitting layer of each pixel, as described above, or in a passive matrix type.

Moreover, the electronic apparatus assembled with the electro-optical device of each embodiment described above is not limited to a cellular phone 1000 shown in FIG. 36, but may be included in a portable phone such as a PHS (Personal Handy Phone System), an electronic note, a pager, a POS (Point of Sales) terminal, an IC card, a mini-disc player, a liquid crystal projector, a personal computer, an engineering workstation (EWS), a word processor, a TV set, a view finder type or monitor direct-viewing type of a video tape recorder, an electronic table calculator, a car navigator, a device having a touch panel, watch, gaming devices or other electronic apparatus.

What is claimed is:

1. A film-forming method for forming a planar periodic structure having a predetermined periodicity by depositing liquid material on an object, the method comprising:
   providing liquid drop supplying means capable of supplying a liquid drop at a predetermined driving period to deposit the liquid material on the object;
   controlling the presence or absence of the supply of the liquid drop by the liquid drop supplying means at each driving period of the driving period in accordance with the periodicity of the planar periodic structure to be formed on the object; and
   supplying the liquid drop by the control of the liquid drop supplying means while the liquid drop supplying means is scanned at a predetermined scanning speed in a predetermined scanning direction relative to the object;
   wherein a natural number times a value obtained by multiplying the driving period and the scanning speed is set to be the structural period of the planar periodic structure, to be formed on the object, in the scanning direction.

2. The film-forming method according to claim 1,
   wherein a step of scanning the liquid drop supplying means relative to the object in the scanning direction is performed several times and an operation of feeding the liquid drop supplying means to the object in a direction intersecting the scanning direction is performed during intervals between scanning operations.

3. The film-forming method according to claim 1,
   wherein the liquid drop supplying means is provided with a nozzle row including a plurality of nozzles to supply the liquid drop, and the liquid drop supplying means is scanned relative to the object in the scanning direction in a position in which an arrangement period of the nozzles in the nozzle row as seen from a direction perpendicular to the scanning direction is set to correspond to a structural period as seen from a direction perpendicular to the scanning direction of the planar periodic structure to be formed.

4. The film-forming method according to claim 3,
   wherein a difference between:
      a phase difference between a periodicity of the planar periodic structure in the scanning direction at a predetermined position as seen from a direction perpendicular to the scanning direction and another periodicity of the planar periodic structure in the scanning direction at another position other than the predetermined position as seen from a direction perpendicular to the scanning direction; and
      a positional deviation as seen from the scanning direction between a predetermined nozzle corresponding to the predetermined position and another nozzle corresponding to the another position;
   is set to 0 or a natural number times a value obtained by multiplying the driving period and the scanning speed.

5. The film-forming method according to claim 3,
   wherein a time difference is provided between a liquid drop supplying time of a predetermined nozzle disposed at a predetermined position as seen from the direction perpendicular to the scanning direction and a liquid drop supplying time of another nozzle disposed at another position as seen from the direction perpendicular to the scanning direction; and
   wherein a difference between:
      a phase difference between a periodicity of the planar periodic structure in the scanning direction at the predetermined position and another periodicity of the planar periodic structure in the scanning direction at another position; and
      a value obtained by multiplying the time difference and the scanning speed;
   is set to 0 or a natural number times a value obtained by multiplying the driving period and the scanning speed.

6. A method for manufacturing a color filter substrate comprising:
   a film-forming step in which liquid material is supplied onto a substrate to film-form a plurality of filter elements in a planar periodic pattern having a predetermined periodicity;
   wherein, in the film-forming process, liquid drop supplying means is used which is capable of supplying a liquid drop at a predetermined driving period to deposit the liquid material on the object;
   the presence or absence of the supply of the liquid drop by the liquid drop supplying means is controlled at each driving period of the driving period in accordance with the periodicity of the planar periodic pattern to be formed on the object; and
   the liquid drop is supplied by the control of the liquid drop supplying means while the liquid drop supplying means is scanned at a predetermined scanning speed in a predetermined scanning direction relative to the object; and
   wherein a natural number times a value obtained by multiplying the driving period and the scanning speed is set to be the structural period of the planar periodic pattern, to be formed, in the scanning direction.

7. The method for manufacturing a color filter according to claim 6,
   wherein a step of scanning the liquid drop supplying means relative to the object in the scanning direction is performed several times and an operation of feeding the liquid drop supplying means to the object in a direction intersecting the scanning direction is performed during intervals between scanning operations.

8. The method for manufacturing a color filter substrate according to claim 6,
   wherein the liquid drop supplying means is provided with a nozzle row including a plurality of nozzles to supply the liquid drop, and the liquid drop supplying means is scanned relative to the object in the scanning direction in the position in which an arrangement period of the nozzles at the nozzle row as seen from a direction perpendicular to the scanning direction is set to correspond to a structural period as seen from a direction perpendicular to the scanning direction of the planar periodic pattern to be formed.

9. The method for manufacturing a color filter substrate according to claim 8,
   wherein a difference between:
      a phase difference between a periodicity of the planar periodic pattern in the scanning direction at a predetermined position as seen from a direction perpendicular to the scanning direction and another periodicity of the planar periodic pattern in the scanning direction at another position other than the predetermined position as seen from a direction perpendicular to the scanning direction; and
      a positional deviation as seen from the scanning direction between a predetermined nozzle corresponding to the predetermined position and another nozzle corresponding to the another position;

is set to 0 or a natural number times a value obtained by multiplying the driving period and the scanning speed, thereby forming a film.

10. The method for manufacturing a color filter substrate according to claim 8,
wherein a time difference is provided between a liquid drop supplying time of a predetermined nozzle disposed at a predetermined position as seen from the direction perpendicular to the scanning direction and a liquid drop supplying time of another nozzle disposed at another position other than the predetermined position as seen from the direction perpendicular to the scanning direction; and
wherein a difference between:
a phase difference between a periodicity of the planar periodic pattern in the scanning direction at the predetermined position and another periodicity of the planar periodic pattern in the scanning direction at the another position; and
a value obtained by multiplying the time difference and the scanning speed;
is set to 0 or a natural number times a value obtained by multiplying the driving period and the scanning speed, thereby forming a film.

11. The method for manufacturing a color filter substrate according to claim 6,
wherein the planar periodic pattern is obtained by arranging a plurality of colors of the filter elements in a planar periodic pattern, and the film-forming process is performed to at least one of the plurality of colors of the filter elements.

12. The method for manufacturing a color filter substrate according to claim 11,
wherein the film-forming process is performed to a blue color filter element of the filter elements.

13. A method for manufacturing a substrate for an electroluminescent device comprising:
a film-forming step in which the liquid material is supplied onto the substrate to film-form a plurality of pixel regions in a planar periodic pattern having a predetermined periodicity;
wherein, in the film-forming process:
liquid drop supplying means is used which is capable of supplying a liquid drop at a predetermined driving period to deposit the liquid material on the object;
the presence or absence of the supply of the liquid drop by the liquid drop supplying means is controlled at each driving period in accordance with the periodicity of the planar periodic pattern to be formed on the object; and
the liquid drop is supplied by the control of the liquid drop supplying means while the liquid drop supplying means is scanned at a predetermined scanning speed in a predetermined scanning direction relative to the object; and
wherein a natural number times a value obtained by multiplying the driving period and the scanning speed is set to be the structural period of the planar periodic pattern, to be formed on the object, in the scanning direction.

14. The method for manufacturing a substrate for an electroluminescent device according to claim 13,
wherein a step of scanning the liquid drop supplying means relative to the object in the scanning direction is performed several times and an operation of feeding the liquid drop supplying means to the object in a direction intersecting the scanning direction is performed during intervals between scanning operations.

15. The method for manufacturing a substrate for an electroluminescent device according to claim 13,
wherein the liquid drop supplying means is provided with a nozzle row including a plurality of nozzles to supply the liquid drop, and the liquid drop supplying means is scanned relative to the object in the scanning direction in the position in which an arrangement period of the nozzles at the nozzle row as seen from a direction perpendicular to the scanning direction is set to correspond to a structural period as seen from a direction perpendicular to the scanning direction of the planar periodic pattern to be formed.

16. The method for manufacturing a substrate for an electroluminescent device according to claim 15,
wherein a difference between:
a phase difference between a periodicity of the planar periodic pattern, to be formed on the object, in the scanning direction, at a predetermined position as seen from a direction perpendicular to the scanning direction and another periodicity of the planar periodic pattern in the scanning direction at another position other than the predetermined position as seen from a direction perpendicular to the scanning direction; and
a positional deviation as seen from the scanning direction between a predetermined nozzle corresponding to the predetermined position and another nozzle corresponding to the another position;
is set to 0 or a natural number times a value obtained by multiplying the driving period and the scanning speed, thereby forming a film.

17. The method for manufacturing a substrate for an electroluminescent device according to claim 15,
wherein a time difference is provided between a liquid drop supplying time of a predetermined nozzle disposed at a predetermined position as seen from the direction perpendicular to the scanning direction and a liquid drop supplying time of another nozzle disposed at another position other than the predetermined position as seen from the direction perpendicular to the scanning direction; and
wherein a difference between:
a phase difference between a periodicity of the planar periodic pattern in the scanning direction at the predetermined position and another periodicity of the planar periodic pattern in the scanning direction at the another position; and
a value obtained by multiplying the time difference and the scanning speed;
is set to 0 or a natural number times a value obtained by multiplying the driving period and the scanning speed, thereby forming a film.

18. The method for manufacturing a substrate for an electroluminescent device according to claim 13,
wherein the planar periodic pattern is obtained by arranging a plurality of colors of the pixel regions in a predetermined arrangement pattern, and the film-forming process is performed to at least one of the plurality of colors of the pixel regions.

19. The method for manufacturing a substrate for an electroluminescent device according to claim 18,
wherein the film-forming process is performed to a blue color pixel region.

20. A method for manufacturing a display device comprising:

forming a plurality of pixels arranged at the planar periodic period using a film-forming method according to claim 1.

21. A method for manufacturing a display device comprising:

forming a color filter substrate using a manufacturing method according to claim 6.

22. A method for manufacturing a display device comprising:

forming a substrate for an electroluminescent device using a manufacturing method according to claim 13.

* * * * *